(12) United States Patent
Chen et al.

(10) Patent No.: US 12,374,611 B2
(45) Date of Patent: Jul. 29, 2025

(54) PACKAGE CORE ASSEMBLY AND FABRICATION METHODS

(71) Applicant: Applied Materials, Inc., Santa Clara, CA (US)

(72) Inventors: Han-Wen Chen, Cupertino, CA (US); Steven Verhaverbeke, San Francisco, CA (US); Giback Park, San Jose, CA (US); Kyuil Cho, Santa Clara, CA (US); Kurtis Leschkies, San Jose, CA (US); Roman Gouk, San Jose, CA (US); Chintan Buch, Santa Clara, CA (US); Vincent Dicaprio, Pleasanton, CA (US); Bernhard Stonas, Hayward, CA (US); Jean Delmas, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 17/227,837

(22) Filed: Apr. 12, 2021

(65) Prior Publication Data
US 2021/0257289 A1    Aug. 19, 2021

Related U.S. Application Data

(63) Continuation of application No. 16/886,704, filed on May 28, 2020, now Pat. No. 12,087,679, which is a
(Continued)

(51) Int. Cl.
H01L 23/498    (2006.01)
H01L 21/48    (2006.01)
H01L 23/14    (2006.01)

(52) U.S. Cl.
CPC ...... *H01L 23/49838* (2013.01); *H01L 21/486* (2013.01); *H01L 23/147* (2013.01); *H01L 23/49827* (2013.01); *H01L 23/49866* (2013.01)

(58) Field of Classification Search
CPC ............ H01L 23/147; H01L 23/49827; H01L 23/5383; H01L 23/49811
See application file for complete search history.

(56) References Cited

U.S. PATENT DOCUMENTS

| | | |
|---|---|---|
| 4,073,610 A | 2/1978 | Cox |
| 4,644,130 A | 2/1987 | Bachmann |

(Continued)

FOREIGN PATENT DOCUMENTS

| | | |
|---|---|---|
| CA | 2481616 C | 1/2013 |
| CN | 1646650 A | 7/2005 |

(Continued)

OTHER PUBLICATIONS

Definition of "pocket", retrieved from http://www.merriam-webster.com (2023) (Year: 2023).*

(Continued)

*Primary Examiner* — Michele Fan
(74) *Attorney, Agent, or Firm* — Patterson + Sheridan, LLP

(57) ABSTRACT

The present disclosure relates to semiconductor core assemblies and methods of forming the same. The semiconductor core assemblies described herein may be utilized to form semiconductor package assemblies, PCB assemblies, PCB spacer assemblies, chip carrier assemblies, intermediate carrier assemblies (e.g., for graphics cards), and the like. In one embodiment, a silicon substrate core is structured by direct laser patterning. One or more conductive interconnections are formed in the substrate core and one or more
(Continued)

redistribution layers are formed on surfaces thereof. The silicon substrate core may thereafter be utilized as a core structure for a semiconductor package, PCB, PCB spacer, chip carrier, intermediate carrier, or the like.

24 Claims, 28 Drawing Sheets

Related U.S. Application Data continuation-in-part of application No. 16/698,680, filed on Nov. 27, 2019, now Pat. No. 11,862,546.

(56) References Cited

U.S. PATENT DOCUMENTS

| | | |
|---|---|---|
| 5,126,016 A | 6/1992 | Glenning et al. |
| 5,268,194 A | 12/1993 | Kawakami et al. |
| 5,353,195 A | 10/1994 | Fillion et al. |
| 5,367,143 A | 11/1994 | White, Jr. |
| 5,374,788 A | 12/1994 | Endoh et al. |
| 5,474,834 A | 12/1995 | Tanahashi et al. |
| 5,670,262 A | 9/1997 | Dalman |
| 5,767,480 A | 6/1998 | Anglin et al. |
| 5,783,870 A | 7/1998 | Mostafazadeh et al. |
| 5,841,099 A | 11/1998 | Owen et al. |
| 5,841,102 A | 11/1998 | Noddin |
| 5,878,485 A | 3/1999 | Wood et al. |
| 6,013,948 A | 1/2000 | Akram et al. |
| 6,039,889 A | 3/2000 | Zhang et al. |
| 6,087,719 A | 7/2000 | Tsunashima |
| 6,117,704 A | 9/2000 | Yamaguchi et al. |
| 6,211,485 B1 | 4/2001 | Burgess |
| 6,384,473 B1 | 5/2002 | Peterson et al. |
| 6,388,202 B1 | 5/2002 | Swirbel et al. |
| 6,388,207 B1 | 5/2002 | Figueroa et al. |
| 6,392,290 B1 | 5/2002 | Kasem et al. |
| 6,459,046 B1 | 10/2002 | Ochi et al. |
| 6,465,084 B1 | 10/2002 | Curcio et al. |
| 6,489,670 B1 | 12/2002 | Peterson et al. |
| 6,495,895 B1 | 12/2002 | Peterson et al. |
| 6,506,632 B1 | 1/2003 | Cheng et al. |
| 6,512,182 B2 | 1/2003 | Takeuchi et al. |
| 6,538,312 B1 | 3/2003 | Peterson et al. |
| 6,555,906 B2 | 4/2003 | Towle et al. |
| 6,576,869 B1 | 6/2003 | Gower et al. |
| 6,593,240 B1 | 7/2003 | Page |
| 6,631,558 B2 | 10/2003 | Burgess |
| 6,661,084 B1 | 12/2003 | Peterson et al. |
| 6,677,552 B1 | 1/2004 | Tulloch et al. |
| 6,713,719 B1 | 3/2004 | De Steur et al. |
| 6,724,638 B1 | 4/2004 | Inagaki et al. |
| 6,775,907 B1 | 8/2004 | Boyko et al. |
| 6,781,093 B2 | 8/2004 | Conlon et al. |
| 6,799,369 B2 | 10/2004 | Ochi et al. |
| 6,894,399 B2 | 5/2005 | Vu et al. |
| 7,028,400 B1 | 4/2006 | Hiner et al. |
| 7,062,845 B2 | 6/2006 | Burgess |
| 7,064,069 B2 | 6/2006 | Draney et al. |
| 7,078,788 B2 | 7/2006 | Vu et al. |
| 7,091,589 B2 | 8/2006 | Mori et al. |
| 7,091,593 B2 | 8/2006 | Ishimaru et al. |
| 7,105,931 B2 | 9/2006 | Attarwala |
| 7,129,117 B2 | 10/2006 | Hsu |
| 7,166,914 B2 | 1/2007 | DiStefano et al. |
| 7,170,152 B2 | 1/2007 | Huang et al. |
| 7,192,807 B1 | 3/2007 | Huemoeller et al. |
| 7,211,899 B2 | 5/2007 | Taniguchi et al. |
| 7,271,012 B2 | 9/2007 | Anderson |
| 7,274,099 B2 | 9/2007 | Hsu |
| 7,276,446 B2 | 10/2007 | Robinson et al. |
| 7,279,357 B2 | 10/2007 | Shimoishizaka et al. |
| 7,312,405 B2 | 12/2007 | Hsu |
| 7,321,164 B2 | 1/2008 | Hsu |
| 7,449,363 B2 | 11/2008 | Hsu |
| 7,458,794 B2 | 12/2008 | Schwaighofer et al. |
| 7,511,365 B2 | 3/2009 | Wu et al. |
| 7,531,767 B2 | 5/2009 | Arai et al. |
| 7,690,109 B2 | 4/2010 | Mori et al. |
| 7,714,431 B1 | 5/2010 | Huemoeller et al. |
| 7,723,838 B2 | 5/2010 | Takeuchi et al. |
| 7,754,530 B2 | 7/2010 | Wu et al. |
| 7,808,799 B2 | 10/2010 | Kawabe et al. |
| 7,817,686 B2 | 10/2010 | Peng et al. |
| 7,839,649 B2 | 11/2010 | Hsu |
| 7,843,064 B2 | 11/2010 | Kuo et al. |
| 7,852,634 B2 | 12/2010 | Sakamoto et al. |
| 7,855,460 B2 | 12/2010 | Kuwajima |
| 7,868,464 B2 | 1/2011 | Kawabata et al. |
| 7,887,712 B2 | 2/2011 | Boyle et al. |
| 7,914,693 B2 | 3/2011 | Jeong et al. |
| 7,915,737 B2 | 3/2011 | Nakasato et al. |
| 7,932,595 B1 | 4/2011 | Huemoeller et al. |
| 7,932,608 B2 | 4/2011 | Tseng et al. |
| 7,955,942 B2 | 6/2011 | Pagaila et al. |
| 7,978,478 B2 | 7/2011 | Inagaki et al. |
| 7,982,305 B1 | 7/2011 | Railkar et al. |
| 7,988,446 B2 | 8/2011 | Yeh et al. |
| 8,069,560 B2 | 12/2011 | Mori et al. |
| 8,137,497 B2 | 3/2012 | Sunohara et al. |
| 8,283,778 B2 | 10/2012 | Trezza |
| 8,314,343 B2 | 11/2012 | Inoue et al. |
| 8,367,943 B2 | 2/2013 | Wu et al. |
| 8,384,203 B2 | 2/2013 | Toh et al. |
| 8,390,125 B2 | 3/2013 | Tseng et al. |
| 8,426,246 B2 | 4/2013 | Toh et al. |
| 8,470,708 B2 | 6/2013 | Shih et al. |
| 8,476,769 B2 | 7/2013 | Chen et al. |
| 8,518,746 B2 | 8/2013 | Pagaila et al. |
| 8,536,695 B2 | 9/2013 | Liu et al. |
| 8,628,383 B2 | 1/2014 | Starling et al. |
| 8,633,397 B2 | 1/2014 | Jeong et al. |
| 8,698,293 B2 | 4/2014 | Otremba et al. |
| 8,704,359 B2 | 4/2014 | Tuominen et al. |
| 8,710,402 B2 | 4/2014 | Lei et al. |
| 8,710,649 B1 | 4/2014 | Huemoeller et al. |
| 8,728,341 B2 | 5/2014 | Ryuzaki et al. |
| 8,772,087 B2 | 7/2014 | Barth et al. |
| 8,786,098 B2 | 7/2014 | Wang |
| 8,877,554 B2 | 11/2014 | Tsai et al. |
| 8,890,628 B2 | 11/2014 | Nair et al. |
| 8,907,471 B2 | 12/2014 | Beyne et al. |
| 8,921,995 B1 | 12/2014 | Railkar et al. |
| 8,952,544 B2 | 2/2015 | Lin et al. |
| 8,980,691 B2 | 3/2015 | Lin |
| 8,980,727 B1 | 3/2015 | Lei et al. |
| 8,990,754 B2 | 3/2015 | Bird et al. |
| 8,994,185 B2 | 3/2015 | Lin et al. |
| 8,999,759 B2 | 4/2015 | Chia |
| 9,059,186 B2 | 6/2015 | Shim et al. |
| 9,064,936 B2 | 6/2015 | Lin et al. |
| 9,070,637 B2 | 6/2015 | Yoda et al. |
| 9,099,313 B2 | 8/2015 | Lee et al. |
| 9,111,914 B2 | 8/2015 | Lin et al. |
| 9,142,487 B2 | 9/2015 | Toh et al. |
| 9,159,678 B2 | 10/2015 | Cheng et al. |
| 9,161,453 B2 | 10/2015 | Koyanagi |
| 9,210,809 B2 | 12/2015 | Mallik et al. |
| 9,224,674 B2 | 12/2015 | Malatkar et al. |
| 9,275,934 B2 | 3/2016 | Sundaram et al. |
| 9,318,376 B1 | 4/2016 | Holm et al. |
| 9,355,881 B2 | 5/2016 | Goller et al. |
| 9,363,898 B2 | 6/2016 | Tuominen et al. |
| 9,396,999 B2 | 7/2016 | Yap et al. |
| 9,406,645 B1 | 8/2016 | Huemoeller et al. |
| 9,499,397 B2 | 11/2016 | Bowles et al. |
| 9,530,752 B2 | 12/2016 | Nikitin et al. |
| 9,554,469 B2 | 1/2017 | Hurwitz et al. |
| 9,660,037 B1 | 5/2017 | Zechmann et al. |
| 9,698,104 B2 | 7/2017 | Yap et al. |
| 9,704,726 B2 | 7/2017 | Toh et al. |
| 9,735,134 B2 | 8/2017 | Chen |
| 9,748,167 B1 | 8/2017 | Lin |
| 9,754,849 B2 | 9/2017 | Huang et al. |

(56) References Cited

U.S. PATENT DOCUMENTS

| | | |
|---|---|---|
| 9,837,352 B2 | 12/2017 | Chang et al. |
| 9,837,484 B2 | 12/2017 | Jung et al. |
| 9,859,258 B2 | 1/2018 | Chen et al. |
| 9,875,970 B2 | 1/2018 | Yi et al. |
| 9,887,103 B2 | 2/2018 | Scanlan et al. |
| 9,887,167 B1 | 2/2018 | Lee et al. |
| 9,893,045 B2 | 2/2018 | Pagaila et al. |
| 9,978,720 B2 | 5/2018 | Theuss et al. |
| 9,997,444 B2 | 6/2018 | Meyer et al. |
| 10,014,292 B2 | 7/2018 | Or-Bach et al. |
| 10,037,975 B2 | 7/2018 | Hsieh et al. |
| 10,053,359 B2 | 8/2018 | Bowles et al. |
| 10,090,284 B2 | 10/2018 | Chen et al. |
| 10,109,588 B2 | 10/2018 | Jeong et al. |
| 10,128,177 B2 | 11/2018 | Kamgaing et al. |
| 10,134,687 B1 | 11/2018 | Kim et al. |
| 10,153,219 B2 | 12/2018 | Jeon et al. |
| 10,163,803 B1 | 12/2018 | Chen et al. |
| 10,170,386 B2 | 1/2019 | Kang et al. |
| 10,177,083 B2 | 1/2019 | Kim et al. |
| 10,211,072 B2 | 2/2019 | Chen et al. |
| 10,229,827 B2 | 3/2019 | Chen et al. |
| 10,256,180 B2 | 4/2019 | Liu et al. |
| 10,269,773 B1 | 4/2019 | Yu et al. |
| 10,297,518 B2 | 5/2019 | Lin et al. |
| 10,297,586 B2 | 5/2019 | Or-Bach et al. |
| 10,304,765 B2 | 5/2019 | Chen et al. |
| 10,347,585 B2 | 7/2019 | Shin et al. |
| 10,410,971 B2 | 9/2019 | Rae et al. |
| 10,424,530 B1 | 9/2019 | Alur et al. |
| 10,515,912 B2 | 12/2019 | Lim et al. |
| 10,522,483 B2 | 12/2019 | Shuto |
| 10,553,515 B2 | 2/2020 | Chew |
| 10,570,257 B2 | 2/2020 | Sun et al. |
| 10,658,337 B2 | 5/2020 | Yu et al. |
| 10,886,232 B2 | 1/2021 | Chen et al. |
| 11,264,331 B2 | 3/2022 | Chen et al. |
| 11,676,832 B2 | 6/2023 | Leschkies et al. |
| 2001/0020548 A1 | 9/2001 | Burgess |
| 2001/0030059 A1 | 10/2001 | Sugaya et al. |
| 2002/0036054 A1 | 3/2002 | Nakatani et al. |
| 2002/0048715 A1 | 4/2002 | Walczynski |
| 2002/0070443 A1 | 6/2002 | Mu et al. |
| 2002/0074615 A1 | 6/2002 | Honda |
| 2002/0135058 A1 | 9/2002 | Asahi et al. |
| 2002/0158334 A1 | 10/2002 | Vu et al. |
| 2002/0170891 A1 | 11/2002 | Boyle et al. |
| 2003/0059976 A1 | 3/2003 | Nathan et al. |
| 2003/0221864 A1 | 12/2003 | Bergstedt et al. |
| 2003/0222330 A1 | 12/2003 | Sun et al. |
| 2004/0045738 A1 | 3/2004 | Sugawa et al. |
| 2004/0080040 A1 | 4/2004 | Dotta et al. |
| 2004/0118824 A1 | 6/2004 | Burgess |
| 2004/0134682 A1 | 7/2004 | En et al. |
| 2004/0248363 A1* | 12/2004 | Bard .................. H01L 27/1203 257/E21.396 |
| 2004/0248412 A1 | 12/2004 | Liu et al. |
| 2004/0266159 A1 | 12/2004 | Gardecki et al. |
| 2005/0012217 A1* | 1/2005 | Mori ................ H01L 23/49827 257/E23.062 |
| 2005/0070092 A1 | 3/2005 | Kirby |
| 2005/0170292 A1 | 8/2005 | Tsai et al. |
| 2006/0014532 A1 | 1/2006 | Seligmann et al. |
| 2006/0073234 A1 | 4/2006 | Williams |
| 2006/0128069 A1 | 6/2006 | Hsu |
| 2006/0145328 A1 | 7/2006 | Hsu |
| 2006/0160332 A1 | 7/2006 | Gu et al. |
| 2006/0270242 A1 | 11/2006 | Verhaverbeke et al. |
| 2006/0283716 A1 | 12/2006 | Hafezi et al. |
| 2007/0035033 A1 | 2/2007 | Ozguz et al. |
| 2007/0042563 A1 | 2/2007 | Wang et al. |
| 2007/0077865 A1 | 4/2007 | Dysard et al. |
| 2007/0111401 A1 | 5/2007 | Kataoka et al. |
| 2007/0130761 A1 | 6/2007 | Kang et al. |
| 2007/0290300 A1 | 12/2007 | Kawakami |
| 2008/0006945 A1 | 1/2008 | Lin et al. |
| 2008/0011852 A1 | 1/2008 | Gu et al. |
| 2008/0076256 A1 | 3/2008 | Kawai et al. |
| 2008/0090095 A1 | 4/2008 | Nagata et al. |
| 2008/0113283 A1 | 5/2008 | Ghoshal et al. |
| 2008/0119041 A1 | 5/2008 | Magera et al. |
| 2008/0173792 A1 | 7/2008 | Yang et al. |
| 2008/0173999 A1 | 7/2008 | Chung et al. |
| 2008/0277776 A1 | 11/2008 | Enomoto |
| 2008/0296273 A1 | 12/2008 | Lei et al. |
| 2009/0084596 A1* | 4/2009 | Inoue ..................... H01L 24/24 29/846 |
| 2009/0224372 A1 | 9/2009 | Johnson |
| 2009/0243065 A1 | 10/2009 | Sugino et al. |
| 2009/0245301 A1 | 10/2009 | Peng et al. |
| 2009/0250823 A1 | 10/2009 | Racz et al. |
| 2009/0278126 A1 | 11/2009 | Yang et al. |
| 2009/0286402 A1 | 11/2009 | Xia et al. |
| 2010/0013081 A1 | 1/2010 | Toh et al. |
| 2010/0059876 A1 | 3/2010 | Shimizu et al. |
| 2010/0062287 A1 | 3/2010 | Beresford et al. |
| 2010/0068837 A1 | 3/2010 | Kumar et al. |
| 2010/0078805 A1 | 4/2010 | Li et al. |
| 2010/0144101 A1 | 6/2010 | Chow et al. |
| 2010/0148305 A1 | 6/2010 | Yun |
| 2010/0160170 A1 | 6/2010 | Horimoto et al. |
| 2010/0248451 A1 | 9/2010 | Pirogovsky et al. |
| 2010/0264538 A1 | 10/2010 | Swinnen et al. |
| 2010/0301023 A1 | 12/2010 | Unrath et al. |
| 2010/0307798 A1 | 12/2010 | Izadian |
| 2011/0062594 A1 | 3/2011 | Maekawa et al. |
| 2011/0097432 A1 | 4/2011 | Yu et al. |
| 2011/0111300 A1 | 5/2011 | DelHagen et al. |
| 2011/0151663 A1 | 6/2011 | Chatterjee et al. |
| 2011/0204505 A1 | 8/2011 | Pagaila et al. |
| 2011/0259631 A1 | 10/2011 | Rumsby |
| 2011/0272191 A1 | 11/2011 | Li et al. |
| 2011/0291293 A1 | 12/2011 | Tuominen et al. |
| 2011/0304024 A1 | 12/2011 | Renna |
| 2011/0316147 A1 | 12/2011 | Shih et al. |
| 2012/0128891 A1 | 5/2012 | Takei et al. |
| 2012/0135608 A1 | 5/2012 | Shimoi et al. |
| 2012/0146209 A1 | 6/2012 | Hu et al. |
| 2012/0164827 A1 | 6/2012 | Rajagopalan et al. |
| 2012/0229990 A1 | 9/2012 | Adachi et al. |
| 2012/0261805 A1 | 10/2012 | Sundaram et al. |
| 2012/0261832 A1* | 10/2012 | Takano ............ H01L 23/49822 257/E21.597 |
| 2013/0074332 A1 | 3/2013 | Suzuki |
| 2013/0105329 A1 | 5/2013 | Matejat et al. |
| 2013/0196501 A1 | 8/2013 | Sulfridge |
| 2013/0200528 A1 | 8/2013 | Lin et al. |
| 2013/0203190 A1 | 8/2013 | Reed et al. |
| 2013/0286615 A1 | 10/2013 | Inagaki et al. |
| 2013/0341738 A1 | 12/2013 | Reinmuth et al. |
| 2014/0034374 A1 | 2/2014 | Cornejo et al. |
| 2014/0054075 A1 | 2/2014 | Hu |
| 2014/0092519 A1 | 4/2014 | Yang |
| 2014/0094094 A1 | 4/2014 | Rizzuto et al. |
| 2014/0103499 A1 | 4/2014 | Andry et al. |
| 2014/0252655 A1 | 9/2014 | Tran et al. |
| 2014/0353019 A1* | 12/2014 | Arora .................. H05K 3/0035 156/247 |
| 2015/0043126 A1 | 2/2015 | Hurwitz et al. |
| 2015/0187691 A1 | 7/2015 | Vick |
| 2015/0228416 A1 | 8/2015 | Hurwitz et al. |
| 2015/0255344 A1 | 9/2015 | Ebefors et al. |
| 2015/0296610 A1 | 10/2015 | Daghighian et al. |
| 2015/0311093 A1 | 10/2015 | Li et al. |
| 2015/0359098 A1 | 12/2015 | Ock |
| 2015/0380356 A1 | 12/2015 | Chauhan et al. |
| 2016/0013135 A1 | 1/2016 | He et al. |
| 2016/0020163 A1 | 1/2016 | Shimizu et al. |
| 2016/0049371 A1 | 2/2016 | Lee et al. |
| 2016/0088729 A1 | 3/2016 | Kobuke et al. |
| 2016/0095203 A1 | 3/2016 | Min et al. |
| 2016/0118325 A1 | 4/2016 | Wang et al. |
| 2016/0118337 A1 | 4/2016 | Yoon et al. |
| 2016/0270242 A1 | 9/2016 | Kim et al. |

(56) References Cited

U.S. PATENT DOCUMENTS

| | | |
|---|---|---|
| 2016/0276325 A1 | 9/2016 | Nair et al. |
| 2016/0329299 A1 | 11/2016 | Lin et al. |
| 2016/0336296 A1 | 11/2016 | Jeong et al. |
| 2017/0047308 A1 | 2/2017 | Ho et al. |
| 2017/0064835 A1 | 3/2017 | Ishihara et al. |
| 2017/0103946 A1 | 4/2017 | Chang et al. |
| 2017/0207197 A1 | 7/2017 | Yu et al. |
| 2017/0223842 A1 | 8/2017 | Chujo et al. |
| 2017/0229432 A1 | 8/2017 | Lin et al. |
| 2017/0338254 A1 | 11/2017 | Reit et al. |
| 2018/0019197 A1 | 1/2018 | Boyapati et al. |
| 2018/0033779 A1 | 2/2018 | Park et al. |
| 2018/0047666 A1 | 2/2018 | Lin et al. |
| 2018/0116057 A1 | 4/2018 | Kajihara et al. |
| 2018/0145044 A1 | 5/2018 | Park et al. |
| 2018/0182727 A1 | 6/2018 | Yu |
| 2018/0197831 A1 | 7/2018 | Kim et al. |
| 2018/0204802 A1 | 7/2018 | Lin et al. |
| 2018/0308792 A1 | 10/2018 | Raghunathan et al. |
| 2018/0352658 A1 | 12/2018 | Yang |
| 2018/0374696 A1 | 12/2018 | Chen et al. |
| 2018/0376589 A1 | 12/2018 | Harazono |
| 2019/0088603 A1 | 3/2019 | Marimuthu et al. |
| 2019/0131224 A1 | 5/2019 | Choi et al. |
| 2019/0131270 A1 | 5/2019 | Lee et al. |
| 2019/0131284 A1 | 5/2019 | Jeng et al. |
| 2019/0189561 A1 | 6/2019 | Rusli |
| 2019/0229046 A1 | 7/2019 | Tsai et al. |
| 2019/0237430 A1 | 8/2019 | England |
| 2019/0285981 A1 | 9/2019 | Cunningham et al. |
| 2019/0306988 A1 | 10/2019 | Grober et al. |
| 2019/0326224 A1 | 10/2019 | Aoki |
| 2019/0355675 A1 | 11/2019 | Lee et al. |
| 2019/0355680 A1 | 11/2019 | Chuang et al. |
| 2019/0369321 A1 | 12/2019 | Young et al. |
| 2020/0003936 A1 | 1/2020 | Fu et al. |
| 2020/0008305 A1 | 1/2020 | Clark |
| 2020/0039002 A1 | 2/2020 | Sercel et al. |
| 2020/0130131 A1 | 4/2020 | Togawa et al. |
| 2020/0163218 A1 | 5/2020 | Mok |
| 2020/0357947 A1 | 11/2020 | Chen et al. |
| 2020/0358163 A1 | 11/2020 | See et al. |
| 2020/0395306 A1 | 12/2020 | Chen et al. |
| 2021/0005550 A1 | 1/2021 | Chavali et al. |

FOREIGN PATENT DOCUMENTS

| | | | |
|---|---|---|---|
| CN | 1663038 A | 8/2005 | |
| CN | 1971894 A | 5/2007 | |
| CN | 101066005 A | 10/2007 | |
| CN | 101079410 A | 11/2007 | |
| CN | 100463128 C | 2/2009 | |
| CN | 101438295 A | 5/2009 | |
| CN | 100502040 C | 6/2009 | |
| CN | 100524717 C | 8/2009 | |
| CN | 100561696 C | 11/2009 | |
| CN | 102024713 A | 4/2011 | |
| CN | 102437110 A | 5/2012 | |
| CN | 103915413 A | 7/2014 | |
| CN | 104637912 A | 5/2015 | |
| CN | 105436718 A | 3/2016 | |
| CN | 105575938 A | 5/2016 | |
| CN | 106531647 A | 3/2017 | |
| CN | 106537576 A | 3/2017 | |
| CN | 106653703 A | 5/2017 | |
| CN | 107428544 A | 12/2017 | |
| CN | 108028225 A | 5/2018 | |
| CN | 109155246 A | 1/2019 | |
| CN | 111492472 A | 8/2020 | |
| EP | 0264134 A2 | 4/1988 | |
| EP | 1341638 A1 | 9/2003 | |
| EP | 1536673 A1 | 6/2005 | |
| EP | 1478021 B1 | 7/2008 | |
| EP | 2023382 A1 | 2/2009 | |
| EP | 1845762 B1 | 5/2011 | |
| EP | 2942808 A1 | 11/2015 | |
| JP | H06152089 A | 5/1994 | |
| JP | H11233950 A | 8/1999 | |
| JP | 11233950 | 4/2001 | |
| JP | 2001244591 A | 9/2001 | |
| JP | 2002202454 A | 7/2002 | |
| JP | 2002208778 A | 7/2002 | |
| JP | 2002246755 A | 8/2002 | |
| JP | 2003188340 A | 7/2003 | |
| JP | 2004193614 A | 7/2004 | |
| JP | 2004311788 A | 11/2004 | |
| JP | 2004335641 A | 11/2004 | |
| JP | 2005026670 A | 1/2005 | |
| JP | 2006032556 A | 2/2006 | |
| JP | 2007059951 A | 3/2007 | |
| JP | 2007067215 A | 3/2007 | |
| JP | 2008066517 A | 3/2008 | |
| JP | 2008515645 A | 5/2008 | |
| JP | 4108285 B2 | 6/2008 | |
| JP | 2008177576 A | 7/2008 | |
| JP | 2009081423 A | 4/2009 | |
| JP | 2010129723 A | 6/2010 | |
| JP | 2010528866 A | 8/2010 | |
| JP | 2010529664 A | 8/2010 | |
| JP | 2011216636 A | 10/2011 | |
| JP | 2012043867 A | 3/2012 | |
| JP | 2012069926 A | 4/2012 | |
| JP | 5004378 B2 | 8/2012 | |
| JP | 5111342 B2 | 1/2013 | |
| JP | 2013176835 A | 9/2013 | |
| JP | 2013207006 A | 10/2013 | |
| JP | 2013222889 A | 10/2013 | |
| JP | 5608605 B2 | 10/2014 | |
| JP | 5693977 B2 | 4/2015 | |
| JP | 5700241 B2 | 4/2015 | |
| JP | 2015070007 A | 4/2015 | |
| JP | 2015109346 A * | 6/2015 | ........... H05K 1/0231 |
| JP | 201692107 A | 5/2016 | |
| JP | 2016102964 A | 6/2016 | |
| JP | 5981232 B2 | 8/2016 | |
| JP | 2016171118 A | 9/2016 | |
| JP | 2017148920 A | 8/2017 | |
| JP | 2017197708 A | 11/2017 | |
| JP | 6394136 B2 | 9/2018 | |
| JP | 2018195620 A | 12/2018 | |
| JP | 2019009297 A | 1/2019 | |
| JP | 2019512168 A | 5/2019 | |
| JP | 6542616 B2 | 7/2019 | |
| JP | 6626697 B2 | 12/2019 | |
| KP | 20040096537 A | 3/2007 | |
| KP | 20160038293 A | 4/2016 | |
| KR | 20010060103 A | 7/2001 | |
| KR | 100714196 B1 | 5/2007 | |
| KR | 100731112 B1 | 6/2007 | |
| KR | 10-2008-0037296 A | 4/2008 | |
| KR | 2008052491 A | 6/2008 | |
| KR | 20100097893 A | 9/2010 | |
| KR | 100997993 B1 | 12/2010 | |
| KR | 101301507 B1 | 9/2013 | |
| KR | 20140006032 A | 1/2014 | |
| KR | 20140065547 A | 5/2014 | |
| KR | 20140086375 A | 7/2014 | |
| KR | 20140135278 A | 11/2014 | |
| KR | 20150009123 A | 1/2015 | |
| KR | 101494413 B1 | 2/2015 | |
| KR | 20160013706 A | 2/2016 | |
| KR | 20180113885 A | 10/2018 | |
| KR | 101922884 B1 | 11/2018 | |
| KR | 20180121893 A | 11/2018 | |
| KR | 20190049411 A | 5/2019 | |
| KR | 20190050781 A | 5/2019 | |
| KR | 101975302 B1 | 8/2019 | |
| KR | 102012443 B1 | 8/2019 | |
| KR | 20200020632 A | 2/2020 | |
| KR | 20210068581 A | 6/2021 | |
| KR | 20210124920 A | 10/2021 | |
| TW | 200428545 A | 12/2004 | |
| TW | 200839997 A | 10/2008 | |
| TW | 201042019 A | 12/2010 | |

(56) References Cited

FOREIGN PATENT DOCUMENTS

| | | |
|---|---|---|
| TW | 201332406 A | 8/2013 |
| TW | 201436015 A | 9/2014 |
| TW | 201511634 A | 3/2015 |
| TW | 201536130 A | 9/2015 |
| TW | 201642420 A | 12/2016 |
| TW | I594397 B | 8/2017 |
| TW | 201735308 A | 10/2017 |
| TW | 201805400 A | 2/2018 |
| TW | 201824472 A | 7/2018 |
| TW | 201824746 A | 7/2018 |
| TW | 201916299 A | 4/2019 |
| TW | 201943321 A | 11/2019 |
| TW | 201944533 A | 11/2019 |
| TW | 202008524 A | 2/2020 |
| WO | 2004082879 A2 | 9/2004 |
| WO | 2011130300 A1 | 10/2011 |
| WO | 2013008415 A1 | 1/2013 |
| WO | 2013126927 A2 | 8/2013 |
| WO | 2014186538 A | 11/2014 |
| WO | 2015126438 A1 | 8/2015 |
| WO | 2016143797 A | 9/2016 |
| WO | 2017111957 A1 | 6/2017 |
| WO | 2018013122 A1 | 1/2018 |
| WO | 2018125184 A1 | 7/2018 |
| WO | 2019023213 A1 | 1/2019 |
| WO | 2019066988 A1 | 4/2019 |
| WO | 2019/177742 A1 | 9/2019 |
| WO | 2020010538 A1 | 1/2020 |

OTHER PUBLICATIONS

Definition of "embed", retrieved from http://www.merriam-webster.com (2023) (Year: 2023).*
Definition of "surround", retrieved from http://www.merriam-webster.com (2023) (Year: 2023).*
Tecnisco, Ltd.—"Company Profile" presentation with product introduction, date unknown, 26 pages.
Wang et al. "Study of Direct Cu Electrodeposition on Ultra-Thin Mo for Copper Interconnect", State key lab of ASIC and system, School of microelectronics, Fudan University, Shanghai, China; 36 pages.
International Search Report and Written Opinion dated Oct. 7, 2021 for Application No. PCT/U.S. Pat. No. 2021037375.
PCT International Search Report and Written Opinion dated Oct. 19, 2021, for International Application No. PCT/US2021/038690.
PCT International Search Report and Written Opinion dated Feb. 4, 2022, for International Application No. PCT/US2021/053830.
PCT International Search Report and Written Opinion dated Feb. 4, 2022, for International Application No. PCT/US2021/053821.
U.S. Office Action dated May 13, 2021, in U.S. Appl. No. 16/870,843.
Chen, Qiao—"Modeling, Design and Demonstration of Through-Package-Vias in Panel-Based Polycrystalline Silicon Interposers for High Performance, High Reliability and Low Cost," a Dissertation presented to the Academic Faculty, Georgia Institute of Technology, May 2015, 168 pages.
Annon, John Jr., et al., "Fabrication and Testing of a TSV-Enabled Si Interposer with Cu- and Polymer-Based Multilevel Metallization," IEEE Transactions on Components, Packaging and Manufacturing Technology, vol. 4, No. 1, Jan. 2014, pp. 153-157.
Malta, D., et al.—"Fabrication of TSV-Based Silicon Interposers," 3D Systems Integration Conference (3DIC), 2010 IEEE International, Nov. 16-18, 2010, 6 pages.
Allresist Gmbh—Strausberg et al: "Resist-Wiki: Adhesion promoter HMDS and diphenylsilanedio (AR 300-80)—. . . —ALLRESIST GmbH—Strausberg, Germany", Apr. 12, 2019 (Apr. 12, 2019), XP055663206, Retrieved from the Internet: URL:https://web.archive.org/web/2019041220micals-adhesion-promoter-hmds-and-diphenyl2908/https://www.allresist.com/process-chemicals-adhesion-promoter-hmds-and-diphenylsilanedio/, [retrieved on Jan. 29, 2020].
Amit Kelkar, et al. "Novel Mold-free Fan-out Wafer Level Package using Silicon Wafer", IMAPS 2016—49th International Symposium on Microelectronics—Pasadena, CA USA—Oct. 10-13, 2016, 5 pages. (IMAPS 2016—49th International Symposium on Microelectronics—Pasadena, CA USA—Oct. 10-13, 2016, 5 pages.).
Arifur Rahman. "System-Level Performance Evaluation of Three-Dimensional Integrated Circuits", vol. 8, No. 6, Dec. 2000. pp. 671-678.
Baier, T. et al., Theoretical Approach to Estimate Laser Process Parameters for Drilling in Crystalline Silicon, Prog. Photovolt: Res. Appl. 18 (2010) 603-606, 5 pages.
Chien-Wei Chien et al "Chip Embedded Wafer Level Packaging Technology for Stacked RF-SiP Application",2007 IEEE, pp. 305-310.
Chien-Wei Chien et al. "3D Chip Stack With Wafer Through Hole Technology". 6 pages.
Doany, F.E., et al.—"Laser release process to obtain freestanding multilayer metal-polyimide circuits," IBM Journal of Research and Development, vol. 41, Issue 1/2, Jan./Mar. 1997, pp. 151-157.
Dyer, P.E., et al.—"Nanosecond photoacoustic studies on ultraviolet laser ablation of organic polymers," Applied Physics Letters, vol. 48, No. 6, Feb. 10, 1986, pp. 445-447.
Han et al.—"Process Feasibility and Reliability Performance of Fine Pitch Si Bare Chip Embedded in Through Cavity of Substrate Core," IEEE Trans. Components, Packaging and Manuf. Tech., vol. 5, No. 4, pp. 551-561, 2015. [Han et al. IEEE Trans. Components, Packaging and Manuf. Tech., vol. 5, No. 4, pp. 551-561, 2015.]
Han et al.—"Through Cavity Core Device Embedded Substrate for Ultra-Fine-Pitch Si Bare Chips; (Fabrication feasibility and residual stress evaluation)", ICEP-IAAC, 2015, pp. 174-179. [Han et al., ICEP-IAAC, 2015, pp. 174-179.]
Han, Younggun, et al.—"Evaluation of Residual Stress and Warpage of Device Embedded Substrates with Piezo-Resistive Sensor Silicon Chips" technical paper, Jul. 31, 2015, pp. 81-94.
International Search Report and the Written Opinion for International Application No. PCT/US2019/064280 mailed Mar. 20, 2020, 12 pages.
International Search Report and Written Opinion for Application No. PCT/US2020/026832 dated Jul. 23, 2020.
Italian search report and written opinion for Application No. IT 201900006736 dated Mar. 2, 2020.
Italian Search Report and Written Opinion for Application No. IT 201900006740 dated Mar. 4, 2020.
Junghoon Yeom', et al. "Critical Aspect Ratio Dependence in Deep Reactive Ion Etching of Silicon", 2003 IEEE. pp. 1631-1634.
K. Sakuma et al. "3D Stacking Technology with Low-Volume Lead-Free Interconnections", IBM T.J. Watson Research Center. 2007 IEEE, pp. 627-632.
Kenji Takahashi et al. "Current Status of Research and Development for Three-Dimensional Chip Stack Technology", Jpn. J. Appl. Phys. Vol. 40 (2001) pp. 3032-3037, Part 1, No. 4B, Apr. 2001. 6 pages.
Kim et al. "A Study on the Adhesion Properties of Reactive Sputtered Molybdenum Thin Films with Nitrogen Gas on Polyimide Substrate as a Cu Barrier Layer," 2015, Journal of Nanoscience and Nanotechnology, vol. 15, No. 11, pp. 8743-8748, doi: 10.1166/jnn.2015.11493.
Knickerbocker, J.U., et al.—"Development of next-generation system-on-package (SOP) technology based on silicon carriers with fine-pitch chip interconnection," IBM Journal of Research and Development, vol. 49, Issue 4/5, Jul./Sep. 2005, pp. 725-753.
Knickerbocker, John U., et al.—"3-D Silicon Integration and Silicon Packaging Technology Using Silicon Through-Vias," IEEE Journal of Solid-State Circuits, vol. 41, No. 8, Aug. 2006, pp. 1718-1725.
Knorz, A. et al., High Speed Laser Drilling: Parameter Evaluation and Characterisation, Presented at the 25th European PV Solar Energy Conference and Exhibition, Sep. 6-10, 2010, Valencia, Spain, 7 pages.
L. Wang, et al. "High aspect ratio through-wafer interconnections for 3Dmicrosystems", 2003 IEEE. pp. 634-637.
Lee et al. "Effect of sputtering parameters on the adhesion force of copper/molybdenum metal on polymer substrate," 2011, Current Applied Physics, vol. 11, pp. S12-S15, doi: 10.1016/j.cap.2011.06.019.

(56) References Cited

OTHER PUBLICATIONS

Liu, C.Y. et al., Time Resolved Shadowgraph Images of Silicon during Laser Ablation: Shockwaves and Particle Generation, Journal of Physics: Conference Series 59 (2007) 338-342, 6 pages.
Narayan, C., et al.—"Thin Film Transfer Process for Low Cost MCM's," Proceedings of 1993 IEEE/CHMT International Electronic Manufacturing Technology Symposium, Oct. 4-6, 1993, pp. 373-380.
NT Nguyen et al. "Through-Wafer Copper Electroplating for Three-Dimensional Interconnects", Journal of Micromechanics and Microengineering. 12 (2002) 395-399. 2002 IOP.
PCT International Search Report and Written Opinion dated Aug. 28, 2020, for International Application No. PCT/US2020/032245.
PCT International Search Report and Written Opinion dated Feb. 17, 2021 for International Application No. PCT/US2020/057787.
PCT International Search Report and Written Opinion dated Feb. 19, 2021, for International Application No. PCT/US2020/057788.
PCT International Search Report and Written Opinion dated Sep. 15, 2020, for International Application No. PCT/US2020/035778.
Ronald Hon et al. "Multi-Stack Flip Chip 3D Packaging with Copper Plated Through-Silicon Vertical Interconnection", 2005 IEEE. pp. 384-389.
S. W. Ricky Lee et al. "3D Stacked Flip Chip Packaging with Through Silicon Vias and Copper Plating or Conductive Adhesive Filling", 2005 IEEE, pp. 798-801.
Shen, Li-Cheng, et al.—"A Clamped Through Silicon Via (TSV) Interconnection for Stacked Chip Bonding Using Metal Cap on Pad and Metal Column Forming in Via," Proceedings of 2008 Electronic Components and Technology Conference, pp. 544-549.
Shi, Tailong, et al.—"First Demonstration of Panel Glass Fan-out (GFO) Packages for High I/O Density and High Frequency Multichip Integration," Proceedings of 2017 IEEE 67th Electronic Components and Technology Conference, May 30-Jun. 2, 2017, pp. 41-46.
Srinivasan, R., et al.—"Ultraviolet Laser Ablation of Organic Polymers," Chemical Reviews, 1989, vol. 89, No. 6, pp. 1303-1316.
Taiwan Office Action dated Oct. 27, 2020 for Application No. 108148588.
Trusheim, D. et al., Investigation of the Influence of Pulse Duration in Laser Processes for Solar Cells, Physics Procedia Dec. 2011, 278-285, 9 pages.
Wu et al., Microelect. Eng., vol. 87 2010, pp. 505-509.
Yu et al. "High Performance, High Density RDL for Advanced Packaging," 2018 IEEE 68th Electronic Components and Technology Conference, pp. 587-593, DOI 10.1109/ETCC.2018.0009.
Yu, Daquan—"Embedded Silicon Fan-out (eSiFO) Technology for Wafer-Level System Integration," Advances in Embedded and Fan-Out Wafer-Level Packaging Technologies, First Edition, edited by Beth Keser and Steffen Kroehnert, published 2019 by John Wiley & Sons, Inc., pp. 169-184.
Taiwan Office Action dated Jan. 9, 2023, for Taiwan Patent Application No. 109140460.
Japanese Office Action dated Aug. 29, 2023, for Japanese Patent Application No. 2022-529566.
Taiwan Office Action dated Apr. 8, 2024, for Taiwan Patent Application No. 113106910.
Taiwan Office Action dated Feb. 5, 2024, for Taiwan Patent Application No. 112135866.
Taiwan Office Action dated Oct. 25, 2024, for Taiwan Patent Application No. 113105238.
Chinese Office Action dated Feb. 17, 2025, for Chinese Patent Application No. 202080081984.4.
Taiwan Office Action dated Feb. 25, 2022, for Taiwan Patent Application No. 109119795.
PCT International Search Report and Written Opinion dated Aug. 12, 2022 for International Application No. PCT/US2022/026652.
Taiwan Office Action dated Sep. 22, 2022, for Taiwan Patent Application No. 111130159.
Japanese Office Action dated Feb. 28, 2023, for Japanese Patent Application No. 2021-574255.
PCT International Search Report and Written Opinion dated Nov. 4, 2022, for International Application No. PCT/US2022/036724.
Japanese Office Action dated Jan. 31, 2023, for Japanese Patent Application No. 2021-566586.
Korean Office Action dated Mar. 10, 2023, for Korean Patent Application No. 10-2021-7040360.
Korean Office Action dated Mar. 10, 2023, for Korean Patent Application No. 10-2021-7040365.
Japanese Office Action dated Feb. 7, 2023, for Japanese Patent Application No. 2021-566585.
Taiwan Office Action issued to U.S. Appl. No. 10/914,056 on Apr. 27, 2023.
Korean Office Action issued to Patent Application No. 109140506 on May 11, 2023.
Japanese Office Action issued to Patent Application No. 2021-574255 on Sep. 12, 2023.
PCT International Search Report and Written Opinion dated Sep. 15, 2023, for International Application No. PCT/US2023/021345.
Office Action for Korean Application No. 10-2022-7001325 dated Nov. 16, 2023.
Taiwan Office Action dated Oct. 17, 2023, for Taiwan Patent Application No. 110138256.
Japanese Office Action dated Dec. 18, 2023 for Japan application No. 2021-574255.
Japanese Office Action dated Feb. 27, 2024 for Application No. 2023-501778.
Makoto Fujiwara et al., Extended Abstracts of the 2008 International Conference on SSDM, Tsukuba, 2008, pp. 958-959.
Korean Office Action issued to Patent Application No. 10-2024-7009552 on Apr. 11, 2024.
Taiwan Office Action dated May 10, 2024, for Taiwan Patent Application No. 110112309.
Korean Office Action dated May 17, 2024, for Korean Patent Application No. 10-2021-0043866.
Chinese Office Action dated Apr. 24, 2024, for Chinese Patent Application No. 2020800340030.
Singapore Search Report issued to application No. 11202260565R on Jun. 24, 2024.
Japanese Office Action dated Apr. 2, 2024, for Japanese Patent Application No. 2023-504680.
Korean Office Action dated May 8, 2024, for Korean Patent Application No. 10-2021-0029412.
Taiwan Office Action issued to patent application No. 110108250 on Jul. 31, 2024.
Taiwan Office Action dated Jul. 17, 2024, for Taiwan Patent Application No. 113106910.
Korean Office Action dated Aug. 28, 2024 for Application No. 10-2023-7004245.
China Office Action issued to patent application No. 202180048402.7 on Aug. 22, 2024.
Korean Office Action issued to patent application No. 10-2023-7037417 on Oct. 10, 2024.
European Search Report DTD Aug. 20, 24 For EP 21841312.8.
EPO Supplementary European Search Report dated Aug. 5, 2024, for European Patent Application No. 21845570.7.
Japanese Office Action dated Aug. 13, 2024, for Japanese Patent Application No. 2023-504680.
Korean Office Action dated Oct. 17, 2024, for Korean Patent Application No. 10-2023-7002247.
China Office Action issued to patent application No. 202080081984.4 on Aug. 2, 2024.
Chinese Office Action dated Dec. 19, 2024, for Chinese Patent Application No. 202080082028.8.
Japanese Office Action dated Mar. 11, 2025, for Japanese Patent Application No. 2024-036936.

* cited by examiner

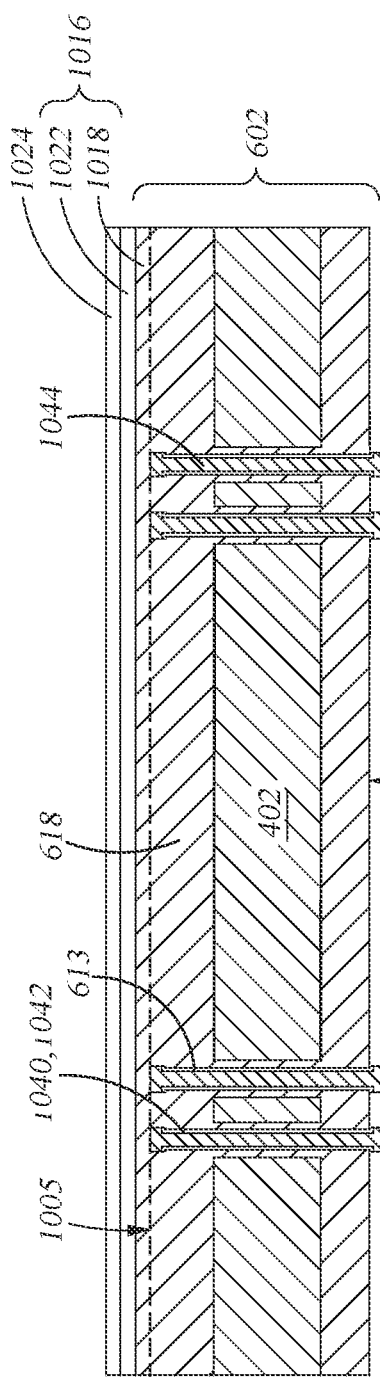
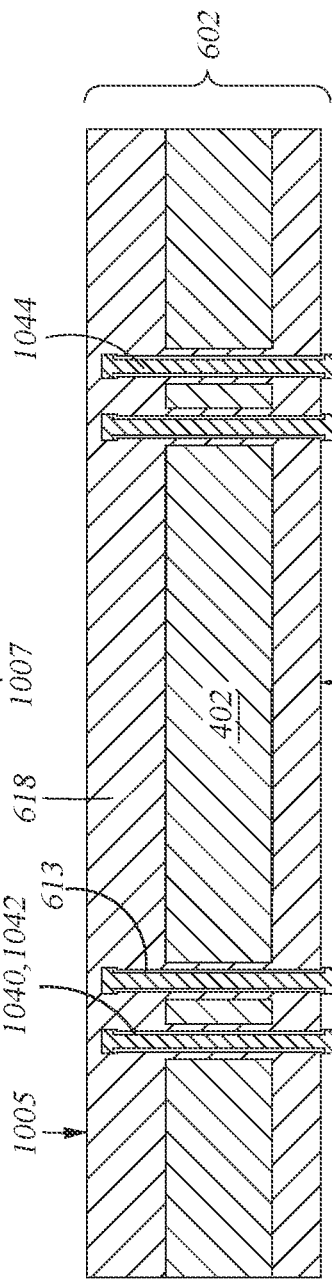
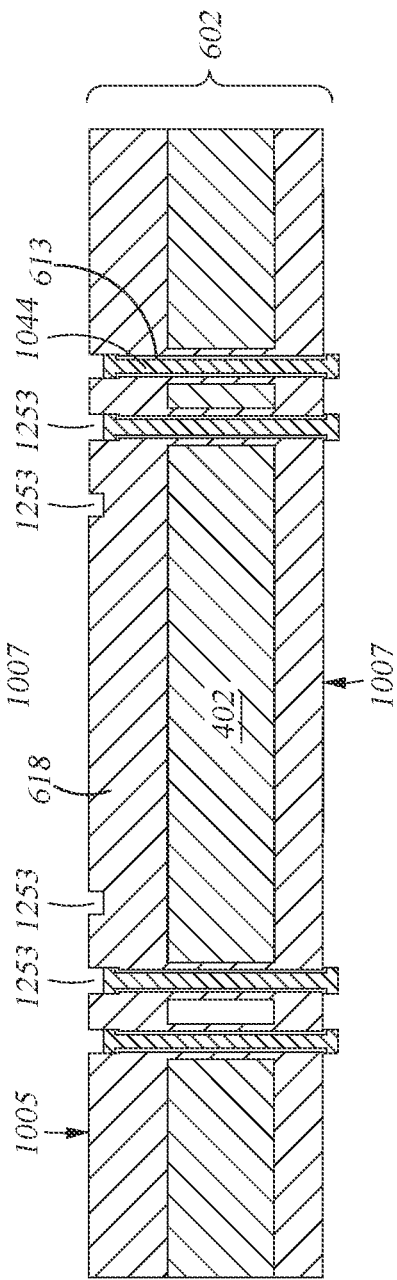
Fig. 12A
Fig. 12B
Fig. 12C

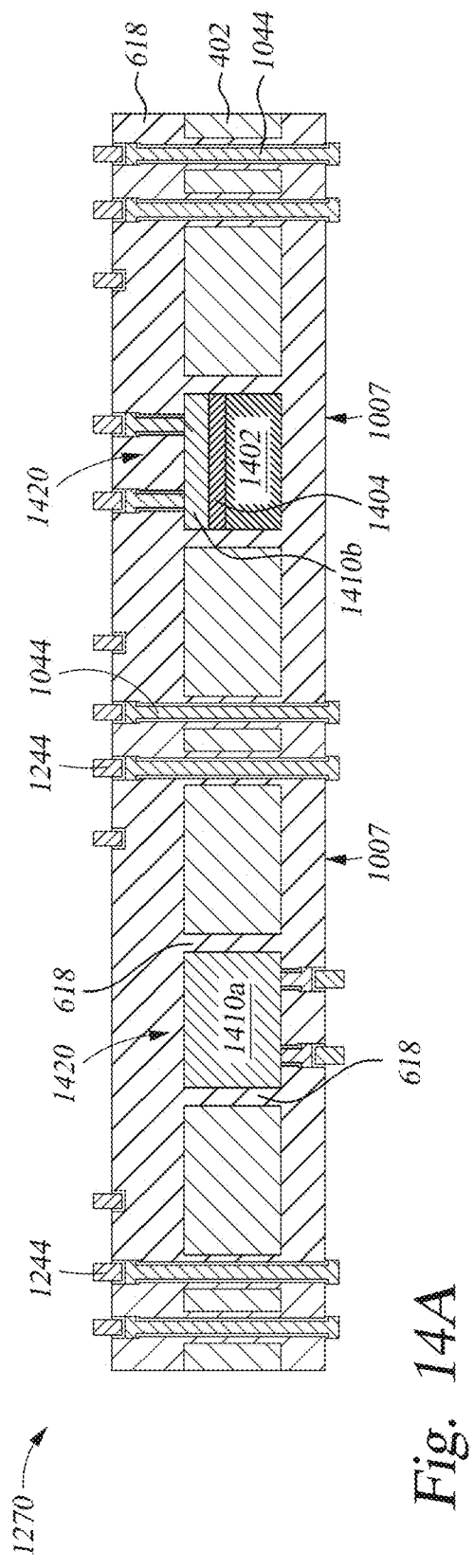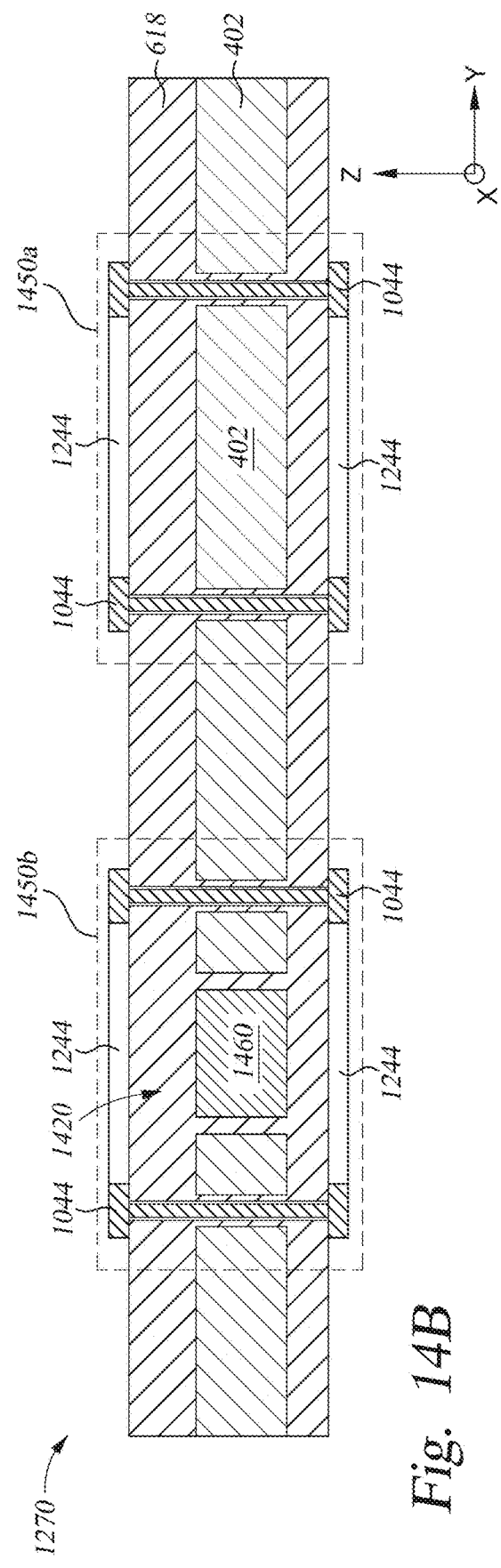
Fig. 14A
Fig. 14B

PACKAGE CORE ASSEMBLY AND FABRICATION METHODS

CROSS-REFERENCE TO RELATED APPLICATIONS

This application is a continuation of U.S. patent application Ser. No. 16/886,704, filed May 28, 2020, which is a continuation-in-part of U.S. patent application Ser. No. 16/698,680, filed Nov. 27, 2019, each of which is herein incorporated by reference in its entirety.

BACKGROUND

Field

Embodiments of the present disclosure generally relate to electronic mounting structures and methods of forming the same. More specifically, embodiments described herein relate to semiconductor package and PCB assemblies and methods of forming the same.

Description of the Related Art

Due to an ever-increasing demand for miniaturized electronic devices and components, the demand for faster processing capabilities with greater circuit densities imposes corresponding demands on the materials, structures, and processes used in the fabrication of such integrated circuit chips. Alongside these trends toward greater integration and performance, however, there exists the perpetual pursuit for reduced manufacturing costs.

Conventionally, integrated circuit chips have been fabricated on organic package substrates coupled to circuit boards (e.g. printed circuit boards (PCB's)) due to the ease of forming features and connections in the organic package substrates, as well as the relatively low package manufacturing costs associated with organic composites. However, as circuit densities are increased and electronic devices are further miniaturized, the utilization of organic package substrates and conventional interconnect PCB's becomes impractical due to limitations with material structuring resolution to sustain device scaling and associated performance requirements. More recently, 2.5D and 3D integrated circuits have been fabricated utilizing passive silicon interposers as redistribution layers to compensate for some of the limitations associated with organic package substrates. Silicon interposer utilization is driven by the potential for high-bandwidth density, lower-power chip-to-chip communication, and heterogeneous integration sought in advanced electronic mounting and packaging applications. Yet, the formation of features in silicon interposers, such as through-silicon vias (TSVs), is still difficult and costly. In particular, high costs are imposed by high-aspect-ratio silicon via etching, chemical mechanical planarization, and semiconductor back end of line (BEOL) interconnection.

Therefore, what is needed in the art are improved semiconductor package and PCB core assemblies having increased densities and methods of forming the same.

SUMMARY

The present disclosure generally relates to electronic mounting structures and methods of forming the same.

In one embodiment, a semiconductor device assembly is provided. The semiconductor device assembly includes a silicon core structure having a first surface opposing a second surface and a thickness less than about 1000 µm. One or more conductive interconnections are formed through the silicon core structure and protrude from the first surface and the second surface. The semiconductor device assembly further includes a first redistribution layer formed on the first surface and a second redistribution layer formed on the second surface. The first redistribution layer and the second redistribution layer each have one or more conductive contacts formed thereon.

In one embodiment, a semiconductor device assembly is provided. The semiconductor device assembly includes a silicon core structure, a passivating layer, and a dielectric layer. The silicon core structure has a thickness less than about 1000 µm. The passivating layer surrounds the silicon core structure and includes a thermal oxide. The dielectric layer is formed on the passivating layer and includes an epoxy resin having silica particles disposed therein.

In one embodiment, a semiconductor device assembly is provided. The semiconductor device includes a silicon core structure, a passivating layer surrounding the silicon structure and including a thermal oxide, a dielectric layer surrounding the passivating layer and formed of an epoxy resin, and a redistribution layer formed on the dielectric layer. The redistribution layer further includes an adhesion layer formed on the dielectric layer and formed of molybdenum, a copper seed layer formed on the adhesion layer, and a copper layer formed on the copper seed layer.

Embodiments of the disclosure may further provide a semiconductor device assembly, comprising a silicon core structure that has a first side opposing a second side, a first redistribution layer formed on the first side, and a second redistribution layer formed on the second side. A dielectric layer comprising a flowable epoxy resin material may also be formed on the first side and the second side and have a thickness between about 5 µm and about 50 µm. The silicon core structure may have a thickness less than 1500 µm, a metal cladding layer formed on the first side and the second side, and one or more conductive interconnections formed in one or more through-assembly vias and having a surface exposed at the first side and the second side. Each of the one or more through-assembly vias is circumferentially defined by the dielectric layer. The first redistribution layer and the second redistribution layer each have one or more conductive contacts formed thereon. The metal cladding layer circumferentially surrounds each of the one or more conductive interconnections. The metal cladding layer may have a thickness between about 100 nm and about 5 µm on substantially all exposed surfaces of the silicon core. The metal cladding layer may further be conductively coupled to ground by one or more conductive cladding connections disposed in the first redistribution layer and the second redistribution layer.

Embodiments of the disclosure may further provide a semiconductor device assembly, comprising a silicon core structure that has a thickness less than 1500 µm, a metal or oxide layer formed on at least two surfaces thereof, and a dielectric layer comprising an epoxy resin having silica particles formed on the metal or oxide layer. One or more vias circumferentially defined by the dielectric layer and having a diameter less than about 1500 µm are disposed through the semiconductor device assembly and are filled with copper. The dielectric layer circumferentially defining the one or more vias may further be circumferentially surrounded by the metal or oxide layer. A redistribution layer having one or more redistribution connections may be formed on the dielectric layer. The redistribution connections and the copper-filled vias may together form an inductive coil. The silicon core structure may further comprise one or more pockets containing a silicon capacitor therein. A heat exchanger may further be disposed over the dielectric layer or coupled to the metal or oxide layer.

Embodiments of the disclosure may further provide a semiconductor device assembly, comprising a silicon core structure having a first side opposing a second side and a thickness less than 1500 µm, a nickel cladding layer formed on the first side and the second side, and a dielectric layer comprising an epoxy resin and surrounding the nickel cladding layer. An array of vias is disposed through the silicon core structure and filled with a conductive material, each via of the array of vias defined by the dielectric layer. A redistribution layer is formed on the dielectric layer and comprises a molybdenum-containing adhesion layer formed on the dielectric layer, a copper seed layer formed on the adhesion layer, and a copper layer formed on the copper seed layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIGS. 12A-12L schematically illustrate cross-sectional views of the semiconductor core assembly at different stages of the process depicted in FIG. 11, according to embodiments described herein.

FIG. 14A schematically illustrates a cross-sectional view of a semiconductor core assembly having one or more passive devices integrated therein, according to embodiments described herein.

FIG. 14B schematically illustrates a cross-sectional view of a semiconductor core assembly having one or more passive devices integrated therein, according to embodiments described herein.

To facilitate understanding, identical reference numerals have been used, where possible, to designate identical elements that are common to the Figures. It is contemplated that elements and features of one embodiment may be beneficially incorporated in other embodiments without further recitation.

DETAILED DESCRIPTION

The present disclosure relates to semiconductor core assemblies and methods of forming the same. The semiconductor core assemblies described herein may be utilized to form semiconductor package assemblies, PCB assemblies, PCB spacer assemblies, chip carrier assemblies, intermediate carrier assemblies (e.g., for graphics cards), and the like. In one embodiment, a silicon substrate core is structured by direct laser patterning. One or more conductive interconnections are formed in the substrate core and one or more redistribution layers are formed on surfaces thereof. The silicon substrate core may thereafter be utilized as a core structure for a semiconductor package, PCB, PCB spacer, chip carrier, intermediate carrier, or the like.

The methods and apparatus disclosed herein include novel thin-form-factor semiconductor core structures intended to replace more conventional semiconductor package, PCB, and chip carrier structures utilizing glass fiber-filled epoxy frames. Generally, the scalability of current semiconductor packages, PCBs, spacers, and chip carriers is limited by the rigidity and lack of planarity of the materials typically utilized to form these various structures (e.g., epoxy molding compound, FR-4 and FR-5 grade woven fiberglass cloth with epoxy resin binders, and the like). The intrinsic properties of these materials cause difficulty in patterning and utilizing fine (e.g., micron scale) features formed therein. Furthermore, as a result of the properties (e.g., insulativity) of currently-utilized materials, coefficient of thermal expansion (CTE) mismatch may occur between fiberglass frames, boards, molding compounds, and any chips disposed adjacent thereto. Therefore, current package, PCB, spacer, and carrier structures necessitate larger solder bumps with greater spacing to mitigate the effect of any warpage caused by CTE mismatch. Accordingly, conventional semiconductor package, PCB, spacer, and carrier frames are characterized by low through-structure electrical bandwidths, resulting in decreased overall power efficiency. The methods and apparatus disclosed herein provide semiconductor core structures that overcome many of the disadvantages associated with conventional semiconductor package, PCB, spacer, and carrier structures described above.

Figure 1A:
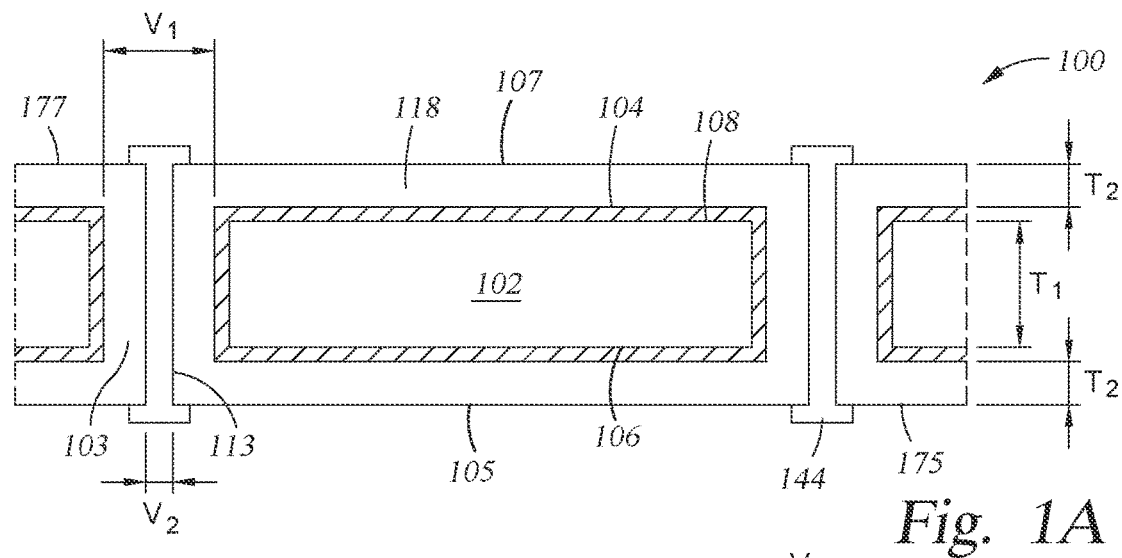
FIG. 1A schematically illustrates a cross-sectional view of a semiconductor core assembly, according to embodiments described herein.
Figure 1B:
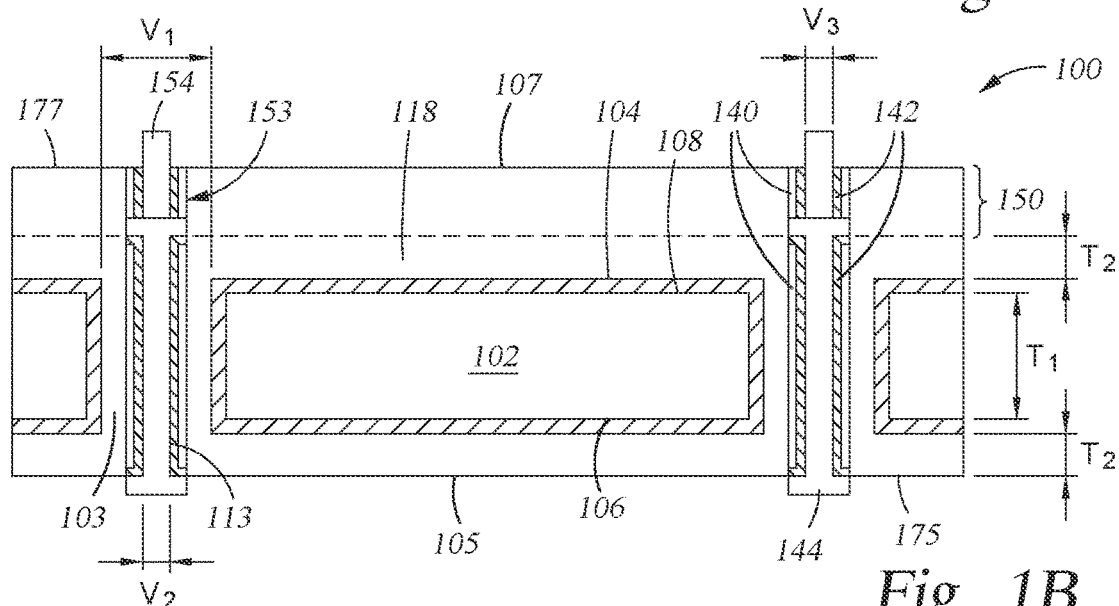
FIG. 1B schematically illustrates a cross-sectional view of a semiconductor core assembly, according to embodiments described herein.
Figure 1C:
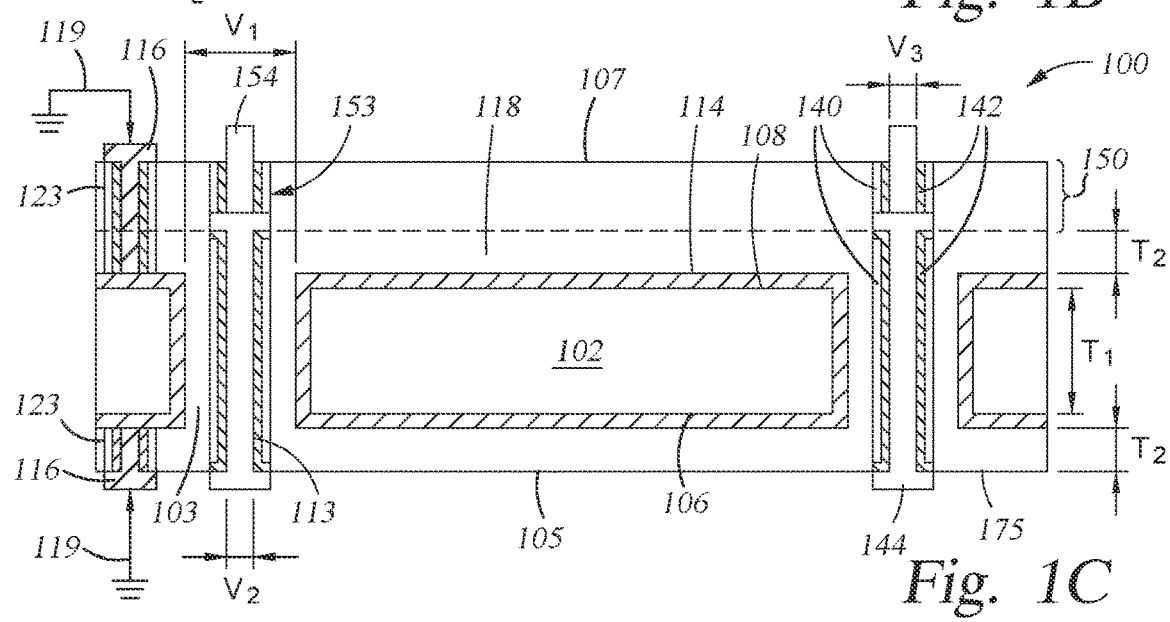
FIG. 1C schematically illustrates a cross-sectional view of a semiconductor core assembly, according to embodiments described herein.

FIGS. 1A-1C illustrate cross-sectional views of a thin-form-factor semiconductor core assembly 100 according to some embodiments. The semiconductor core assembly 100 may be utilized for structural support and electrical interconnection of semiconductor packages mounted thereon. In further examples, the semiconductor core assembly 100 may be utilized as a carrier structure for a surface-mounted device, such as a chip or graphics card. The semiconductor core assembly 100 generally includes a core structure 102, an optional passivating layer 104 (shown in FIGS. 1A and 1B) or metal cladding layer 114 (shown in FIG. 1C), and an insulating layer 118.

In one embodiment, the core structure 102 includes a patterned (e.g., structured) substrate formed of any suitable substrate material. For example, the core structure 102 includes a substrate formed from a III-V compound semiconductor material, silicon (e.g., having a resistivity between about 1 and about 10 Ohm-com or conductivity of about 100 W/mK), crystalline silicon (e.g., Si<100> or Si<111>), silicon oxide, silicon germanium, doped or undoped silicon, undoped high resistivity silicon (e.g., float zone silicon having lower dissolved oxygen content and a resistivity between about 5000 and about 10000 ohm-cm), doped or undoped polysilicon, silicon nitride, silicon carbide (e.g., having a conductivity of about 500 W/mK), quartz, glass (e.g., borosilicate glass), sapphire, alumina, and/or ceramic materials. In one embodiment, the core structure 102 includes a monocrystalline p-type or n-type silicon substrate. In one embodiment, the core structure 102 includes a polycrystalline p-type or n-type silicon substrate.

In another embodiment, the core structure 102 includes a p-type or an n-type silicon solar substrate. Generally the substrate utilized to form the core structure 102 may have a polygonal or circular shape. For example, the core structure 102 may include a substantially square silicon substrate having lateral dimensions between about 120 mm and about 180 mm, such as about 150 mm or between about 156 mm and about 166 mm, with or without chamfered edges. In another example, the core structure 102 may include a circular silicon-containing wafer having a diameter between about 20 mm and about 700 mm, such as between about 100 mm and about 500 mm, for example about 200 mm or about 300 mm.

The core structure 102 has a thickness $T_1$ between about 50 μm and about 1500 μm, such as a thickness $T_1$ between about 90 μm and about 780 μm. For example, the core structure 102 has a thickness $T_1$ between about 100 μm and about 300 μm, such as a thickness $T_1$ between about 110 μm and about 200 μm. In another example, the core structure 102 has a thickness $T_1$ between about 70 μm and about 150 μm, such as a thickness $T_1$ between about 100 μm and about 130 μm. In another example, the core structure 102 has a thickness $T_1$ between about 700 μm and about 800 μm, such as a thickness $T_1$ between about 725 μm and about 775 μm.

The core structure 102 further includes one or more holes or core vias 103 (hereinafter referred to as "core vias") formed therein to enable conductive electrical interconnections to be routed through the core structure 102. Generally, the one or more core vias 103 are substantially cylindrical in shape. However, other suitable morphologies for the core vias 103 are also contemplated. The core vias 103 may be formed as singular and isolated core vias 103 through the core structure 102 or in one or more groupings or arrays. In one embodiment, a minimum pitch $P_1$ between each core via 103 is less than about 1000 μm, such as between about 25 μm and about 200 μm. For example, the pitch $P_1$ is between about 40 μm and about 150 μm, such as between about 100 μm and about 140 μm, such as about 120 μm. In one embodiment, the one or more core vias 103 have a diameter $V_1$ less than about 500 μm, such as a diameter $V_1$ less than about 250 μm. For example, the core vias 103 have a diameter $V_1$ between about 25 μm and about 100 μm, such as a diameter $V_1$ between about 30 μm and about 60 μm. In one embodiment, the core vias 103 have a diameter $V_1$ of about 40 μm.

The optional passivating layer 104 of FIGS. 1A and 1B may be formed on one or more surfaces of the core structure 102, including a first surface 106, a second surface 108, and one or more sidewalls of the core vias 103. In one embodiment, the passivating layer 104 is formed on substantially all exterior surfaces of the core structure 102 such that the passivating layer 104 substantially surrounds the core structure 102. Thus, the passivating layer 104 provides a protective outer barrier for the core structure 102 against corrosion and other forms of damage. In one embodiment, the passivating layer 104 is formed of an oxide film or layer, such as a thermal oxide layer. In some examples, the passivating layer 104 has a thickness between about 100 nm and about 3 μm, such as a thickness between about 200 nm and about 2.5 μm. In one example, the passivating layer 104 has a thickness between about 300 nm and about 2 μm, such as a thickness of about 1.5 μm.

In the embodiments shown in FIG. 1C, the core structure 102 includes the metal cladding layer 114 in place of the passivating layer 104 and formed on one or more surfaces thereof, including the first surface 106, the second surface 108, and the one or more sidewalls of the core vias 103. In one embodiment, the metal cladding layer 114 is formed on substantially all exterior surfaces of the core structure 102 such that the metal cladding layer 114 substantially surrounds the core structure 102. The metal cladding layer 114 acts as a reference layer (e.g., grounding layer or a voltage supply layer) and is disposed on the substrate 302 to protect subsequently formed connections from electromagnetic interference and shield semiconductor signals from the semiconductor material (Si) that is used to form the core structure 102. In one embodiment, the metal cladding layer 114 includes a conductive metal layer that includes nickel, aluminum, gold, cobalt, silver, palladium, tin, or the like. In one embodiment, the metal cladding layer 114 includes a metal layer that includes an alloy or pure metal that includes nickel, aluminum, gold, cobalt, silver, palladium, tin, or the like. The metal cladding layer 114 generally has thickness between about 50 nm and about 10 μm such as between about 100 nm and about 5 μm.

The insulating layer 118 is formed on one or more surfaces of the core structure 102, the passivating layer 104, or the metal cladding layer 114 and may substantially encase the passivating layer 104, the metal cladding layer 114, and/or the core structure 102. Thus, the insulating layer 118 may extend into the core vias 103 and coat the passivating layer 104 or the metal cladding layer 114 formed on the sidewalls thereof or directly coat the core structure 102, thus defining the diameter $V_2$ as depicted in FIG. 1A. In one embodiment, the insulating layer 118 has a thickness $T_2$ from an outer surface of the core structure 102, the passivating layer 104, or the metal cladding layer 114 to an adjacent outer surface of the insulating layer 118 (e.g., major surfaces 105, 107) that is less than about 50 μm, such as a thickness $T_2$ less than about 20 μm. For example, the insulating layer 118 has thickness $T_2$ between about 5 μm and about 10 μm.

In one embodiment, the insulating layer 118 is formed of polymer-based dielectric materials. For example, the insulating layer 118 is formed from a flowable build-up material. Accordingly, although hereinafter referred to as an "insulating layer," the insulating layer 118 may also be described as a dielectric layer. In a further embodiment, the insulating layer 118 is formed of an epoxy resin material having a ceramic filler, such as silica ($SiO_2$) particles. Other examples of ceramic fillers that may be utilized to form the insulating layer 118 include aluminum nitride (AlN), aluminum oxide ($Al_2O_3$), silicon carbide (SiC), silicon nitride ($Si_3N_4$), $Sr_2Ce_2Ti_5O_{16}$, zirconium silicate ($ZrSiO_4$), wollastonite ($CaSiO_3$), beryllium oxide (BeO), cerium dioxide ($CeO_2$), boron nitride (BN), calcium copper titanium oxide ($CaCu_3Ti_4O_{12}$), magnesium oxide (MgO), titanium dioxide ($TiO_2$), zinc oxide (ZnO) and the like. In some examples, the ceramic fillers utilized to form the insulating layer 118 have particles ranging in size between about 40 nm and about 1.5 μm, such as between about 80 nm and about 1 μm. For example, the ceramic fillers have particles ranging in size between about 200 nm and about 800 nm, such as between about 300 nm and about 600 nm. In some embodiments, the ceramic fillers include particles having a size less than about 10% of the width or diameter of adjacent core vias 103 in the core structure 102, such as a size less than about 5% of the width or diameter of the core vias 103.

One or more through-assembly holes or vias 113 (hereinafter referred to as "through-assembly vias") are formed through the insulating layer 118 where the insulating layer 118 extends into the core vias 103. For example, the through-assembly vias 113 may be centrally formed within the core vias 103 having the insulating layer 118 disposed therein. Accordingly, the insulating layer 118 forms one or more sidewalls of the through-assembly vias 113, wherein the through-assembly vias 113 have a diameter $V_2$ lesser than the diameter $V_1$ of the core vias 103. In one embodiment, the through-assembly vias 113 have a diameter $V_2$ less than about 100 μm, such as less than about 75 μm. For example, the through-assembly vias 113 have a diameter $V_2$ less than about 50 μm, such as less than about 35 μm. In one embodiment, the through-assembly vias 113 have a diameter of between about 25 μm and about 50 μm, such as a diameter of between about 35 μm and about 40 μm.

The through-assembly vias 113 provide channels through which one or more electrical interconnections 144 are formed in the semiconductor core assembly 100. In one embodiment, the electrical interconnections 144 are formed through the entire thickness of the semiconductor core assembly 100 (i.e. from a first major surface 105 to a second major surface 107 of the semiconductor core assembly 100). For example, the electrical interconnections 144 may have a longitudinal length corresponding to a total thickness of the semiconductor core assembly 100 between about 50 μm and about 1000 μm, such as a longitudinal length between about 200 μm and about 800 μm. In one example, the electrical interconnections 144 have a longitudinal length of between about 400 μm and about 600 μm, such as longitudinal length of about 500 μm. In another embodiment, the electrical interconnections 144 are only formed through a portion of the thickness of the semiconductor core assembly 100. In further embodiments, the electrical interconnections 144 may protrude from a major surface of the semiconductor core assembly 100, such as the major surfaces 105, 107 as depicted in FIG. 1A. The electrical interconnections 144 may be formed of any conductive materials used in the field of integrated circuits, circuit boards, chip carriers, and the like. For example, the electrical interconnections 144 are formed of a metallic material, such as copper, aluminum, gold, nickel, silver, palladium, tin, or the like.

In the embodiment depicted in FIG. 1A, the electrical interconnections 144 have a lateral thickness equal to the diameter $V_2$ of the through-assembly vias 113 in which they are formed. In another embodiment, such as depicted in FIG. 1B, the semiconductor core assembly 100 further includes an adhesion layer 140 and/or a seed layer 142 formed thereon for electrical isolation of the electrical interconnections 144. In one embodiment, the adhesion layer 140 is formed on surfaces of the insulating layer 118 adjacent to the electrical interconnections 144, including the sidewalls of the through-assembly vias 113. Thus, as depicted in FIG. 1B, the electrical interconnections 144 have a lateral thickness less than the diameter $V_2$ of the through-assembly vias 113 in which they are formed. In yet another embodiment, the electrical interconnections 144 only cover the surfaces of the sidewalls of the through-assembly vias 113, and thus may have a hollow core therethrough.

The adhesion layer 140 may be formed of any suitable materials, including but not limited to titanium, titanium nitride, tantalum, tantalum nitride, manganese, manganese oxide, molybdenum, cobalt oxide, cobalt nitride, and the like. In one embodiment, the adhesion layer 140 has a thickness $B_1$ between about 10 nm and about 300 nm, such as between about 50 nm and about 150 nm. For example, the adhesion layer 140 has a thickness $B_1$ between about 75 nm and about 125 nm, such as about 100 nm.

The optional seed layer 142 comprises a conductive material, including but not limited to copper, tungsten, aluminum, silver, gold, or any other suitable materials or combinations thereof. The seed layer 142 may be formed on the adhesion layer 140 or directly on the sidewalls of the through-assembly vias 113 (e.g., on the insulating layer 118 without an adhesion layer therebetween). In one embodiment, the seed layer 142 has a thickness between about 50 nm and about 500 nm, such as between about 100 nm and about 300 nm. For example, the seed layer 142 has a thickness between about 150 nm and about 250 nm, such as about 200 nm.

In some embodiments, such as depicted in FIG. 1B, the semiconductor core assembly 100 further includes one or more redistribution layers 150 formed on a first side 175 and/or a second side 177 of the semiconductor core assembly 100 (the redistribution layer 150 is depicted as being formed on the second side 177 in FIG. 1B). In one embodiment, the redistribution layer 150 is formed of substantially the same materials as the insulating layer 118 (e.g., polymer-based dielectric materials), and thus forms an extension thereof. In other embodiments, the redistribution layer 150 is formed of a different material than the insulating layer 118. For example, the redistribution layer 150 may be formed of a photodefinable polyimide material, a non-photosensitive polyimide, polybenzoxazole (PBO), benzocyclobutene (BCB), silicon dioxide, and/or silicon nitride. In another example, the redistribution layer 150 is formed from a different inorganic dielectric material than the insulating layer 118. In one embodiment, the redistribution layer 150 has a thickness between about 5 µm and about 50 µm, such as a thickness between about 10 µm and about 40 µm. For example, the redistribution layer 150 has a thickness between about 20 µm and about 30 µm, such as about 25 µm.

The redistribution layer 150 may include one or more redistribution connections 154 formed through redistribution vias 153 for relocating contact points of the electrical interconnections 144 to desired locations on the surfaces of the semiconductor core assembly 100, such as the major surfaces 105, 107. In some embodiments, the redistribution layer 150 may further include one or more external electrical connections (not shown) formed on the major surfaces 105, 107, such as a ball grid array or solder balls. Generally, the redistribution vias 153 and the redistribution connections 154 have substantially similar or smaller lateral dimensions relative to the through-assembly vias 113 and the electrical interconnections 144, respectively. For example, the redistribution vias 153 have a diameter $V_3$ between about 2 µm and about 50 µm, such as a diameter $V_3$ between about 10 µm and about 40 µm, such as a diameter $V_3$ between about 20 µm and about 30 µm. Furthermore, the redistribution layer 150 may include the adhesion layer 140 and the seed layer 142 formed on surfaces adjacent to the redistribution connections 154, including sidewalls of the redistribution vias 153.

In embodiments where the core structure 102 includes the metal cladding layer 114, such as in FIG. 1C, the metal cladding layer 114 is further coupled to at least one cladding connection 116 forming a connection point on at least one side of the semiconductor core assembly 100. In certain embodiments, the metal cladding layer 114 is coupled to two cladding connections 116 formed on opposing sides of the semiconductor core assembly 100. The cladding connections 116 may be connected to a common ground, such as exemplary ground 119, used by one or more the semiconductor devices stacked with (e.g., above or below) the semiconductor core assembly 100. Alternatively, the cladding connections 116 are connected to a reference voltage, such as a power voltage. As depicted, the cladding connections 116 are formed in the insulating layer 118 and connect the metal cladding layer 114 to connection ends of the cladding connections 116 that are disposed on or at the surface of the semiconductor core assembly 100, such as major surfaces 107 and 105, so that the metal cladding layer 114 can be connected to an external common ground or reference voltage (shown in FIG. 1C as an exemplary connection to ground 119).

The metal cladding layer 114 may be electrically coupled to external ground 119 via the cladding connections 116 and any other suitable coupling means. For example, the cladding connections 116 may be indirectly coupled to external ground 119 by solder bumps on opposing sides of the semiconductor core assembly 100. In certain embodiments, the cladding connections 116 may be first routed through a separate electronic system or device before coupling to the external ground 119. The utilization of a grounding pathway between the metal cladding layer 114 and the external ground 119 reduces or eliminates interference between interconnections 144 and/or redistribution connections 154 and prevents shorting of integrated circuits coupled thereto, which may damage the semiconductor core assembly 100 and any systems or devices integrated or stacked therewith.

Similar to the electrical interconnections 144 and redistribution connections 154, the cladding connections 116 are formed of any suitable conductive material, including but not limited to nickel, copper, aluminum, gold, cobalt, silver, palladium, tin, or the like. The cladding connections 116 are deposited or plated through cladding vias 123 that are substantially similar to the through-assembly vias 113 or redistribution vias 153 but only traverse a portion of the semiconductor core assembly 100 (e.g., from a surface thereof to the core structure 102. Accordingly, the cladding vias 123 may be formed through the insulating layer 118 directly above or below the core structure 102 having the metal cladding layer 114 formed thereon. Furthermore, like the electrical interconnections 144 and redistribution connections 154, the cladding connections 116 may completely fill the cladding vias 123 or line the inner circumferential walls thereof, thus having a hollow core.

In certain embodiments, the cladding vias 123 and the cladding connections 116 have lateral dimensions (e.g., a diameter and lateral thickness, respectively) substantially similar to the diameter $V_2$. In certain embodiments, the adhesion layer 140 and seed layer 142 are formed in the cladding vias 123, and so the cladding vias 123 may have a diameter substantially similar to the diameter $V_2$ and the cladding connections 116 may have a lateral thickness less than the diameter $V_2$, such as a lateral thickness substantially similar to the diameter $V_3$. In certain embodiments, the cladding vias 123 have a diameter about 5 µm.

Figure 2:
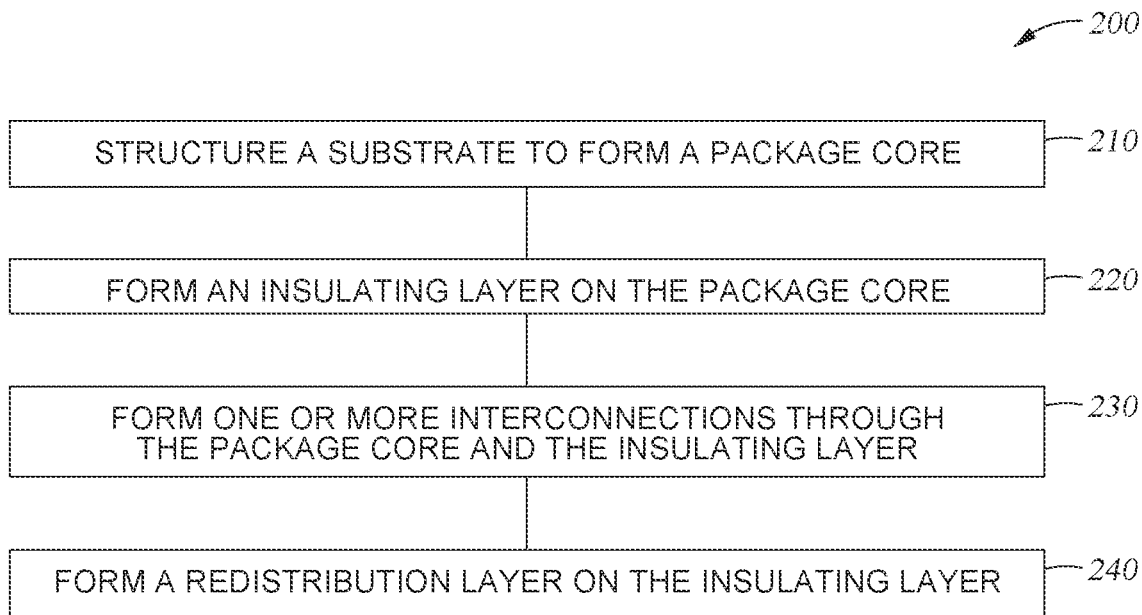
FIG. 2 is a flow diagram that illustrates a process for forming the semiconductor core assemblies of FIGS. 1A and 1B, according to embodiments described herein.

FIG. 2 illustrates a flow diagram of a representative method 200 of forming a semiconductor core assembly. The method 200 has multiple operations 210, 220, 230, and 240. Each operation is described in greater detail with reference to FIGS. 3-12L. The method may include one or more additional operations which are carried out before any of the defined operations, between two of the define operations, or after all the defined operations (except where the context excludes the possibility).

In general, the method 200 includes structuring a substrate to be utilized as a core structure (e.g., frame) at operation 210, further described in greater detail with reference to FIGS. 3 and 4A-4D. At operation 220, an insulating layer is formed on the core structure 102, further described in greater detail with reference to FIGS. 5, 6A-6I, 7, and 8A-8E. At operation 230, one or more interconnections are formed through the core structure 102 and the insulating layer, further described in greater detail with reference to FIGS. 9 and 10A-10H. At operation 240, a redistribution layer is formed on the insulating layer to relocate contact points of the interconnections to desired locations on a surface of an assembled core assembly and the core assembly is thereafter singulated. In some embodiments, one or more additional redistribution layers may be formed in addition to the first redistribution layer, described in greater detail with reference to FIGS. 11 and 12A-12L.

Figure 3:
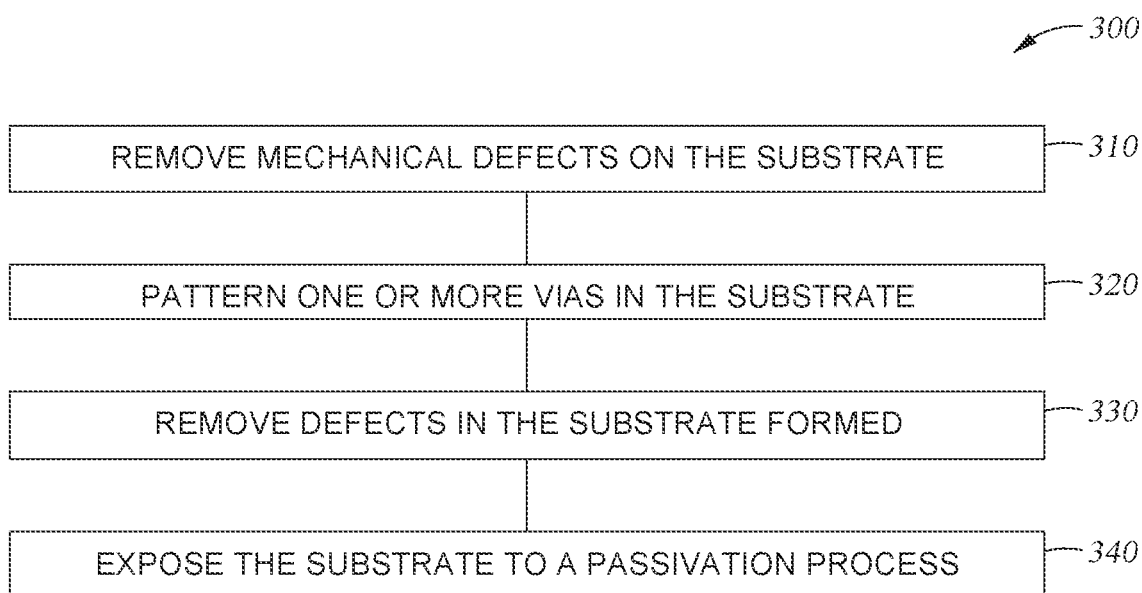
FIG. 3 is a flow diagram that illustrates of a process for structuring a substrate for a semiconductor core assembly, according to embodiments described herein.

FIG. 3 illustrates a flow diagram of a representative method 300 for structuring a substrate 400 to be utilized as a core structure. FIGS. 4A-4D schematically illustrate cross-sectional views of a substrate 400 at various stages of the substrate structuring process 300 represented in FIG. 3. Therefore, FIG. 3 and FIGS. 4A-4D are herein described together for clarity.

Figure 4A:
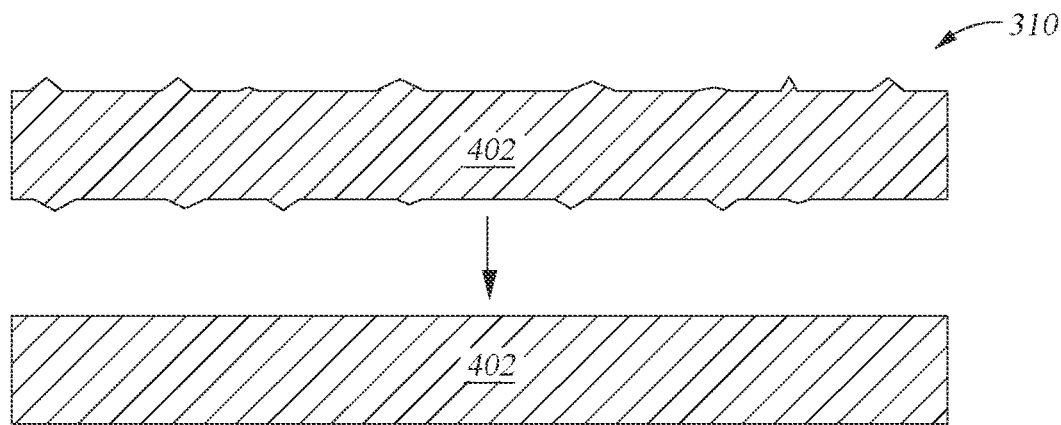
FIGS. 4A-4D schematically illustrate cross-sectional views of a substrate at different stages of the process depicted in FIG. 3, according to embodiments described herein.

The method 300 begins at operation 310 and corresponding FIG. 4A. As described with reference to the core structure 102 above, the substrate 400 is formed of any suitable substrate material including but not limited to a III-V compound semiconductor material, silicon, crystalline silicon (e.g., Si<100> or Si<111>), silicon oxide, silicon germanium, doped or undoped silicon, undoped high resistivity silicon, doped or undoped polysilicon, silicon nitride, silicon carbide, quartz, glass material (e.g., borosilicate glass), sapphire, alumina, and/or ceramic material. In one embodiment, the substrate 400 is a monocrystalline p-type or n-type silicon substrate. In one embodiment, the substrate 400 is a multicrystalline p-type or n-type silicon substrate. In another embodiment, the substrate 400 is a p-type or an n-type silicon solar substrate. The substrate 400 may further have a polygonal or circular shape. For example, the substrate 400 may include a substantially square silicon substrate having lateral dimensions between about 120 mm and about 180 mm, with or without chamfered edges. In another example, the substrate 400 may include a circular silicon containing wafer having a diameter between about 20 mm and about 700 mm, such as between about 100 mm and about 500 mm, for example about 200 mm or about 300 mm. Unless otherwise noted, embodiments and examples described herein are conducted on substrates having a thickness between about 50 µm and about 1500 µm, such as a thickness between about 90 µm and about 780 µm. For example, the substrate 400 has a thickness between about 100 µm and about 300 µm, such as a thickness between about 110 µm and about 200 µm.

Prior to operation 310, the substrate 400 may be sliced and separated from a bulk material by wire sawing, scribing and breaking, mechanical abrasive sawing, or laser cutting. Slicing typically causes mechanical defects or deformities in substrate surfaces formed therefrom, such as scratches, micro-cracking, chipping, and other mechanical defects. Thus, the substrate 400 is exposed to a first damage removal process at operation 310 to smoothen and planarize surfaces thereof and remove mechanical defects in preparation for later structuring operations. In some embodiments, the substrate 400 may further be thinned by adjusting the process parameters of the first damage process. For example, a thickness of the substrate 400 may be decreased with increased exposure to the first damage removal process.

The first damage removal process at operation 310 includes exposing the substrate 400 to a substrate polishing process and/or an etch process followed by rinsing and drying processes. In some embodiments, operation 310 includes a chemical mechanical polishing (CMP) process. In one embodiment, the etch process is a wet etch process including a buffered etch process that is selective for the removal of a desired material (e.g., contaminants and other undesirable compounds). In other embodiments, the etch process is a wet etch process utilizing an isotropic aqueous etch process. Any suitable wet etchant or combination of wet etchants may be used for the wet etch process. In one embodiment, the substrate 400 is immersed in an aqueous HF etching solution for etching. In another embodiment, the substrate 400 is immersed in an aqueous KOH etching solution for etching.

In some embodiments, the etching solution is heated to a temperature between about 30° C. and about 100° C. during the etch process, such as between about 40° C. and 90° C. For example, the etching solution is heated to a temperature of about 70° C. In still other embodiments, the etch process at operation 310 is a dry etch process. An example of a dry etch process includes a plasma-based dry etch process. The thickness of the substrate 400 is modulated by controlling the time of exposure of the substrate 400 to the etchants (e.g., etching solution) utilized during the etch process. For example, a final thickness of the substrate 400 is reduced with increased exposure to the etchants. Alternatively, the substrate 400 may have a greater final thickness with decreased exposure to the etchants.

Figure 4B:
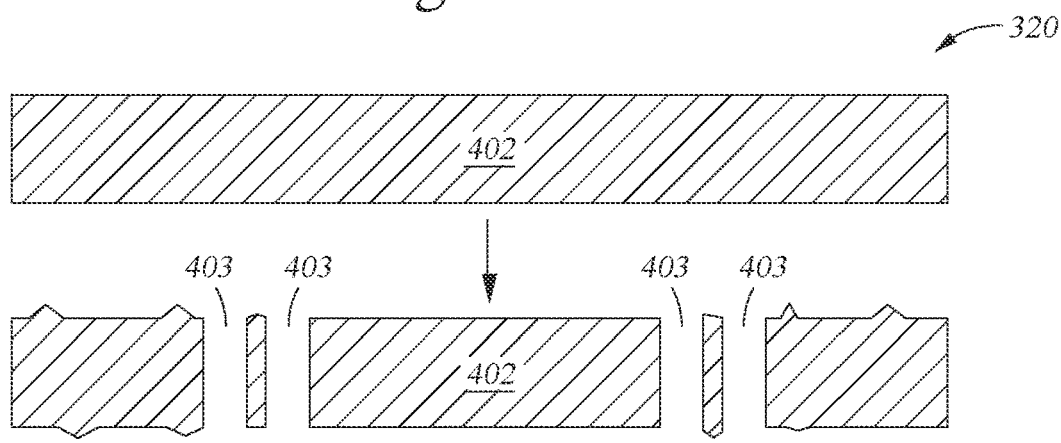
Figure 4C:
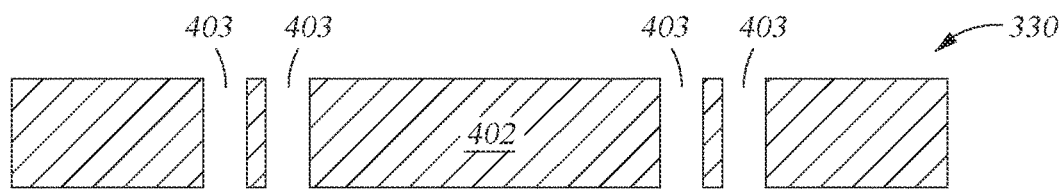

At operation 320, the now planarized and substantially defect-free substrate 400 is patterned to form one or more core vias 403 therein (four core vias 403 are depicted in the cross-section of substrate 400 in FIG. 4B). The core vias 403 are utilized to form direct-contact electrical interconnections through the substrate 400.

Generally, the one or more core vias 403 may be formed by laser ablation (e.g. direct laser patterning). Any suitable laser ablation system may be utilized to form the one or more core vias 403. In some examples, the laser ablation system utilizes an infrared (IR) laser source. In some examples, the laser source is a picosecond ultraviolet (UV) laser. In other examples, the laser is a femtosecond UV laser. In still other examples, the laser source is a femtosecond green laser. The laser source of the laser ablation system generates a continuous or pulsed laser beam for patterning of the substrate 400. For example, the laser source may generate a pulsed laser beam having a frequency between 5 kHz and 500 kHz, such as between 10 kHz and about 200 kHz. In one example, the laser source is configured to deliver a pulsed laser beam at a wavelength between about 200 nm and about 1200 nm and a pulse duration between about 10 ns and about 5000 ns with an output power between about 10 Watts and about 100 Watts. The laser source is configured to form any desired pattern of features in the substrate 400, including the core vias 403.

In some embodiments, the substrate 400 is optionally coupled to a carrier plate (not shown) before being patterned. The optional carrier plate may provide mechanical support for the substrate 400 during patterning thereof and may prevent the substrate 400 from breaking. The carrier plate may be formed of any suitable chemically- and thermally-stable rigid material including but not limited to glass, ceramic, metal, or the like. In some examples, the carrier plate has a thickness between about 1 mm and about 10 mm, such as between about 2 mm and about 5 mm. In one embodiment, the carrier plate has a textured surface. In other embodiments, the carrier plate has a polished or smoothened surface. The substrate 400 may be coupled to the carrier plate utilizing any suitable temporary bonding material, including but not limited to wax, glue, or similar bonding material.

In some embodiments, patterning the substrate 400 may cause unwanted mechanical defects in the surfaces of the substrate 400, including chipping, cracking, and/or warping.

Thus, after performing operation 320 to form the core vias 403 in the substrate 400, the substrate 400 is exposed to a second damage removal and cleaning process at operation 330 substantially similar to the first damage removal process at operation 310 to smoothen the surfaces of the substrate 400 and remove unwanted debris. As described above, the second damage removal process includes exposing the substrate 400 to a wet or dry etch process, followed by rinsing and drying thereof. The etch process proceeds for a predetermined duration to smoothen the surfaces of the substrate 400, and particularly the surfaces exposed to laser patterning operations. In another aspect, the etch process is utilized to remove any undesired debris remaining on the substrate 400 from the patterning process.

Figure 4D:
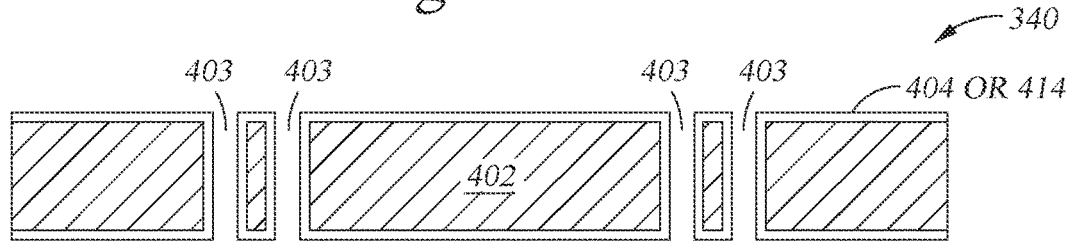

After removal of mechanical defects in the substrate 400 at operation 330, the substrate 400 is exposed to a passivation or metallization process at operation 340 and FIG. 4D to grow or deposit a passivating layer, such as oxide layer 404, or a metal layer, such as metal cladding layer 414, on desired surfaces thereof (e.g., all surfaces of the substrate 400). In one embodiment, the passivation process is a thermal oxidation process. The thermal oxidation process is performed at a temperature between about 800° C. and about 1200° C., such as between about 850° C. and about 1150° C. For example, the thermal oxidation process is performed at a temperature between about 900° C. and about 1100° C., such as a temperature between about 950° C. and about 1050° C. In one embodiment, the thermal oxidation process is a wet oxidation process utilizing water vapor as an oxidant. In one embodiment, the thermal oxidation process is a dry oxidation process utilizing molecular oxygen as the oxidant. It is contemplated that the substrate 400 may be exposed to any suitable passivation process at operation 340 to form the oxide layer 404 or any other suitable passivating layer thereon. The resulting oxide layer 404 generally has a thickness between about 100 nm and about 3 μm, such as between about 200 nm and about 2.5 μm. For example, the oxide layer 404 has a thickness between about 300 nm and about 2 μm, such as about 1.5 μm. Alternatively, the metallization process may be any suitable metal deposition process, including an electroless deposition process, an electroplating process, a chemical vapor deposition process, an evaporation deposition process, and/or an atomic layer deposition process. In certain embodiments, at least a portion of the metal cladding layer 414 includes a deposited nickel (Ni) layer formed by direct displacement or displacement plating on the surfaces of the substrate 400 (e.g., n-Si substrate or p-Si substrate). For example, the substrate 400 is exposed to a nickel displacement plating bath having a composition including 0.5 M $NiSO_4$ and $NH_4OH$ at a temperature between about 60° C. and about 95° C. and a pH of about 11, for a period of between about 2 and about 4 minutes. The exposure of the silicon substrate 400 to a nickel ion-loaded aqueous electrolyte in the absence of reducing agent causes a localized oxidation/reduction reaction at the surface of the substrate 400, thus leading to plating of metallic nickel thereon. Accordingly, nickel displacement plating enables selective formation of thin and pure nickel layers on the silicon material of substrate 400 utilizing stable solutions. Furthermore, the process is self-limiting and thus, once all surfaces of the substrate 400 are plated (e.g., there is no remaining silicon upon which nickel can form), the reaction stops. In certain embodiments, the nickel metal cladding layer 414 may be utilized as a seed layer for plating of additional metal layers, such as for plating of nickel or copper by electroless and/or electrolytic plating methods. In further embodiments, the substrate 400 is exposed to an SC-1 pre-cleaning solution and a HF oxide etching solution prior to a nickel displacement plating bath to promote adhesion of the nickel metal cladding layer 414 thereto.

Figure 5:
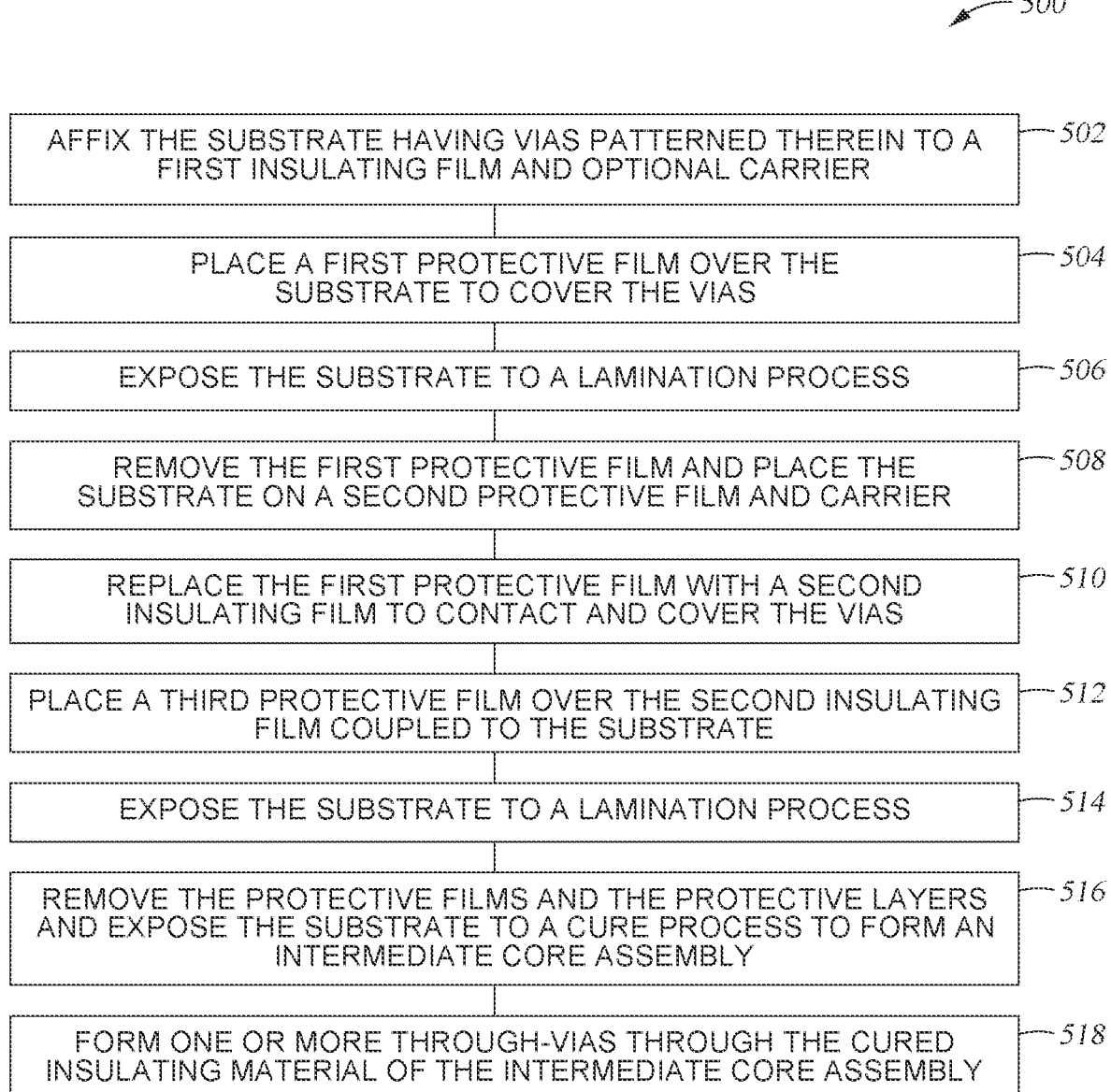
FIG. 5 is a flow diagram that illustrates a process for forming an insulating layer on a core structure for a semiconductor core assembly, according to embodiments described herein.

Upon passivation or metallization, the substrate 400 is ready to be utilized as a core structure 402 for the formation of a core assembly, such as the semiconductor core assembly 100. FIGS. 5 and 7 illustrate flow diagrams of representative methods 500 and 700, respectively, for forming an insulating layer 618 on the core structure 402. FIGS. 6A-6I schematically illustrate cross-sectional views of the core structure 402 at different stages of the method 500 depicted in FIG. 5, and FIGS. 8A-8E schematically illustrate cross-sectional views of the core structure 402 at different stages of the method 700 depicted in FIG. 7. For clarity, FIG. 5 and FIGS. 6A-6I are herein described together and FIG. 7 and FIGS. 8A-8E are herein described together.

Figure 6A:
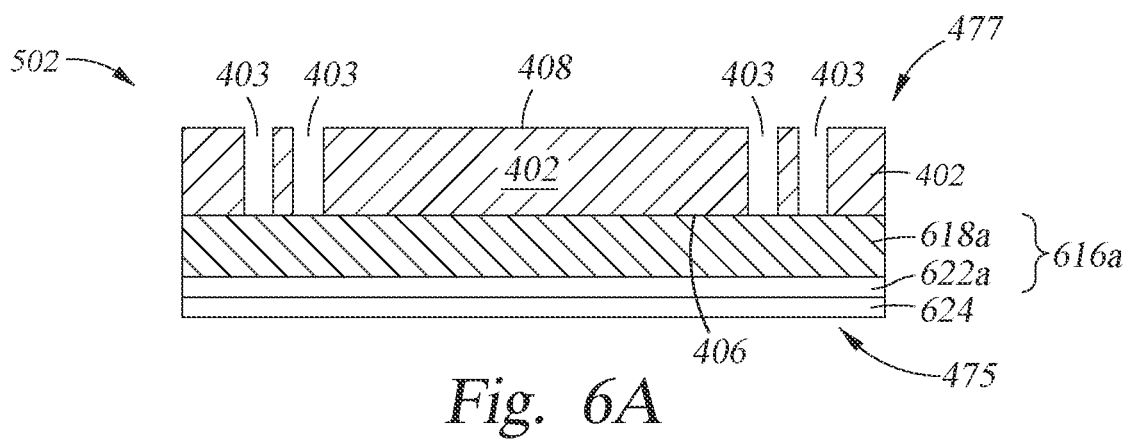
FIGS. 6A-6I schematically illustrate cross-sectional views of a core structure at different stages of the process depicted in FIG. 5, according to embodiments described herein.
Figure 7:
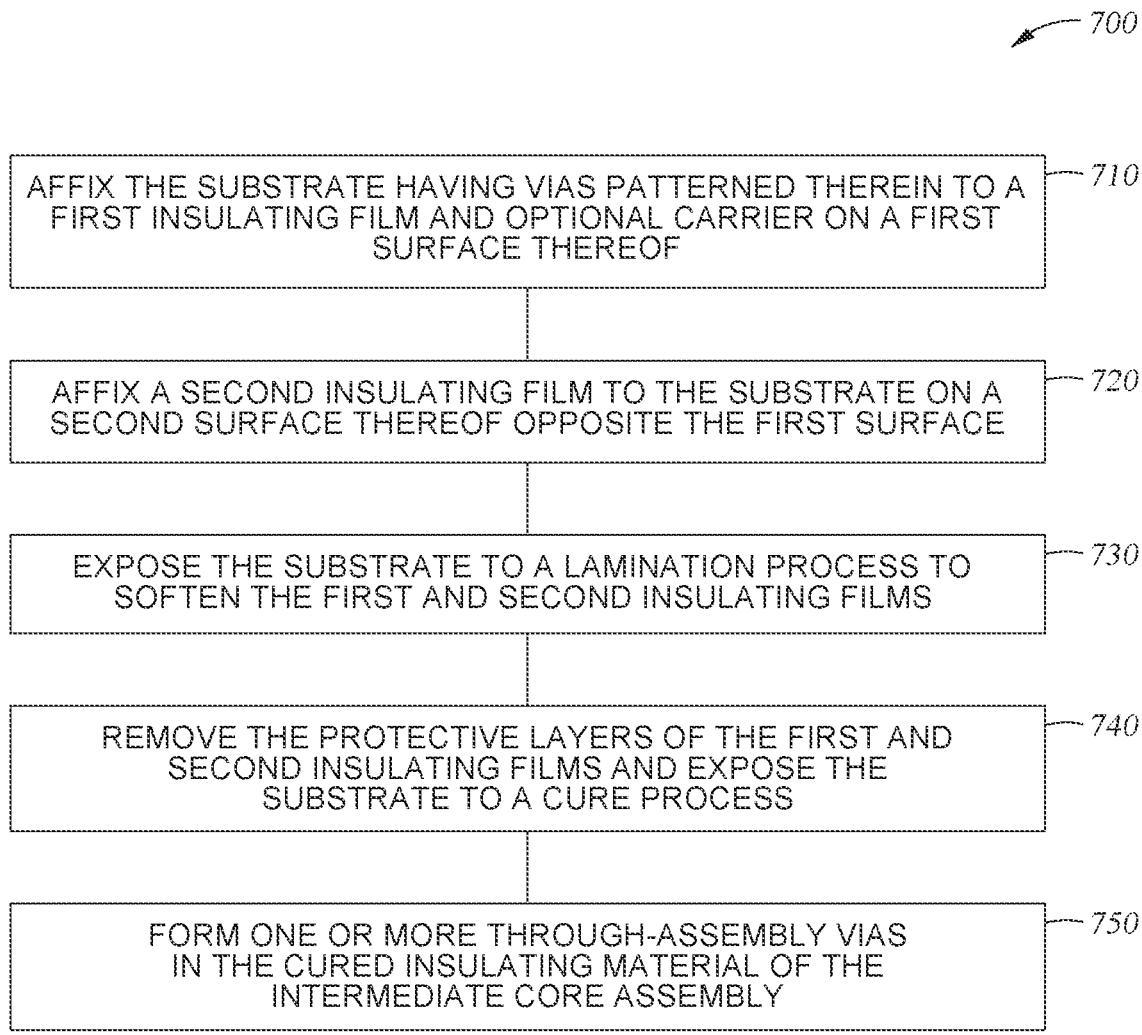
FIG. 7 is a flow diagram that illustrates a process for forming an insulating layer on a core structure for a semiconductor core assembly, according to embodiments described herein.

Generally, the method 500 begins at operation 502 and FIG. 6A wherein a first surface 406 of the core structure 402 at a first side 475, now having the core vias 403 formed therein and the oxide layer 404 formed thereon, is placed on and affixed to a first insulating film 616a. In one embodiment, the first insulating film 616a includes one or more layers formed of polymer-based dielectric materials. For example, the first insulating film 616a includes one or more layers formed of flowable build-up materials. In one embodiment, the first insulating film 616a includes a flowable epoxy resin layer 618a. Generally, the epoxy resin layer 618a has a thickness less than about 60 μm, such as between about 5 μm and about 50 μm. For example, the epoxy resin layer 618a has a thickness between about 10 μm and about 25 μm.

The epoxy resin layer 618a may be formed of a ceramic-filler-containing epoxy resin, such as an epoxy resin filled with (e.g., containing) silica ($SiO_2$) particles. Other examples of ceramic fillers that may be used to form the epoxy resin layer 618a and other layers of the insulating film 616a include aluminum nitride (AlN), aluminum oxide ($Al_2O_3$), silicon carbide (SiC), silicon nitride ($Si_3N_4$), $Sr_2Ce_2Ti_5O_{16}$, zirconium silicate ($ZrSiO_4$), wollastonite ($CaSiO_3$), beryllium oxide (BeO), cerium dioxide ($CeO_2$), boron nitride (BN), calcium copper titanium oxide ($CaCu_3Ti_4O_{12}$), magnesium oxide (MgO), titanium dioxide ($TiO_2$), zinc oxide (ZnO) and the like. In some examples, the ceramic fillers utilized to form the epoxy resin layer 618a have particles ranging in size between about 40 nm and about 1.5 μm, such as between about 80 nm and about 1 μm. For example, the ceramic fillers utilized to form the epoxy resin layer 618a have particles ranging in size between about 200 nm and about 800 nm, such as between about 300 nm and about 600 nm.

In some embodiments, the first insulating film 616a further includes one or more protective layers. For example, the first insulating film 616a includes a polyethylene terephthalate (PET) protective layer 622a, such as a biaxial PET protective layer 622a. However, any suitable number and combination of layers and materials is contemplated for the first insulating film 616a. In some embodiments, the entire insulating film 616a has a thickness less than about 120 μm, such as a thickness less than about 90 μm.

In some embodiments, after affixing the core structure 402 to the first insulating film 616a, the core structure 402 may then be placed on a carrier 624 adjacent the first side 475 thereof for additional mechanical stabilization during later processing operations. Generally, the carrier 624 is formed of any suitable mechanically and thermally stable material capable of withstanding temperatures above 100° C. For example, in one embodiment the carrier 624 comprises polytetrafluoroethylene (PTFE). In another example, the carrier 624 is formed of polyethylene terephthalate (PET).

Figure 6B:
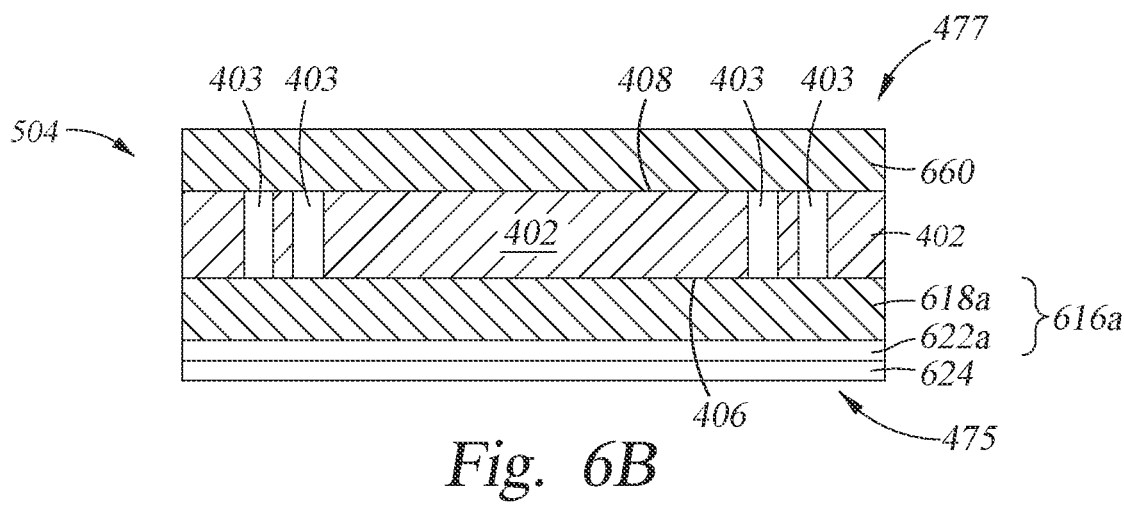

At operation 504 and FIG. 6B, a first protective film 660 is affixed to a second surface 408 on a second side 477 of the core structure 402. The protective film 660 is coupled to the core structure 402 on the second side 477 and opposite of the first insulating film 616a such that it covers the core vias 403. In one embodiment, the protective film 660 is formed of a material similar to that of the protective layer 622a. For example, the protective film 660 is formed of PET, such as biaxial PET. However, the protective film 660 may be formed of any suitable protective materials. In some embodiments, the protective film 660 has a thickness between about 50 μm and about 150 μm.

Figure 6C:
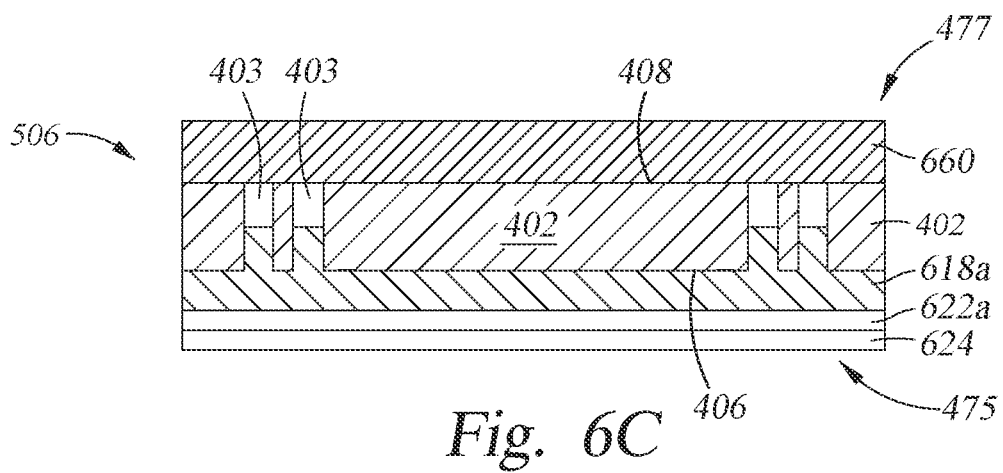

The core structure 402, now affixed to the insulating film 616a at the first side 475 and the protective film 660 at the second side 477, is exposed to a first lamination process at operation 506. During the lamination process, the core structure 402 is exposed to elevated temperatures, causing the epoxy resin layer 618a of the insulating film 616a to soften and flow into the open voids or volumes between the insulating film 616a and the protective film 660, such as into the core vias 403. Accordingly, the core vias 403 become at least partially filled (e.g., occupied) with the insulating material of the epoxy resin layer 618a, as depicted in FIG. 6C. Further, the core structure 402 becomes partially surrounded by the insulating material of the epoxy resin layer 618a.

In one embodiment, the lamination process is a vacuum lamination process that may be performed in an autoclave or other suitable device. In one embodiment, the lamination process is performed by use of a hot pressing process. In one embodiment, the lamination process is performed at a temperature between about 80° C. and about 140° C. and for a period between about 1 minute and about 30 minutes. In some embodiments, the lamination process includes the application of a pressure between about 1 psig and about 150 psig while a temperature between about 80° C. and about 140° C. is applied to core structure 402 and insulating film 616a for a period between about 1 minute and about 30 minutes. For example, the lamination process is performed by applying a pressure between about 10 psig and about 100 psig, and a temperature between about 100° C. and about 120° C. for a period between about 2 minutes and 10 minutes. For example, the lamination process is performed at a temperature of about 110° C. for a period of about 5 minutes.

Figure 6D:
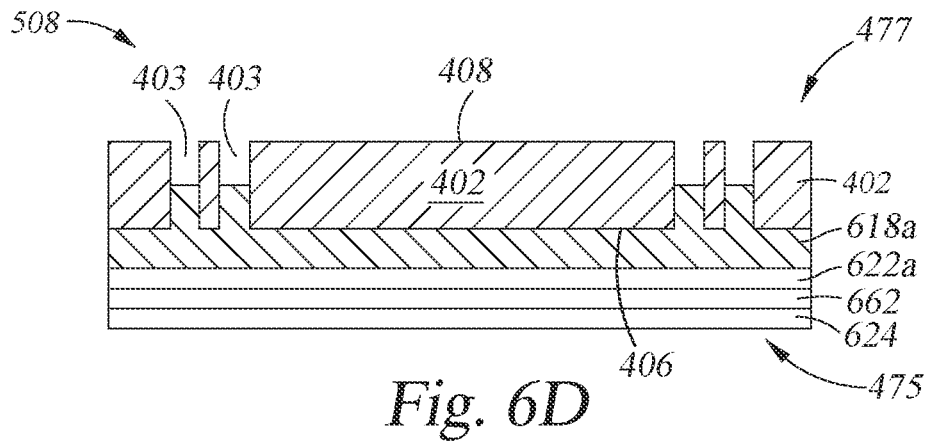

At operation 508, the protective film 660 is removed and the core structure 402, now having the laminated insulating material of the epoxy resin layer 618a at least partially surrounding the core structure 402 and partially filling the core vias 403, is placed on a second protective film 662. As depicted in FIG. 6D, the second protective film 662 is coupled to the core structure 402 adjacent the first side 475 such that the second protective film 662 is disposed against (e.g., adjacent) the protective layer 622a of the insulating film 616a. In some embodiments, the core structure 402, now coupled to the protective film 662, may be optionally placed on the carrier 624 for additional mechanical support on the first side 475. In some embodiments, the protective film 662 is placed on the carrier 624 prior to coupling the protective film 662 with the core structure 402. Generally, the protective film 662 is substantially similar in composition to the protective film 660. For example, the protective film 662 may be formed of PET, such as biaxial PET. However, the protective film 662 may be formed of any suitable protective materials. In some embodiments, the protective film 662 has a thickness between about 50 μm and about 150 μm.

Figure 6E:
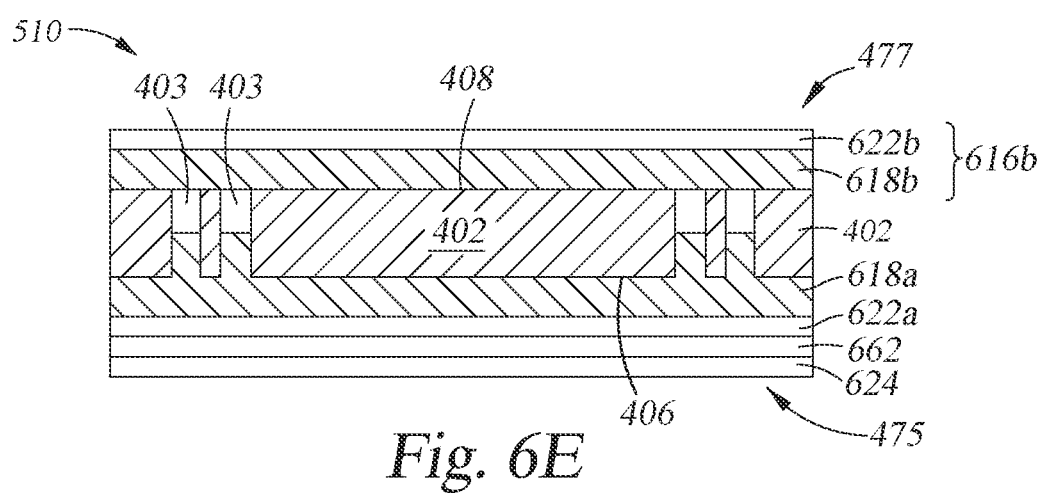

Upon coupling the core structure 402 to the second protective film 662, a second insulating film 616b substantially similar to the first insulating film 616a is placed over the second side 477 at operation 510 and FIG. 6E, thus replacing the protective film 660. In one embodiment, the second insulating film 616b is positioned on the second side 477 of the core structure 402 such that an epoxy resin layer 618b of the second insulating film 616b covers the core vias 403. In one embodiment, the placement of the second insulating film 616b on the core structure 402 may form one or more voids between the insulating film 616b and the already-laminated insulating material of the epoxy resin layer 618a that partially surrounds the core structure 402 and partially fills the core vias 403. The second insulating film 616b may include one or more layers formed of polymer-based dielectric materials similar to the insulating film 616a. As depicted in FIG. 6E, the second insulating film 616b includes an epoxy resin layer 618b substantially similar to the epoxy resin layer 618a described above. The second insulating film 616b may further include a protective layer 622b formed of similar materials to the protective layer 622a, such as PET.

Figure 6F:
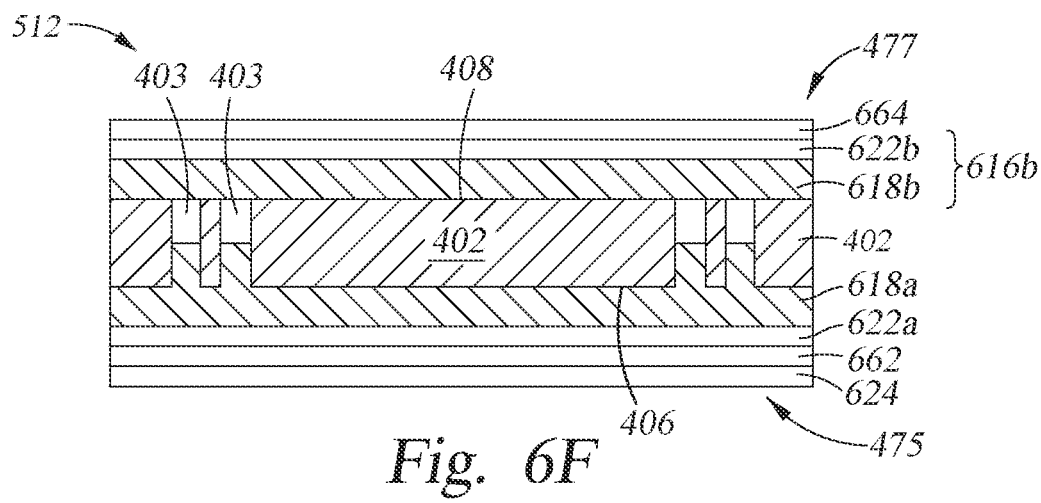

At operation 512, a third protective film 664 is placed over the second insulating film 616b, as depicted in FIG. 6F. Generally, the protective film 664 is substantially similar in composition to the protective films 660, 662. For example, the protective film 664 is formed of PET, such as biaxial PET. However, the protective film 664 may be formed of any suitable protective materials. In some embodiments, the protective film 664 has a thickness between about 50 μm and about 150 μm.

Figure 6G:
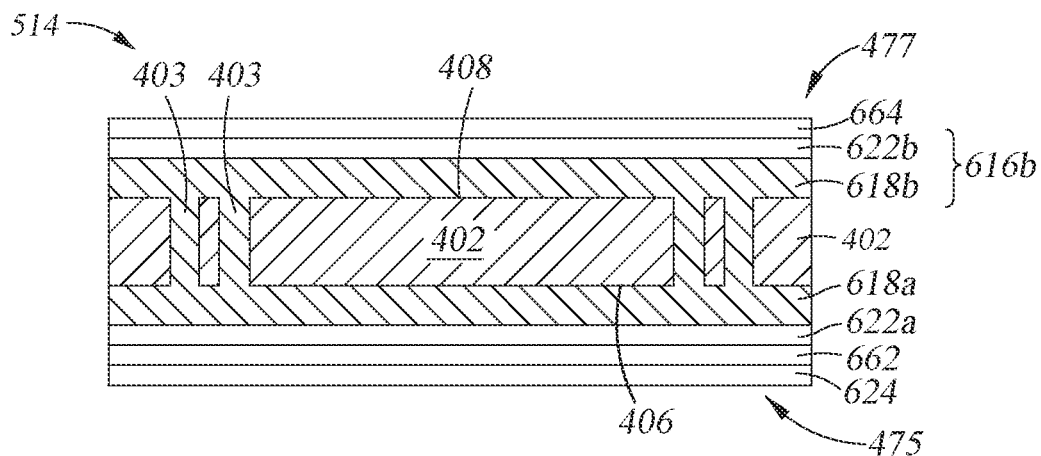

The core structure 402, now affixed to the insulating film 616b and the protective film 664 on the second side 477 and the protective film 662 and the optional carrier 624 on the first side 475, is exposed to a second lamination process at operation 514 and FIG. 6G. Similar to the lamination process at operation 504, the core structure 402 is exposed to elevated temperatures, causing the epoxy resin layer 618b of the insulating film 616b to soften and flow into any open voids or volumes between the insulating film 616b and the already-laminated insulating material of the epoxy resin layer 618a, thus integrating itself with the insulating material of the epoxy resin layer 618a. Accordingly, the core vias 403 become completely filled (e.g. packed, sealed) with insulating material of both epoxy resin layers 618a, 618b.

In one embodiment, the second lamination process is a vacuum lamination process that may be performed in an autoclave or other suitable device. In one embodiment, the lamination process is performed by use of a hot pressing process. In one embodiment, the lamination process is performed at a temperature between about 80° C. and about 140° C. and for a period between about 1 minute and about 30 minutes. In some embodiments, the lamination process includes the application of a pressure between about 1 psig and about 150 psig while a temperature between about 80° C. and about 140° C. is applied to the core structure 402 and the insulating film 616a for a period between about 1 minute and about 30 minutes. For example, the lamination process is performed by applying a pressure between about 10 psig and about 100 psig, and a temperature between about 100° C. and about 120° C. for a period between about 2 minutes and 10 minutes. For example, the lamination process is performed at a temperature of about 110° C. for a period of about 5 minutes.

Figure 6H:
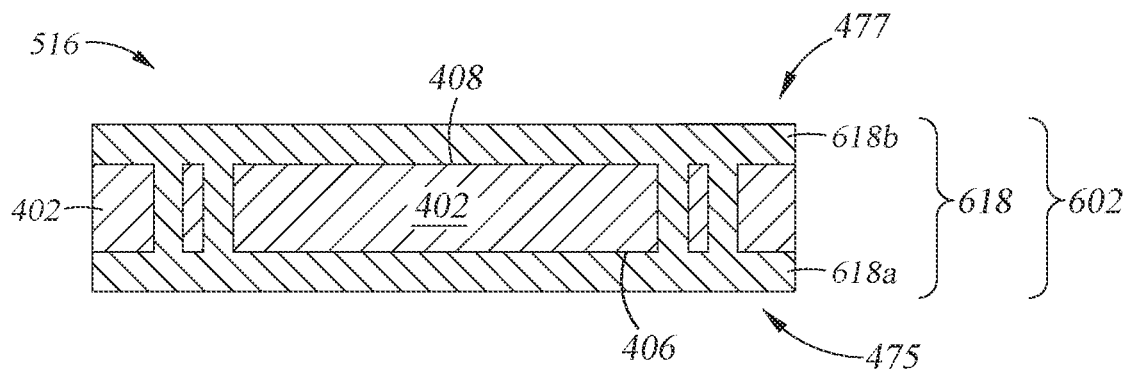
Figure 6I:
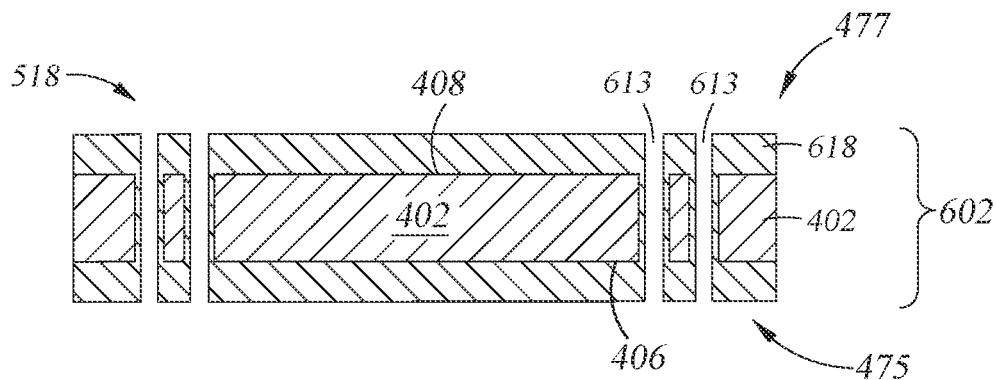

After lamination, the core structure 402 is disengaged from the carrier 624 at operation 516 and the protective films 662, 664 are removed, resulting in a laminated intermediate core assembly 602. As depicted in FIG. 6H, the intermediate core assembly 602 includes the core structure 402 having one or more core vias 403 formed therethrough and filled with the insulating dielectric material of the insulating films 616a, 616b. The insulating dielectric material of the epoxy resin layers 618a, 618b further encases the core structure 402 having the oxide layer 404 formed thereon such that the insulating material covers at least two surfaces or sides of the core structure 402 (e.g., surfaces 406, 408). In some examples, the protective layers 622a, 622b are also removed from the intermediate core assembly 602 at operation 516. Generally, the protective layers 622a and 622b, the carrier 624, and the protective films 662 and 664 are removed from the intermediate core assembly 602 by any suitable mechanical processes such as peeling therefrom.

Upon removal of the protective layers 622a, 622b and the protective films 662, 664, the intermediate core assembly 602 is exposed to a cure process to fully cure (i.e. harden through chemical reactions and cross-linking) the insulating dielectric material of the epoxy resin layers 618a, 618b, thus forming an insulating layer 618. The insulating layer 618 substantially surrounds the core structure 402 and fills the core vias 403. For example, the insulating layer 618 contacts or encapsulates at least the 107, 477 of the core structure 402 (including surfaces 406, 408).

In one embodiment, the cure process is performed at high temperatures to fully cure the intermediate core assembly 602. For example, the cure process is performed at a temperature between about 140° C. and about 220° C. and for a period between about 15 minutes and about 45 minutes, such as a temperature between about 160° C. and about 200° C. and for a period between about 25 minutes and about 35 minutes. For example, the cure process is performed at a temperature of about 180° C. for a period of about 30 minutes. In further embodiments, the cure process at operation 516 is performed at or near ambient (e.g. atmospheric) pressure conditions.

After curing, one or more through-assembly vias 613 are drilled through the intermediate core assembly 602 at operation 518, forming channels through the entire thickness of the intermediate core assembly 602 for subsequent interconnection formation. In some embodiments, the intermediate core assembly 602 may be placed on a carrier, such as the carrier 624, for mechanical support during the formation of the through-assembly vias 613. The through-assembly vias 613 are drilled through the core vias 403 that were formed in the core structure 402 and subsequently filled with the insulating layer 618. Thus, the through-assembly vias 613 may be circumferentially surrounded by the insulating layer 618 filled within the core vias 403. By having the ceramic-filler-containing epoxy resin material of the insulating layer 618 line the walls of the core vias 403, capacitive coupling between the conductive silicon-based core structure 402 and interconnections 1044 (described with reference to FIG. 9 and FIGS. 10A-10H) in the completed (e.g., final) semiconductor core assembly 1270 (described with reference to FIGS. 10G, 11 and FIGS. 12K and 12L) is significantly reduced as compared to other conventional interconnecting structures that utilize conventional via-insulating liners or films. Furthermore, the flowable nature of the epoxy resin material of the insulating layer 618 enables more consistent and reliable encapsulation and insulation, thus enhancing electrical performance by minimizing leakage current of the completed semiconductor core assembly 1270.

In one embodiment, the through-assembly vias 613 have a diameter less than about 100 µm, such as less than about 75 µm. For example, the through-assembly vias 613 have a diameter less than about 50 µm, such as less than about 35 µm. In some embodiments, the through-assembly vias 613 have a diameter between about 25 µm and about 50 µm, such as a diameter between about 35 µm and about 40 µm. In one embodiment, the through assembly vias 613 are formed using any suitable mechanical process. For example, the through-assembly vias 613 are formed using a mechanical drilling process. In one embodiment, through-assembly vias 613 are formed through the intermediate core assembly 602 by laser ablation. For example, the through-assembly vias 613 are formed using an ultraviolet laser. In one embodiment, the laser source utilized for laser ablation has a frequency between about 5 kHz and about 500 kHz. In one embodiment, the laser source is configured to deliver a pulsed laser beam at a pulse duration between about 10 ns and about 100 ns with a pulse energy between about 50 microjoules (µJ) and about 500 µJ. Utilizing an epoxy resin material containing small ceramic filler particles further promotes more precise and accurate laser patterning of small-diameter vias, such as the through-assembly vias 613, as the small ceramic filler particles therein exhibit reduced laser light reflection, scattering, diffraction, and transmission of the laser light away from the area in which the via is to be formed during the laser ablation process.

In some embodiments, the through-assembly vias 613 are formed within (e.g., through) the core vias 403 in such a way that the remaining ceramic-filler-containing epoxy resin material (e.g., dielectric insulating material) on the sidewalls of the core vias 403 has an average thickness between about 1 µm and about 50 µm. For example, the remaining ceramic-filler-containing epoxy resin material on the sidewalls of the core vias 403 has an average thickness between about 5 µm and about 40 µm, such as between about 10 µm and about 30 µm. Accordingly, the resulting structure after formation of the through-assembly vias 613 may be described as a "via-in-via" (e.g., a via centrally formed in a dielectric material within a via of the core structure). In certain embodiments, the via-in-via structure includes a dielectric sidewall passivation consisting of a ceramic-particle-filled epoxy material and disposed on a thin layer of thermal oxide formed on the sidewalls of the core vias 403.

In embodiments where a metal cladding layer 114, 414 is formed over the core structure 102, one or more cladding vias 123 may also be formed at operation 518 to provide channels for cladding connections 116 (shown in FIG. 1C). As described above, the cladding vias 123 are formed in the insulating layer 118 above and/or below the core structure 102 to enable coupling of the metal cladding layer 114, 414 to cladding connections 116 so that the metal cladding layer 114, 414 can be connected to an external common ground or reference voltage. In one embodiment, the cladding vias 123 have a diameter less than about 100 µm, such as less than about 75 µm. For example, the cladding vias 123 have a diameter less than about 50 µm, such as less than about 35 µm. In some embodiments, the cladding vias 123 have a diameter between about 5 µm and about 25 µm, such as a diameter between about 10 µm and about 20 µm.

After formation of the through-assembly vias 613 and/or cladding vias 123 (shown in FIG. 1C), the intermediate core assembly 602 is exposed to a de-smear process. During the de-smear process, any unwanted residues and/or debris caused by laser ablation during the formation of the through-assembly vias 613 and/or cladding vias 123 are removed from the intermediate core assembly 602. The de-smear process thus cleans the vias for subsequent metallization. In one embodiment, the de-smear process is a wet de-smear process. Any suitable solvents, etchants, and/or combinations thereof may be utilized for the wet de-smear process. In one example, methanol may be utilized as a solvent and copper (II) chloride dihydrate ($CuCl_2 \cdot H_2O$) as an etchant. Depending on the residue thickness, exposure duration of the intermediate core assembly 602 to the wet de-smear process may be varied. In another embodiment, the de-smear process is a dry de-smear process. For example, the de-smear process may be a plasma de-smear process with an $O_2/CF_4$ mixture gas. The plasma de-smear process may include generating a plasma by applying a power of about 700 W and flowing $O_2:CF_4$ at a ratio of about 10:1 (e.g., 100:10 sccm) for a time period between about 60 seconds and about 120 seconds. In further embodiments, the de-smear process is a combination of wet and dry processes.

Following the de-smear process at operation 518, the intermediate core assembly 602 is ready for formation of interconnection paths therein, described below with reference to FIG. 9 and FIGS. 10A-10H.

As discussed above, FIG. 5 and FIGS. 6A-6I illustrate a representative method 500 for forming the intermediate core assembly 602. FIG. 7 and FIGS. 8A-8E illustrate an alternative method 700 substantially similar to the method 500 but with fewer operations. The method 700 generally includes five operations 710-750. However, operations 710, 740, and 750 of the method 700 are substantially similar to the operations 502, 516, and 518 of the method 500, respectively. Thus, only operations 720, 730, and 740, depicted in FIGS. 8B, 8C, and 8D, respectively, are herein described for clarity.

Figure 8A:
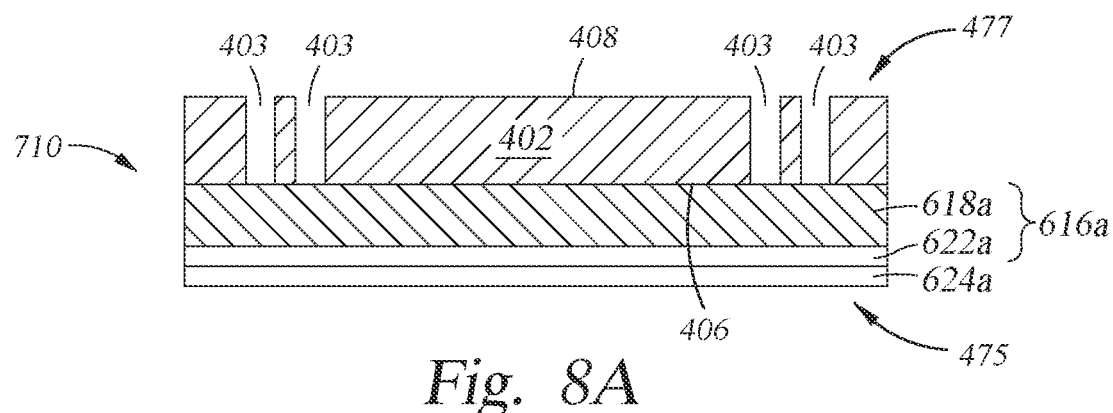
FIGS. 8A-8E schematically illustrate cross-sectional views of a core structure at different stages of the process depicted in FIG. 7, according to embodiments described herein
Figure 8B:
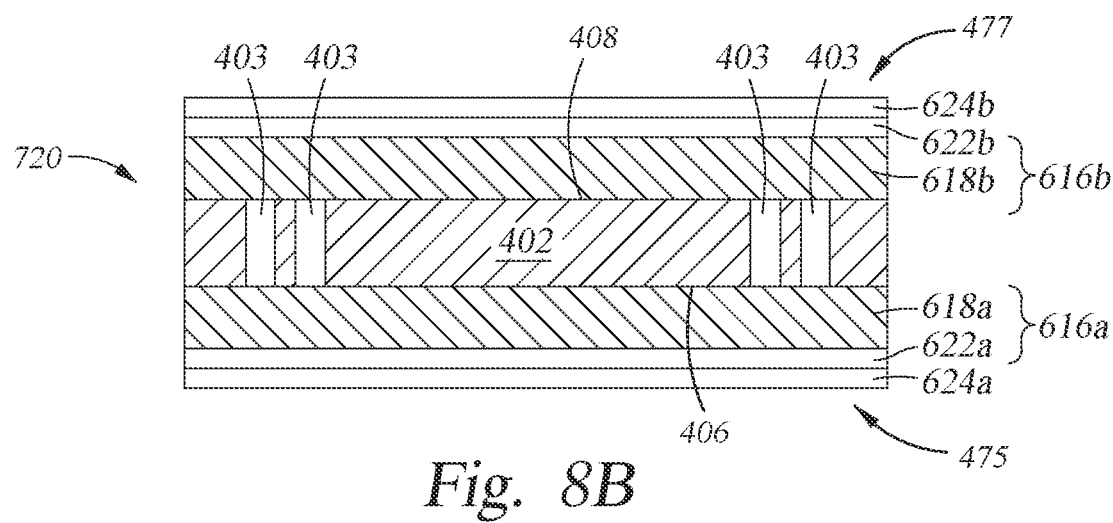

After fixing the first insulating film 616a to the first surface 406 on the first side 475 of the core structure 402, a second insulating film 616b is coupled to the second surface 408 on the opposing side 477 at operation 720 and FIG. 8B. In some embodiments, the second insulating film 616b is positioned on the surface 408 of the core structure 402 such that the epoxy resin layer 618b of the second insulating film 616b covers all of the core vias 403. As depicted in FIG. 8B, the core vias 403 form one or more voids or gaps between the insulating films 616a and 616b. In some embodiments, a second carrier 625 is affixed to the protective layer 622b of the second insulating film 616b for additional mechanical support during later processing operations.

Figure 8C:
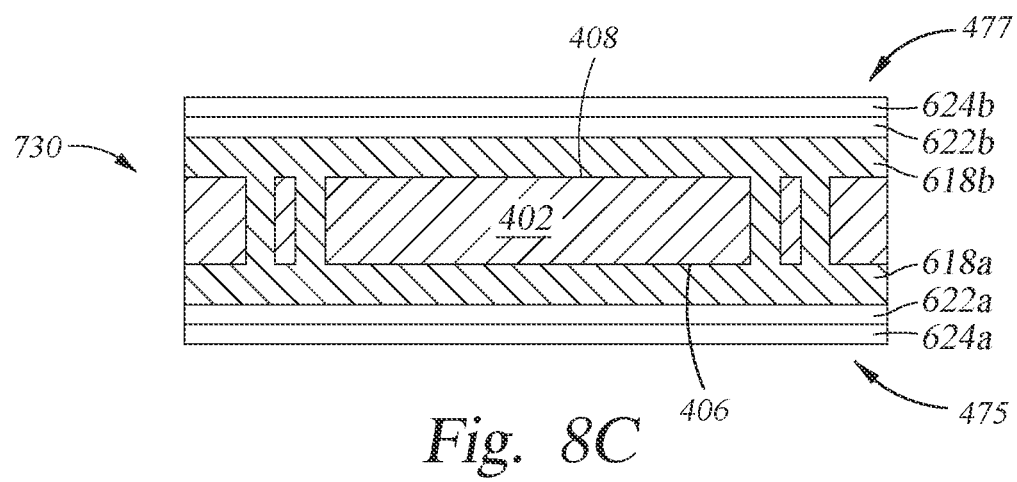

At operation 730 and FIG. 8C, the core structure 402, now affixed to the insulating films 616a and 616b on opposing sides thereof, is exposed to a single lamination process. During the single lamination process, the core structure 402 is exposed to elevated temperatures, causing the epoxy resin layers 618a and 618b of both insulating films 616a, 616b to soften and flow into the open voids or volumes created by the core vias 403 between the insulating films 616a, 616b. Accordingly, the core vias 403 become filled with the insulating material of the epoxy resin layers 618a and 618b.

Similar to the lamination processes described with reference to FIG. 5 and FIGS. 6A-6I, the lamination process at operation 730 may be a vacuum lamination process that may be performed in an autoclave or other suitable device. In another embodiment, the lamination process is performed by use of a hot pressing process. In one embodiment, the lamination process is performed at a temperature between about 80° C. and about 140° C. and for a period between about 1 minute and about 30 minutes. In some embodiments, the lamination process includes the application of a pressure between about 1 psig and about 150 psig while a temperature between about 80° C. and about 140° C. is applied to core structure 402 and the insulating films 616a, 616b for a period between about 1 minute and about 30 minutes. For example, the lamination process is performed at a pressure between about 10 psig and about 100 psig, a temperature between about 100° C. and about 120° C., and for a period between about 2 minutes and 10 minutes. For example, the lamination process at operation 730 is performed at a temperature of about 110° C. for a period of about 5 minutes.

Figure 8D:
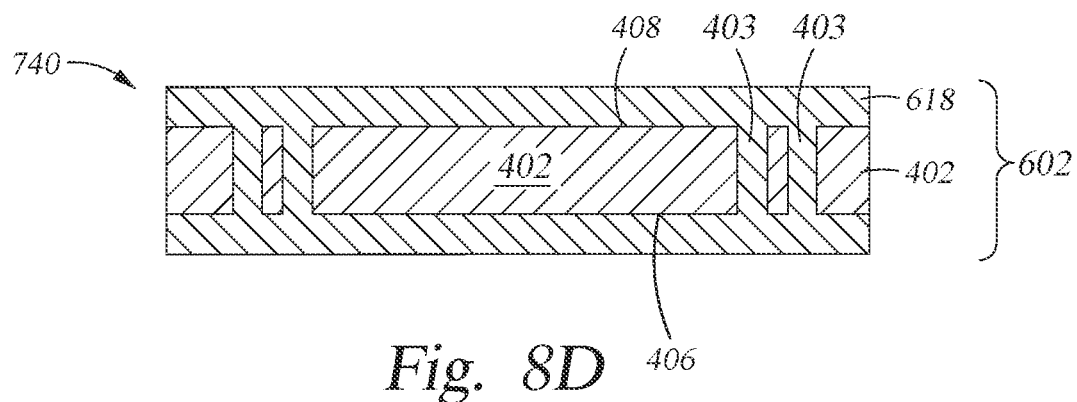
Figure 8E:
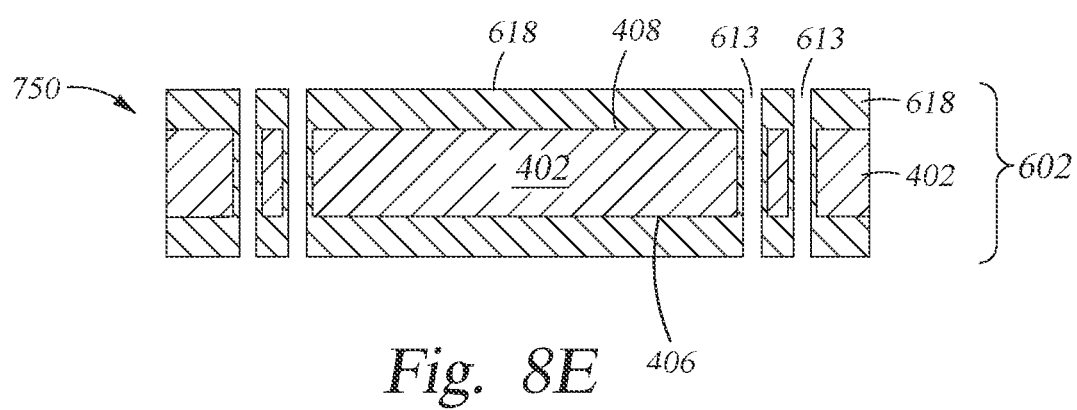

At operation 740, the one or more protective layers of the insulating films 616a, 616b are removed from the core structure 402, resulting in the laminated intermediate core assembly 602. In one example, the protective layers 622a, 622b are removed from the core structure 402, and thus the intermediate core assembly 602 is also disengaged from the first and second carriers 624, 625. Generally, the protective layers 622a, 622b and the carriers 624, 625 are removed by any suitable mechanical processes such as peeling therefrom. As depicted in FIG. 8D, the intermediate core assembly 602 includes the core structure 402 having one or more core vias 403 formed therein and filled with the insulating dielectric material of the epoxy resin layers 618a, 618b. The insulating material further encases the core structure 402 such that the insulating material covers at least two surfaces or sides of the core structure 402, for example, the surfaces 406, 408.

Upon removal of the protective layers 622a, 622b, the intermediate core assembly 602 is exposed to a cure process to fully cure the insulating dielectric material of the epoxy resin layers 618a, 618b. Curing of the insulating material results in the formation of the insulating layer 618. As depicted in FIG. 8D and similar to operation 516 corresponding with FIG. 6H, the insulating layer 618 substantially surrounds the core structure 402 and fills the core vias 403.

In one embodiment, the cure process is performed at high temperatures to fully cure the intermediate core assembly 602. For example, the cure process is performed at a temperature between about 140° C. and about 220° C. and for a period between about 15 minutes and about 45 minutes, such as a temperature between about 160° C. and about 200° C. and for a period between about 25 minutes and about 35 minutes. For example, the cure process is performed at a temperature of about 180° C. for a period of about 30 minutes. In further embodiments, the cure process at operation 740 is performed at or near ambient (e.g. atmospheric) pressure conditions.

After curing at operation 740, the method 700 is substantially similar to operation 518 of the method 500. Accordingly, one or more through-assembly vias 613 and/or cladding vias 123 (shown in FIG. 1C) are drilled through the intermediate core assembly 602, followed by exposing the intermediate core assembly 602 to a de-smear process. Upon completion of the de-smear process, the intermediate core assembly 602 is ready for formation of interconnection paths therein, as described below.

Figure 9:
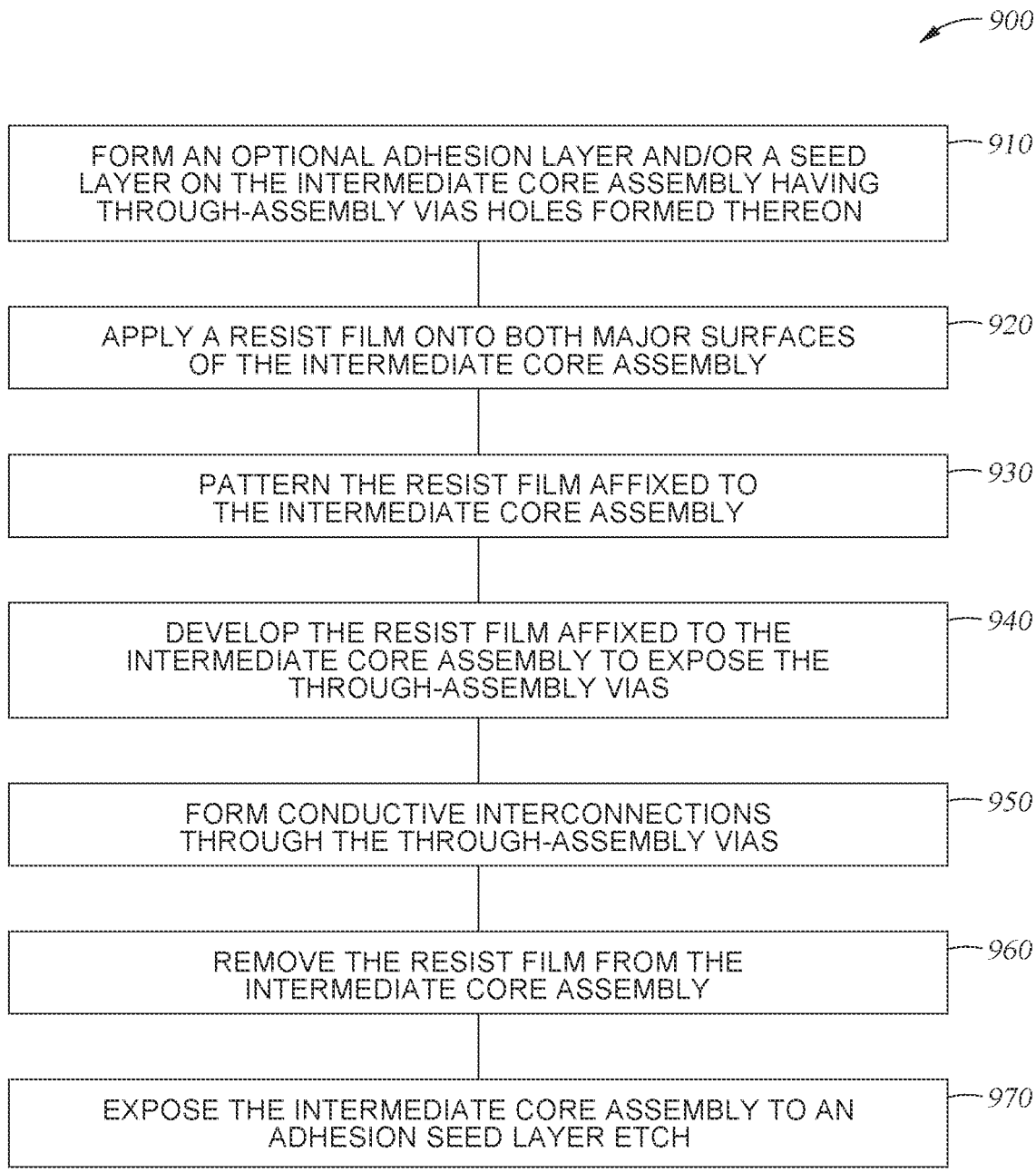
FIG. 9 is a flow diagram that illustrates a process for forming interconnections in a semiconductor core assembly, according to embodiments described herein.

FIG. 9 illustrates a flow diagram of a representative method 900 for forming electrical interconnections through the intermediate core assembly 602. FIGS. 10A-10H schematically illustrate cross-sectional views of the intermediate core assembly 602 at different stages of the process of the method 900 depicted in FIG. 9. Thus, FIG. 9 and FIGS. 10A-10H are herein described together for clarity.

Figure 10A:
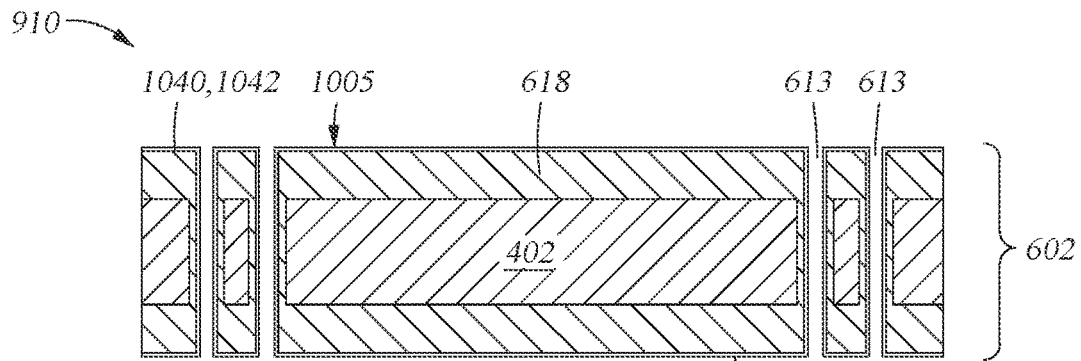
FIGS. 10A-10H schematically illustrate cross-sectional views of the semiconductor core assembly at different stages of the process depicted in FIG. 9, according to embodiments described herein.
Figure 10B:
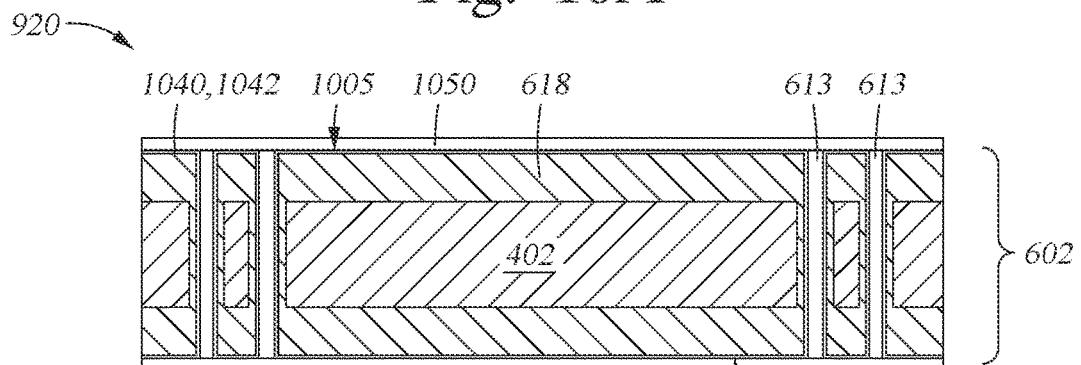
Figure 10C:
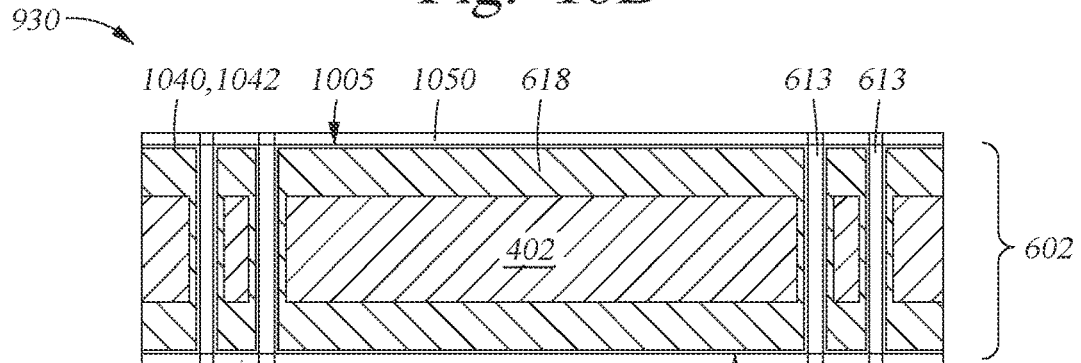
Figure 10D:
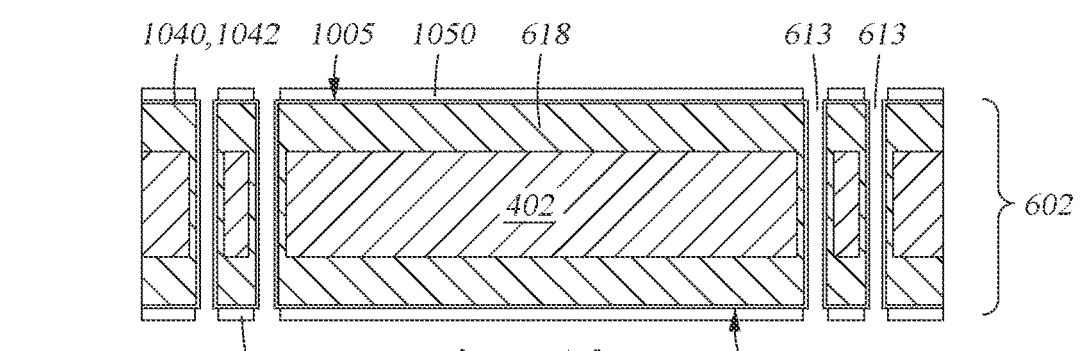

In one embodiment, the electrical interconnections formed through the intermediate core assembly 602 are formed of copper. Thus, the method 900 generally begins at operation 910 and FIG. 10A wherein the intermediate core assembly 602, having through-assembly vias 613 formed therein, has a barrier or adhesion layer 1040 and/or a seed layer 1042 formed thereon. An enlarged partial view of the adhesion layer 1040 and the seed layer 1042 formed on the intermediate core assembly 602 is depicted in FIG. 10H for reference. The adhesion layer 1040 may be formed on desired surfaces of the insulating layer 618, such as surfaces corresponding with the major surfaces 1005, 1007 of the intermediate core assembly 602 as well as sidewalls of the through-assembly vias 613 and/or cladding vias 123, to assist in promoting adhesion and blocking diffusion of the subsequently formed seed layer 1042, electrical interconnections 1044, and/or cladding connections 116 (shown in FIG. 1C). Thus, in one embodiment, the adhesion layer 1040 acts as an adhesion layer; in another embodiment, the adhesion layer 1040 acts as a barrier layer. In both embodiments, however, the adhesion layer 1040 will be hereinafter described as an "adhesion layer."

In one embodiment, the adhesion layer 1040 is formed of titanium, titanium nitride, tantalum, tantalum nitride, manganese, manganese oxide, molybdenum, cobalt oxide, cobalt nitride, or any other suitable materials or combinations thereof. In one embodiment, the adhesion layer 1040 has a thickness between about 10 nm and about 300 nm, such as between about 50 nm and about 150 nm. For example, the adhesion layer 1040 has a thickness between about 75 nm and about 125 nm, such as about 100 nm. The adhesion layer 1040 is formed by any suitable deposition process, including but not limited to chemical vapor deposition (CVD), physical vapor deposition (PVD), plasma enhanced CVD (PECVD), atomic layer deposition (ALD), or the like.

The seed layer 1042 may be formed on the adhesion layer 1040 or directly on the insulating layer 618 (e.g., without the formation of the adhesion layer 1040). In some embodiments, the seed layer 1042 is formed on all surfaces of the insulating layer 618 while the adhesion layer 1040 is only formed on desired surfaces or desired portions of surfaces of the insulating layer 618. For example, the adhesion layer 1040 may be formed on the major surfaces 1005, 1007 and not on the sidewalls of the through-assembly vias 613 and/or cladding vias 123 (shown in FIG. 1C) while the seed layer 1042 is formed on the major surfaces 1005, 1007 as well as sidewalls of the vias. The seed layer 1042 is formed of a conductive material such as copper, tungsten, aluminum, silver, gold, or any other suitable materials or combinations thereof. In one embodiment, the seed layer 1042 has a thickness between about 0.05 µm and about 0.5 µm, such as a thickness between about 0.1 µm and about 0.3 µm. For example, the seed layer 1042 has a thickness between about 0.15 µm and about 0.25 µm, such as about 0.2 µm. In one embodiment, the seed layer 1042 has a thickness between about 0.1 µm and about 1.5 µm. Similar to the adhesion layer 1040, the seed layer 1042 is formed by any suitable deposition process, such as CVD, PVD, PECVD, ALD dry processes, wet electroless plating processes, or the like. In one embodiment, a copper seed layer 1042 may be formed on a molybdenum adhesion layer 1040 on the intermediate core assembly 602. The molybdenum adhesion and copper seed layer combination enables improved adhesion with the surfaces of the insulating layer 618 and reduces undercut of conductive interconnect lines during a subsequent seed layer etch process at operation 970.

At operations 920 and 930, corresponding to FIGS. 10B and 10C, respectively, a spin-on/spray-on or dry resist film 1050, such as a photoresist, is applied to both major surfaces 1005, 1007 of the intermediate core assembly 602 and subsequently patterned. In one embodiment, the resist film 1050 is patterned via selective exposure to UV radiation. In one embodiment, an adhesion promoter (not shown) is applied to the intermediate core assembly 602 prior to formation of the resist film 1050. The adhesion promoter improves adhesion of the resist film 1050 to the intermediate core assembly 602 by producing an interfacial bonding layer for the resist film 1050 and by removing any moisture from the surface of the intermediate core assembly 602. In some embodiments, the adhesion promoter is formed of bis(trimethylsilyl)amine or hexamethyldisilizane (HMDS) and propylene glycol monomethyl ether acetate (PGMEA).

At operation 940, the intermediate core assembly 602 is exposed to a resist film development process. As depicted in FIG. 10D, development of the resist film 1050 results in exposure of the through-assembly vias 613 and/or cladding vias 123 (shown in FIG. 1C), which may now have an adhesion layer 1040 and/or a seed layer 1042 formed thereon. In one embodiment, the film development process is a wet process, such as a wet process that includes exposing the resist film 1050 to a solvent. In one embodiment, the film development process is a wet etch process utilizing an aqueous etch process. For example, the film development process is a wet etch process utilizing a buffered etch process selective for a desired material. Any suitable wet solvents or combination of wet etchants may be used for the resist film development process.

Figure 10E:
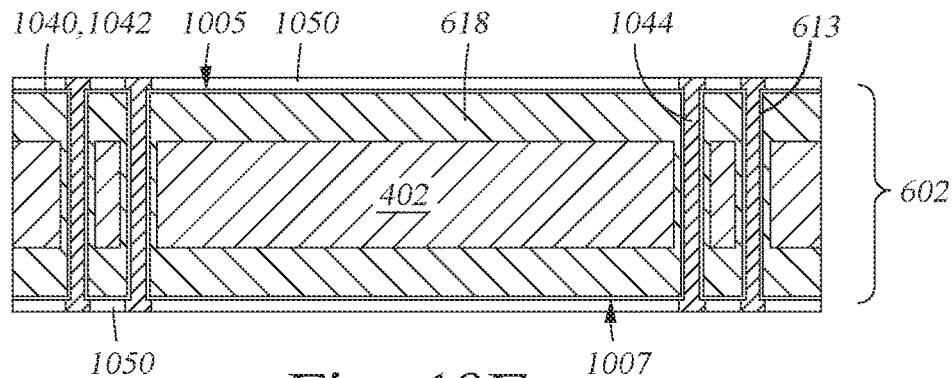
Figure 10F:
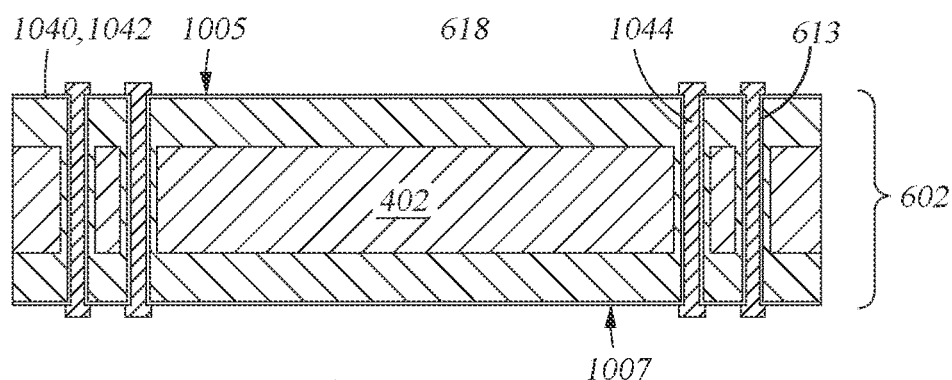

At operations 950 and 960, corresponding to FIGS. 10E and 10F respectively, electrical interconnections 1044 are formed through the exposed through-assembly vias 613 and the resist film 1050 is thereafter removed. In embodiments where the core structure 102 has a metal cladding layer 114, 414 formed thereon, cladding connections 116 (shown in FIG. 1C) are also formed through exposed cladding vias 123 (shown in FIG. 1C) at operation 950. The interconnections 1044 and/or cladding connections 116 are formed by any suitable methods, including electroplating and electroless plating. In one embodiment, the resist film 1050 is removed via a wet process. As depicted in FIGS. 10E and 10F, the electrical interconnections 1044 may completely fill the through-assembly vias 613 (the cladding connections 116 may also completely fill the cladding vias 123) and protrude from the surfaces 1005, 1007 of the intermediate core assembly 602 upon removal of the resist film 1050. In some embodiments, the electrical interconnections 1044 and/or the cladding connections 116 may only line the sidewalls of the vias without completely filling the vias. In one embodiment, the electrical interconnections 1044 and/or cladding connections 116 are formed of copper. In other embodiments, the electrical interconnections 1044 and/or cladding connections 116 may be formed of any suitable conductive material including but not limited to aluminum, gold, nickel, silver, palladium, tin, or the like.

Figure 10G:
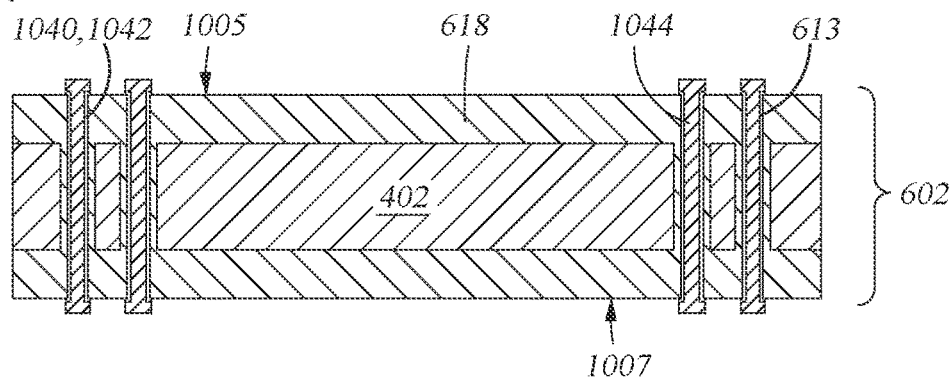
Figure 10H:
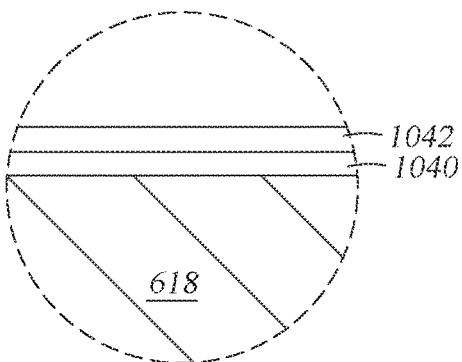

At operation 970 and FIG. 10G, the intermediate core assembly 602 having electrical interconnections 1044 and/or cladding connections 116 formed therein is exposed to a seed layer etch process to remove the exposed adhesion layer 1040 and seed layer 1042 on external surfaces thereof (e.g., surfaces 1005, 1007). In some embodiments, the adhesion layer 1040 and/or seed layer 1042 formed between the interconnections and the sidewalls of the vias may remain after the seed layer etch process. In one embodiment, the seed layer etch is a wet etch process including a rinse and drying of the intermediate core assembly 602. In one embodiment, the seed layer etch process is a buffered etch process selective for a desired material such as copper, tungsten, aluminum, silver, or gold. In other embodiments, the etch process is an aqueous etch process. Any suitable wet etchant or combination of wet etchants may be used for the seed layer etch process.

Following the seed layer etch process at operation 970, one or more semiconductor core assemblies may be singulated from the intermediate core assembly 602 and utilized as a fully-functional semiconductor core assembly 1270 (e.g., an electronic mounting or package structure). For example, the one or more semiconductor core assemblies may be singulated and utilized as circuit board structures, chip carrier structures, integrated circuit packages, and the like. Alternatively, the intermediate core assembly 602 may have one or more redistribution layers 1260 (shown in FIGS. 12J and 12K) formed thereon to reroute external contact points of the electrical interconnections 1044 to desired locations on the surfaces of the final semiconductor core assemblies.

Figure 11:
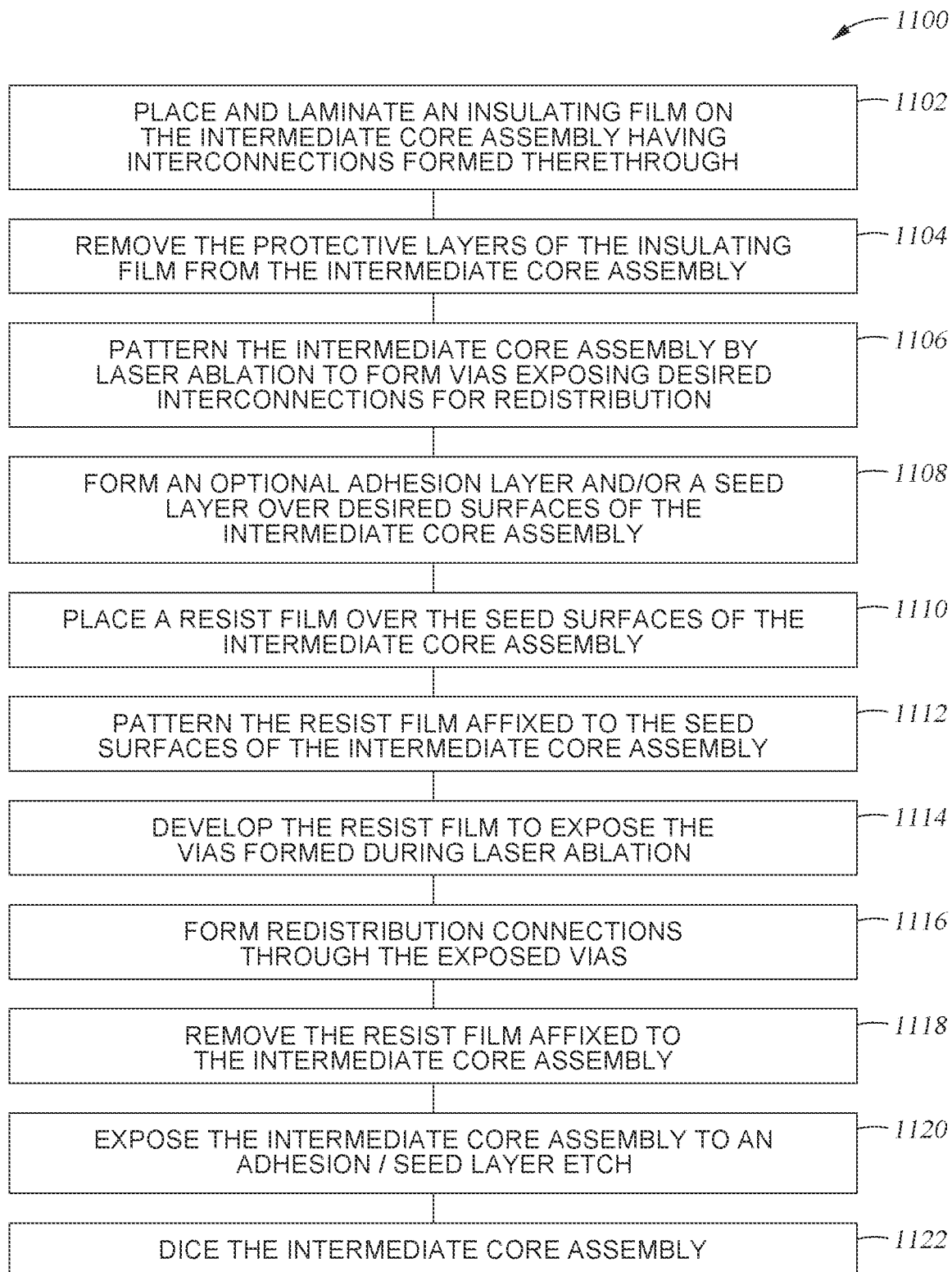
FIG. 11 is a flow diagram that illustrates a process for forming a redistribution layer on a semiconductor core assembly, according to embodiments described herein.

FIG. 11 illustrates a flow diagram of a representative method 1100 of forming a redistribution layer 1260 on the intermediate core assembly 602, which has not yet been singulated into a semiconductor core assembly 1270. FIGS. 12A-12K schematically illustrate cross-sectional views of the intermediate core assembly 602 at different stages of the method 1100 depicted in FIG. 11. Thus, FIG. 11 and FIGS. 12A-12K are herein described together for clarity.

The method 1100 is substantially similar to the methods 500, 700, and 900 described above. Generally, the method 1100 begins at operation 1102 and FIG. 12A, wherein an insulating film 1216 is affixed to the intermediate core assembly 602 and is thereafter laminated. The insulating film 1216 is substantially similar to the insulating films 616a, 616b. In one embodiment, as depicted in FIG. 12A, the insulating film 1216 includes an epoxy resin layer 1218 and one or more protective layers. For example, the insulating film 1216 may include a protective layer 1222. Any suitable combination of layers and insulating materials is contemplated for the insulating film 1216. In some embodiments, an optional carrier 1224 is coupled to the insulating film 1216 for added support. In some embodiments, a protective film (not shown) may be coupled to the insulating film 1216.

Generally, the epoxy resin layer 1218 has a thickness of less than about 60 μm, such as between about 5 μm and about 50 μm. For example, the epoxy resin layer 1218 has a thickness of between about 10 μm and about 25 μm. In one embodiment, the epoxy resin layer 1218 and the PET protective layer 1222 have a combined thickness of less than about 120 μm, such as a thickness of less than about 90 μm. The insulating film 1216, and specifically the epoxy resin layer 1218, is affixed to a surface of the intermediate core assembly 602 having exposed electrical interconnections 1044, such as the major surface 1005.

After placement of the insulating film 1216, the intermediate core assembly 602 is exposed to a lamination process substantially similar to the lamination process described with regard to operations 506, 514, and 730. The intermediate core assembly 602 is exposed to elevated temperatures to soften the epoxy resin layer 1218 of the insulating film 1216, which subsequently bonds to the insulating layer 618. Thus, the epoxy resin layer 1218 becomes integrated with the insulating layer 618 and forms an extension thereof, and will thus be described hereinafter as a singular insulating layer 618. The integration of the epoxy resin layer 1218 and the insulating layer 618 further results in an enlarged insulating layer 618 enveloping the previously exposed electrical interconnections 1044.

At operation 1104 and FIG. 12B, the protective layer 1222 and the carrier 1224 are removed from the intermediate core assembly 602 by mechanical means, and the intermediate core assembly 602 is exposed to a cure process to fully harden the newly expanded insulating layer 618. In one embodiment, the cure process is substantially similar to the cure process described with reference to operations 516 and 740. For example, the cure process is performed at a temperature between about 140° C. and about 220° C. and for a period between about 15 minutes and about 45 minutes.

The intermediate core assembly 602 is then selectively patterned by laser ablation at operation 1106 and FIG. 12C. The laser ablation process at operation 1106 forms one or more redistribution vias 1253 in the newly expanded insulating layer 618 and exposes desired electrical interconnections 1044 for redistribution of contact points thereof. In one embodiment, the redistribution vias 1253 have a diameter substantially similar to or smaller than the diameter of the through-assembly vias 613. For example, the redistribution vias 1253 have a diameter between about 5 μm and about 600 μm, such as a diameter of between about 10 μm and about 50 μm, such as between about 20 μm and about 30 μm. In one embodiment, the laser ablation process at operation 1106 is performed utilizing a $CO_2$ laser. In one embodiment, the laser ablation process at operation 1106 is performed utilizing a UV laser. In another embodiment, the laser ablation process at operation 1106 is performed utilizing a green laser. In one example, the laser source may generate a pulsed laser beam having a frequency between about 100 kHz and about 1000 kHz. In one example, the laser source is configured to deliver a pulsed laser beam at a wavelength of between about 100 nm and about 2000 nm, at a pulse duration between about 10E-4 ns and about 10E-2 ns, and with a pulse energy of between about 10 μJ and about 300 μJ.

In embodiments where the metal cladding layer 114, 414 is formed on the core structure 102 (shown in FIG. 1C), the intermediate core assembly 602 may also be patterned at operation 1106 to form one or more cladding vias 123 through the extended insulating layer 618. Thus, for semiconductor core assemblies having one or more redistribution layers, the cladding vias 123 may be formed simultaneously with redistribution vias 1253 instead of forming the cladding vias 123 with the through-assembly vias 613 at operations 518 or 750. In certain other embodiments, however, the cladding vias 123 may be initially patterned at operations 518 or 750, thereafter metallized with cladding connections 116, and then extended or lengthened through the extended insulating layer 618 at operation 1106.

Figure 12D:
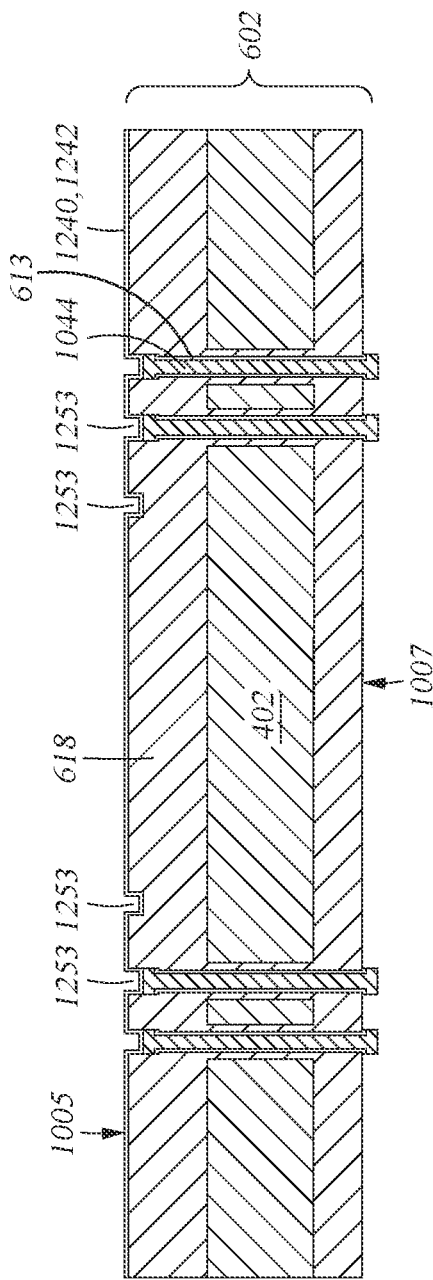

At operation 1108 and FIG. 12D, an adhesion layer 1240 and/or a seed layer 1242 are optionally formed on one or more surfaces of the insulating layer 618. In one embodiment, the adhesion layer 1240 and the seed layer 1242 are substantially similar to the adhesion layer 1040 and the seed layer 1042, respectively. For example, the adhesion layer 1240 is formed from titanium, titanium nitride, tantalum, tantalum nitride, manganese, manganese oxide, molybdenum, cobalt oxide, cobalt nitride, or any other suitable materials or combinations thereof. In one embodiment, the adhesion layer 1240 has a thickness between about 10 nm and about 300 nm, such as a thickness between about 50 nm and about 150 nm. For example, the adhesion layer 1240 has a thickness between about 75 nm and about 125 nm, such as about 100 nm. The adhesion layer 1240 may be formed by any suitable deposition process, including but not limited to CVD, PVD, PECVD, ALD, or the like.

The seed layer 1242 is formed from a conductive material such as copper, tungsten, aluminum, silver, gold, or any other suitable materials or combinations thereof. In one embodiment, the seed layer 1242 has a thickness between about 0.05 μm and about 0.5 μm, such as between about 0.1 μm and about 0.3 μm. For example, the seed layer 1242 has a thickness between about 0.15 μm and about 0.25 μm, such as about 0.2 μm. Similar to the adhesion layer 1240, the seed layer 1242 may be formed by any suitable deposition process, such as CVD, PVD, PECVD, ALD dry processes, wet electroless plating processes, or the like. In one embodiment, a molybdenum adhesion layer 1240 and a copper seed layer 1242 are formed on the intermediate core assembly 602 to reduce the formation of undercut during a subsequent seed layer etch process at operation 1122.

Figure 12E:
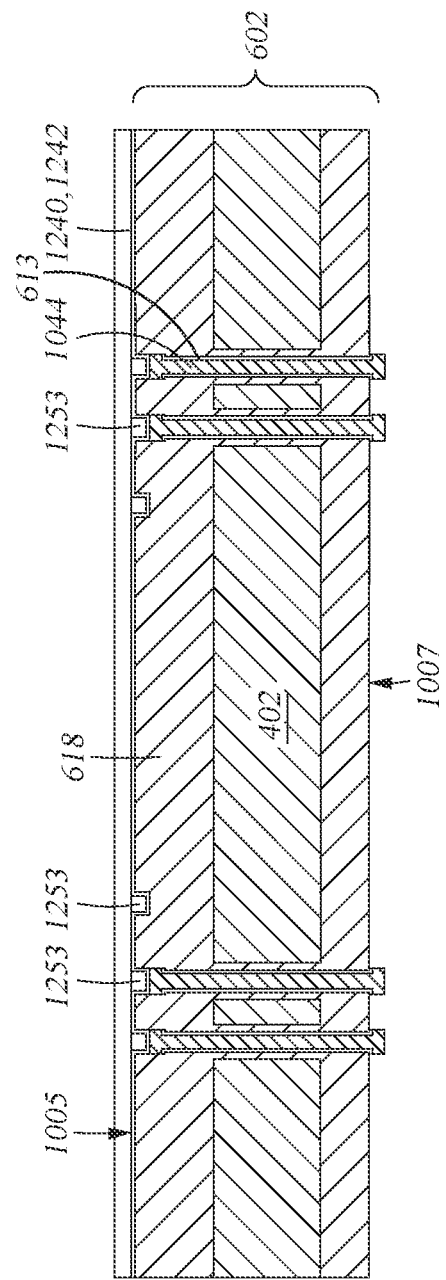
Figure 12F:
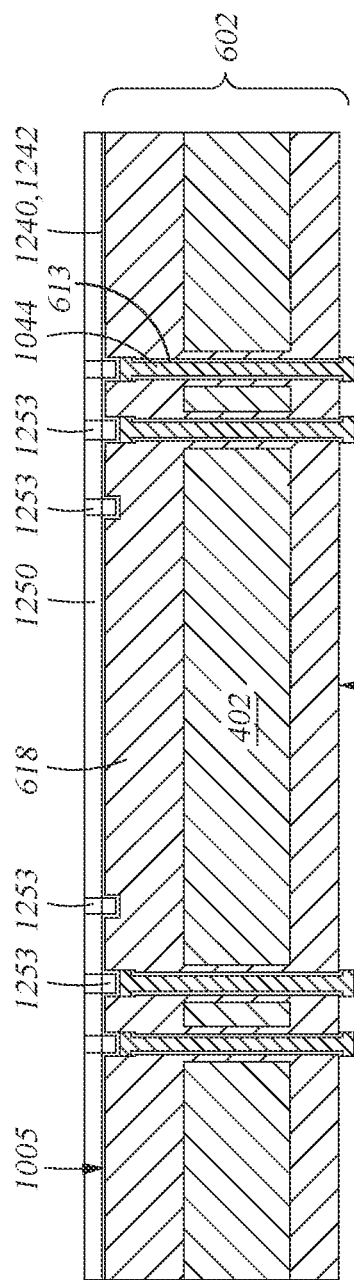
Figure 12G:
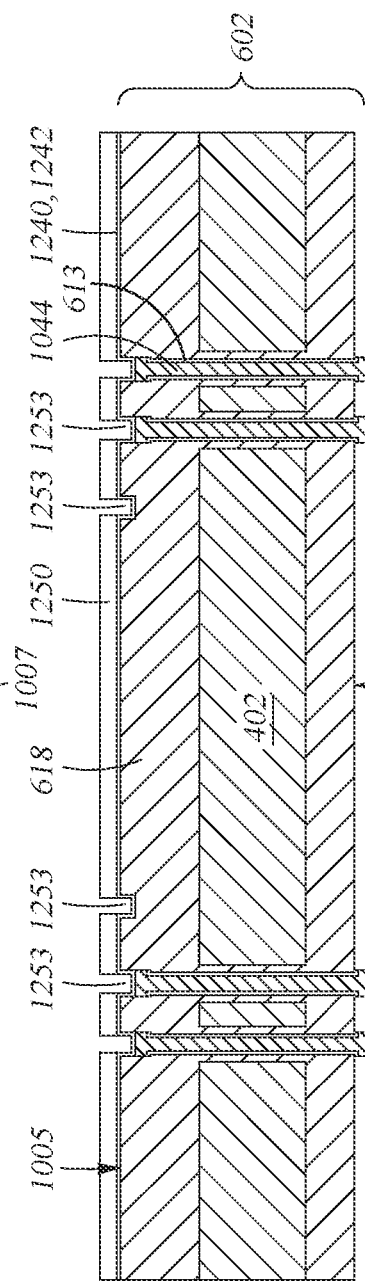

At operations 1110, 1112, and 1114, corresponding to FIGS. 12E, 12F, and 12G, respectively, a spin-on/spray-on or dry resist film 1250, such as a photoresist, is applied over the seeded surfaces of the intermediate core assembly 602 and subsequently patterned and developed. In one embodiment, an adhesion promoter (not shown) is applied to the intermediate core assembly 602 prior to placement of the resist film 1250. The exposure and development of the resist film 1250 results in opening of the redistribution vias 1253, and in certain embodiments, cladding vias 123. Thus, patterning of the resist film 1250 may be performed by selectively exposing portions of the resist film 1250 to UV radiation, and subsequent development of the resist film 1250 by a wet process, such as a wet etch process. In one embodiment, the resist film development process is a wet etch process utilizing a buffered etch process selective for a desired material. In other embodiments, the resist film development process is a wet etch process utilizing an aqueous etch process. Any suitable wet etchant or combination of wet etchants may be used for the resist film development process.

Figure 12H:
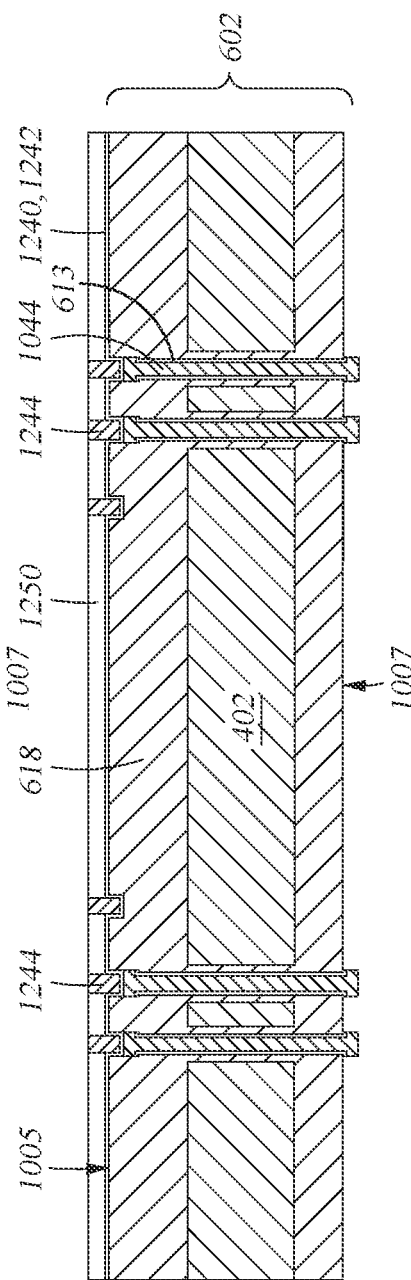
Figure 12I:
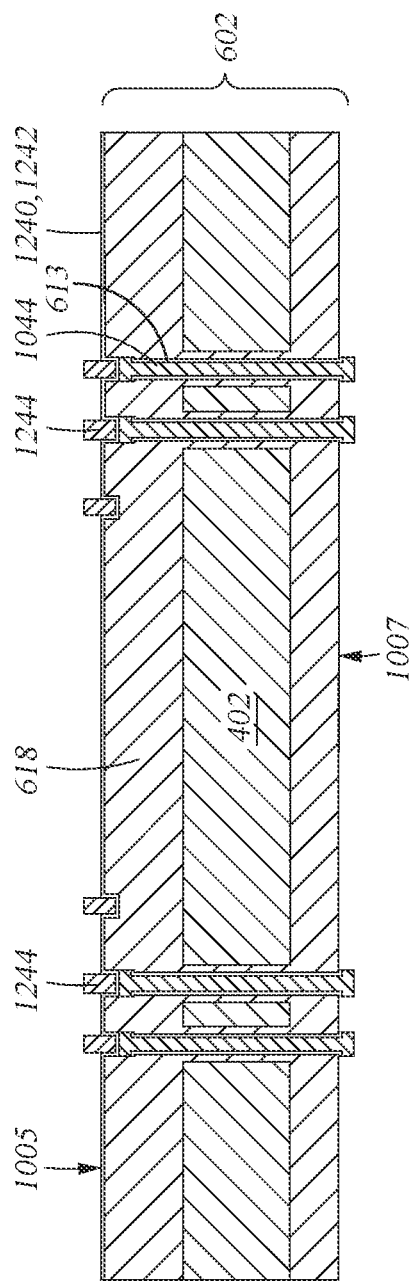

At operations 1116 and 1118, corresponding to FIGS. 12H and 12I, respectively, redistribution connections 1244 are formed through the exposed redistribution vias 1253 and the resist film 1250 is thereafter removed. In certain embodiments, cladding connections 116 are also formed through the exposed cladding vias 123 at operation 1116. In one embodiment, the resist film 1250 is removed via a wet process. As depicted in FIGS. 12H and 12I, the redistribution connections 1244 fill the redistribution vias 1253 and protrude from the surfaces of the intermediate core assembly 602 upon removal of the resist film 1250. In one embodiment, the redistribution connections 1244 are formed of copper. In other embodiments, the redistribution connections 1244 are formed of any suitable conductive material including but not limited to aluminum, gold, nickel, silver, palladium, tin, or the like. Any suitable methods may be utilized to form the redistribution connections 1244, including electroplating and electroless deposition.

Figure 12J:
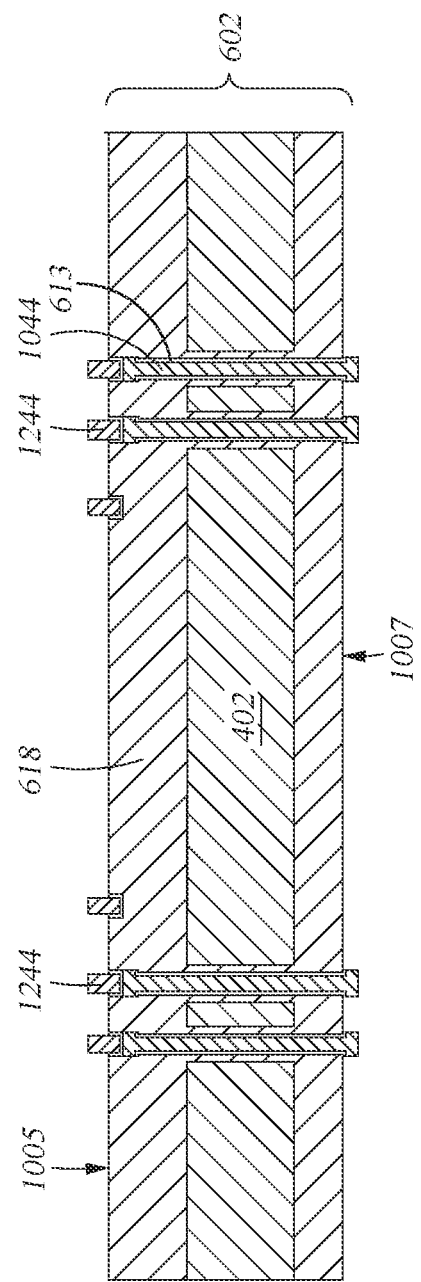
Figure 12K:
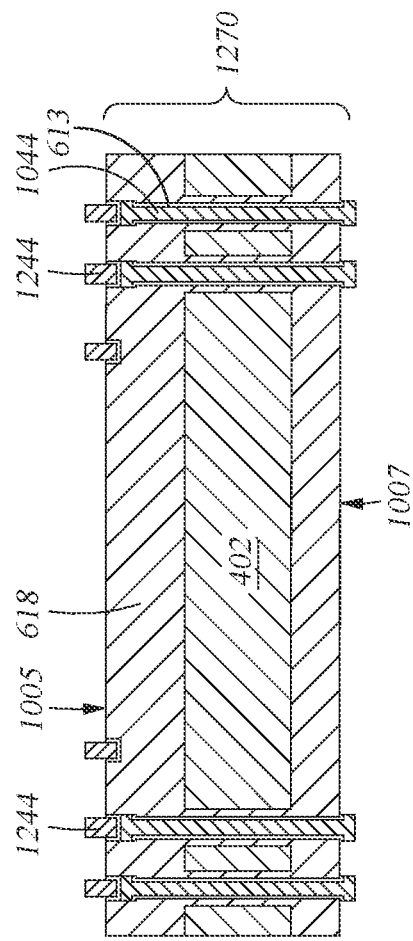
Figure 12L:
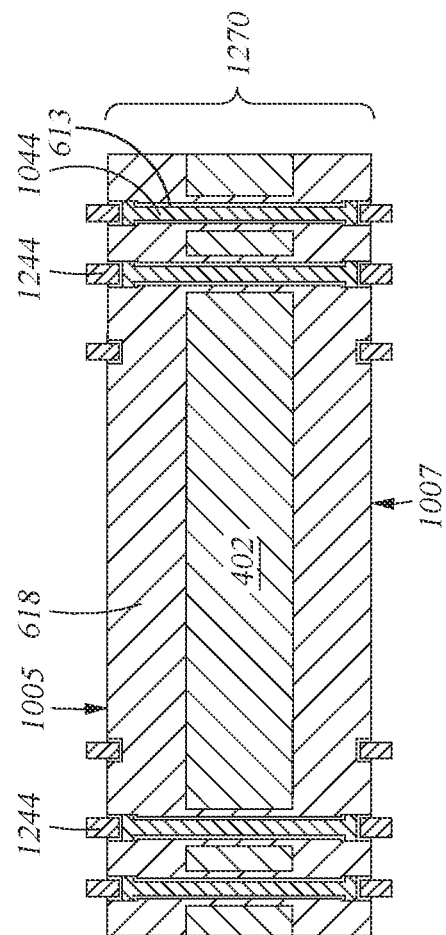

At operation 1120 and FIG. 12J, the intermediate core assembly 602 having the redistribution connections 1244 formed thereon is exposed to a seed layer etch process substantially similar to that of operation 970. In one embodiment, the seed layer etch is a wet etch process including a rinse and drying of the intermediate core assembly 602. In one embodiment, the seed layer etch process is a wet etch process utilizing a buffered etch process selective for a desired material of the seed layer 1242. In other embodiments, the etch process is a wet etch process utilizing an aqueous etch process. Any suitable wet etchant or combination of wet etchants may be used for the seed layer etch process.

Upon completion of the seed layer etch process at operation 1120, one or more additional redistribution layers 1260 may be formed on the intermediate core assembly 602 utilizing the sequences and processed described above. For example, one or more additional redistribution layers 1260 may be formed on the first redistribution layer 1260 and/or an opposing surface of the intermediate core assembly 602, such as major surface 1007. In one embodiment, the one or more additional redistribution layers 1260 may be formed of polymer-based dielectric materials, such as a flowable build-up materials, that are different from the material of the first redistribution layer 1260 and/or the insulating layer 618. For example, in some embodiments, the insulating layer 618 may be formed of an epoxy filled with ceramic fibers, while the first and/or any additional redistribution layers 1260 are formed of polyimide, BCB, and/or PBO. Alternatively, at operation 1122 and FIG. 12K, one or more completed semiconductor core assemblies 1270 may be singulated from the intermediate core assembly 602 after a desired number of redistribution layers 1260 is formed.

Figure 13A:
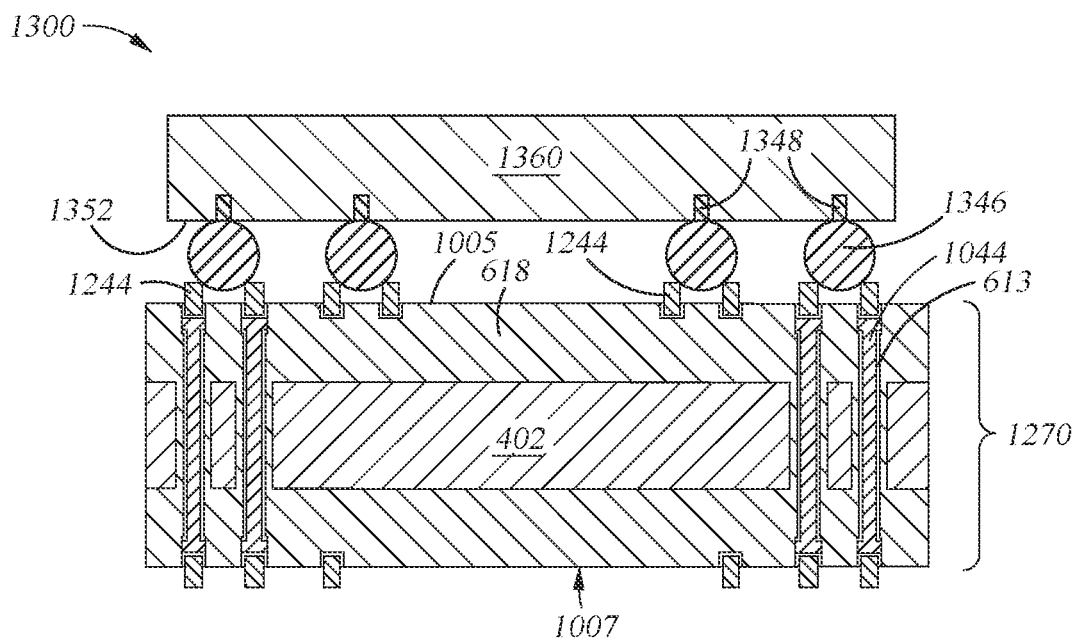
FIG. 13A schematically illustrates a cross-sectional view of a chip carrier structure including a semiconductor core assembly, according to embodiments described herein.

The completed semiconductor core assemblies 1270 formed at operation 1120 may be utilized in any suitable stacked package assembly, PCB assembly, PCB spacer assembly, chip carrier assembly, intermediate carrier assembly, and the like. In one exemplary embodiment depicted in FIG. 13A, a single semiconductor core assembly 1270 is utilized as a carrier for a chip 1360 in a chip carrier assembly 1300. The chip 1360 may be any suitable type of chip, including a memory chip, a microprocessor, a complex system-on-a-chip (SoC), or a standard chip. Suitable types of memory chips include DRAM chips or NAND flash chips. In some further examples, the chip 1360 is a digital chip, an analog chip, or a mixed chip. The chip 1360 is disposed adjacent to one of the major surfaces 1005, 1007 of the semiconductor core assembly 1270. In some embodiments, two or more chips 1360 may be disposed adjacent to a single major surface 1005, 1007. In another embodiment, one or additional devices and/or structures may be disposed adjacent to the chip 1360, such as one or more components of a PCB or a package substrate. For example, one or more passives may be disposed adjacent to the chip 1360, such as capacitors, resistors, inductors and the like. In another example, one or more connectors may be disposed adjacent to the chip 1360.

The chip 1360 includes one or more contacts 1348 formed on an active surface 1352 thereof. As depicted, the contacts 1348 are conductively coupled to one or more redistribution connections 1244 of the semiconductor core assembly 1270 by one of more solder bumps 1346 disposed between the active surface 1352 and the major surface 1005. In some embodiments, the contacts 1348 may be conductively coupled to the one or more interconnections 1044 by the one or more solder bumps 1346. In one embodiment, the contacts 1348 and/or the solder bumps 1346 are formed of a substantially similar material to that of the interconnections 1044 and the redistribution connections 1244. For example, the contacts 1348 and the solder bumps 1346 may be formed of a conductive material such as copper, tungsten, aluminum, silver, gold, or any other suitable materials or combinations thereof.

In one embodiment, the solder bumps 1346 include C4 solder bumps. In one embodiment, the solder bumps 1346 include C2 (Cu-pillar with a solder cap) solder bumps. Utilization of C2 solder bumps may enable smaller pitch lengths and improved thermal and/or electrical properties for the chip carrier assembly 1300. The solder bumps 1346 may be formed by any suitable wafer bumping processes, including but not limited to electrochemical deposition (ECD) and electroplating.

Figure 13B:
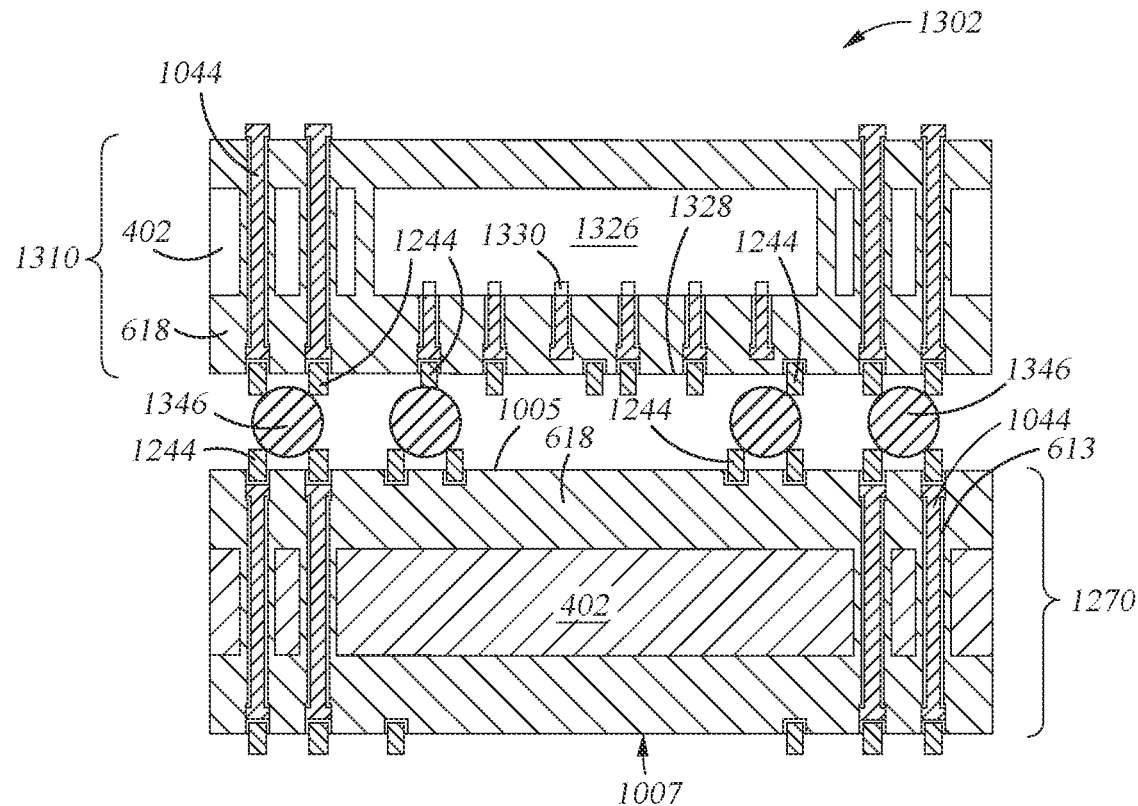
FIG. 13B schematically illustrates a cross-sectional view of a PCB structure including a semiconductor core assembly, according to embodiments described herein.

In another exemplary embodiment depicted in FIG. 13B, a semiconductor core assembly 1270 is utilized in a PCB assembly 1302. Accordingly, the semiconductor core assembly 1270 is configured to function as a PCB structure for supporting (e.g., carrying) a package assembly 1310. The package assembly 1310 may be substantially similar in structure and material to the semiconductor core assembly 1270, but includes an embedded die 1326 disposed within a cavity 1320 formed within the core structure 402 that is substantially surrounded by the insulating layer 618. The embedded die 1326 may further include an active surface 1328 having one or more contacts 1330 formed thereon and coupled with interconnections 1342 and/or redistribution connections 1344 of the package assembly 1310. Similar to the chip carrier assembly 1300 in FIG. 13A, the contacts 1330 and/or interconnections 1342 and/or redistribution connections 1344 of the package assembly 1310 are conductively coupled to the one or more redistribution connections 1244 of the semiconductor core assembly 1270 by the one of more solder bumps 1346 disposed between the active surface 1328 and the major surface 1005. In some embodiments, the contacts 1330 may be conductively coupled to the one or more interconnections 1044 by the one or more solder bumps 1346.

Figure 13C:
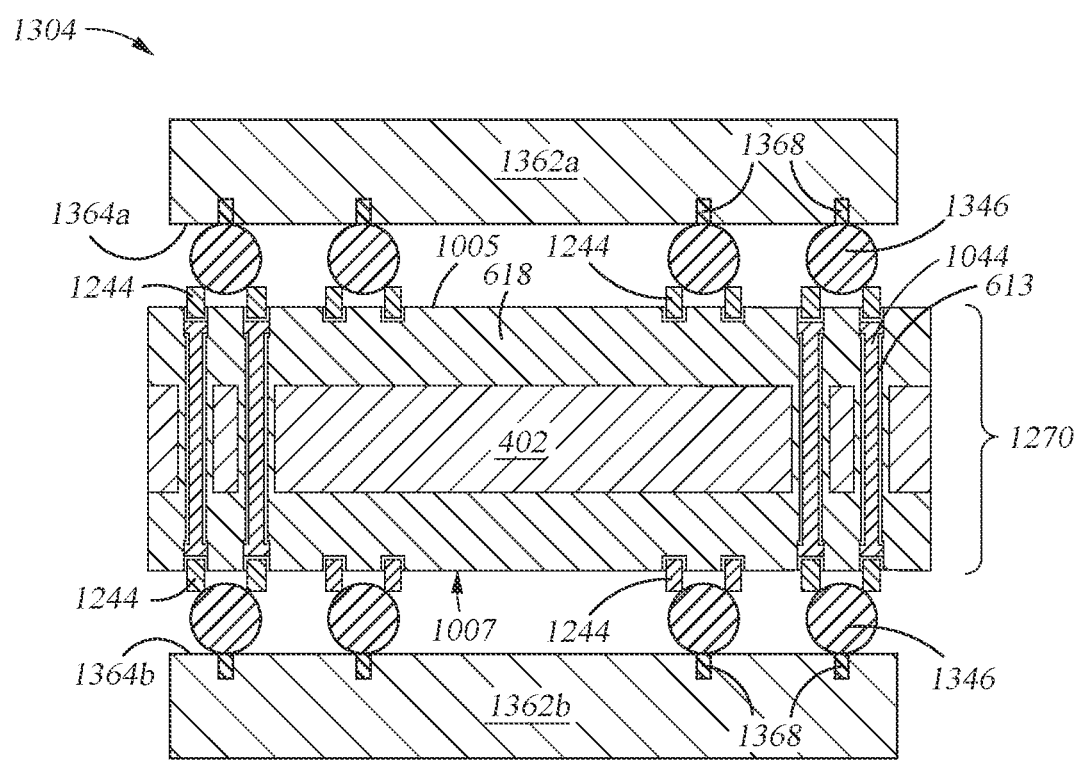
FIG. 13C schematically illustrates a cross-sectional view of a PCB structure including a semiconductor core assembly, according to embodiments described herein.

FIG. 13C depicts yet another exemplary embodiment utilizing the semiconductor core assembly 1270 as a PCB spacer structure in a PCB assembly 1304. As shown, the semiconductor core assembly 1270 is disposed between two PCB's 1362a, 1362b and configured to position the first PCB 1362a relative to the second PCB 1362b such that a physical space remains between the first PCB 1362a and the second PCB 1362b while they are conductively connected. Accordingly, the PCB's 1362a, 1362b include one or more electrically conductive pads 1368 formed on major surfaces 1364a, 1364b thereof, respectively. The one or more conductive pads 1368 are conductively coupled to the redistribution connections 1244 and/or interconnections 1044 of the semiconductor core assembly 1270 via the one or more solder bumps 1346. Similar the contacts 1330, 1348, the conductive pads 1368 are formed of a substantially similar material to that of the solder bumps 1346, interconnections 1044, and the redistribution connections 1244 to enable electrical conductivity therethrough. For example, the conductive pads 1368 may be formed of a conductive material such as copper, tungsten, aluminum, silver, gold, or any other suitable materials or combinations thereof.

Figure 14C:
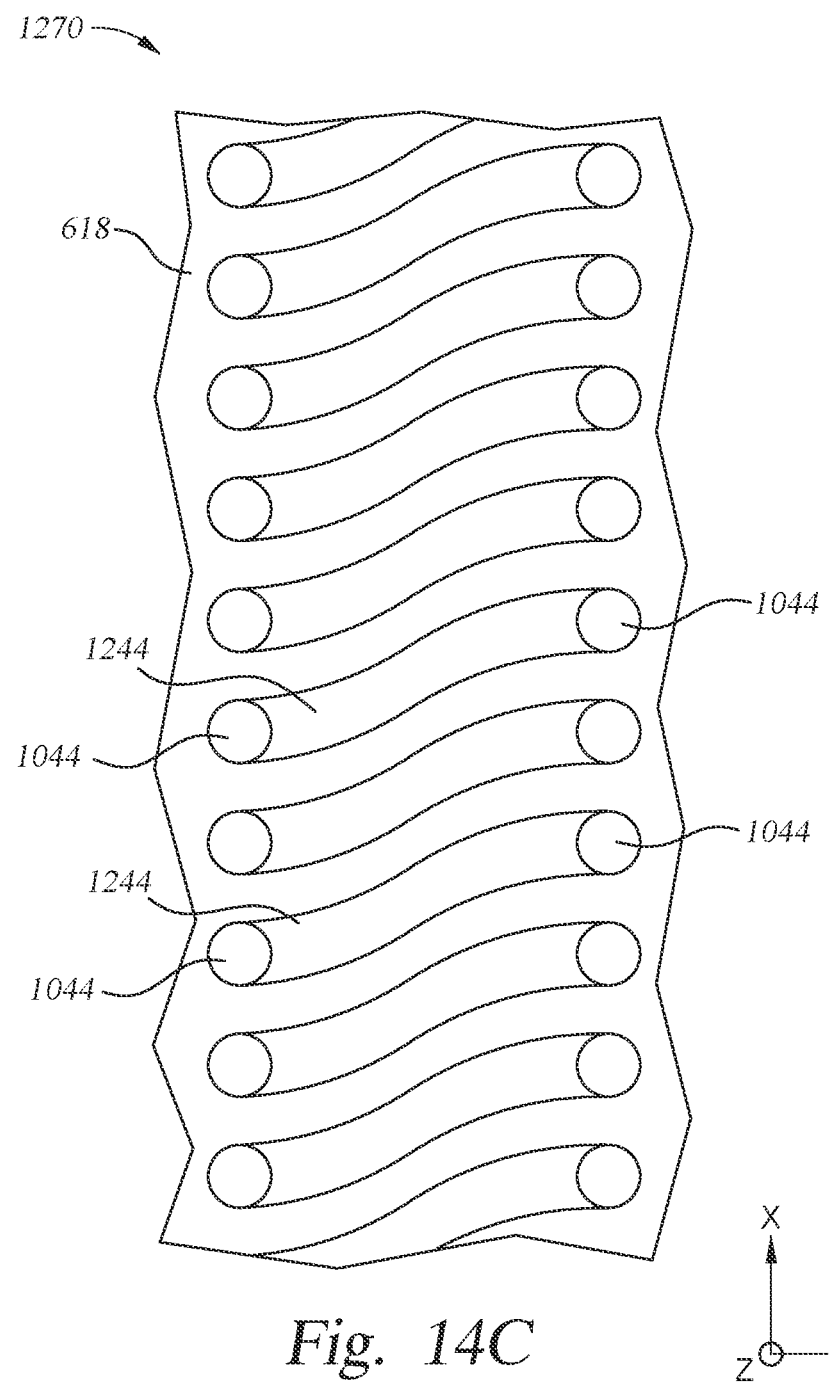
FIG. 14C schematically illustrates a cross-sectional view of a semiconductor core assembly having one or more passive devices integrated therein, according to embodiments described herein.

FIGS. 14A-14C illustrate configurations of the semiconductor core assembly 1270 integrating one or more passive components or devices therein. As shown in FIG. 14A, in certain embodiments, the semiconductor core assembly 1270 may include one or more capacitors 1410a and/or 1410b integrated within pockets 1420 in the core structure 402 to enable more stable power delivery across the semiconductor core assembly 1270. Thus, in certain embodiments, the capacitors 1410a, 1410b may function as decoupling capacitors. In certain embodiments, the capacitors 1410a, 1410b are trench capacitors or planar capacitors. The capacitors 1410a, 1410b are formed of any suitable dielectric materials, including but not limited to ceramic or silicon. In certain embodiments, the capacitors 1410a, 1410b are formed from singulated silicon wafers, which may be singulated into individual capacitors upon grinding the silicon wafer to a desired thickness. In such embodiments, the silicon wafer may be ground to a thickness substantially similar to the core structure 402 prior to singulation.

Generally, the capacitors 1410a, 1410b have lateral dimensions between about 750 μm and about 175 mm, such as between about 1 mm and about 1.5 mm. Further, the capacitors 1410a, 1410b have a thickness substantially equal to or less than a thickness of the core structure 402, such as less than about 1500 μm, such as less than about 780 μm, such as less than about 300 μm or about 200 μm. For example, the capacitors 1410a, 1410b may have a thickness less than about 150 μm or about 120 μm. In certain embodiments, the capacitors integrated within the semiconductor core assembly 1270 are standalone devices having a thickness substantially similar to that of the core structure 402, such as capacitors 1410a. In certain embodiments, the capacitors are stand-off devices coupled to a thin substrate 1402, thus having a thickness less than that of the core structure 402, such as capacitors 1410b. The capacitors 1410b may be adhered to the substrate 1402 with an adhesive 1404 prior to being integrated within the semiconductor core assembly 1270. For example, a plurality of capacitors 1410 can be adhered onto a bulk substrate 1402, and then diced into stand-off devices having desired dimensions for integration with the semiconductor core assembly 1270.

The capacitors 1410a, 1410b may be integrated within the semiconductor core assembly 1270 utilizing the methods described above. Generally, the pockets 1420 are patterned into the core structure 402 along with the core vias 403 at operation 320 of the method 300. In certain embodiments, the pockets 1420 have lateral dimensions between about 10 μm to about 250 μm larger (e.g., longer) than the lateral dimensions of the capacitors 1410a or 1410b to be embedded therein, such as between about 20 μm and about 150 μm or between about 30 μm and about 100 μm larger. For example, the lateral dimensions of the pockets 1420 are sized to enable a 50 μm gap between surfaces of the capacitors 1410a and/or 1410b and sidewalls of the pockets 1420. Then, in one embodiment utilizing the method 500, the capacitors 1410a and/or 1410b are placed within the pockets 1420 after performance of operation 504, where the patterned core structure 402 is affixed to a first insulating film 616a, but prior to operation 506, where the first protective film 660 is placed over the core structure 402. Alternatively, in another embodiment utilizing the method 700, the capacitors 1410a and/or 1410b are placed within the pockets 1420 after affixing the patterned core structure 402 on the first insulating film 616a at operation 710, but prior to affixing the second insulating film 616b to the core substrate 402 at operation 720. In either embodiment, the capacitors 1410a, 1410b become embedded within the pockets 1420 by the insulating layer 618 which is formed upon lamination of both insulating films 616a and 616b.

Thereafter, through-assembly vias 613 and/or redistribution vias 1253 are drilled through the insulating layer 618 directly above or below contacts of the capacitors 1410a, 1410b to uncover the contacts, as described with reference to operations 518 and 750. The through-assembly vias 613 and/or redistribution vias 1253 may then be metallized to enable electrical coupling of the capacitors 1410a, 1410b to other devices (e.g. power supply and ground) stacked with the semiconductor core assembly 1270. For example, one or more interconnections 1044 and/or redistribution connections 1244 may be formed according to the methods 900 and/or 1100.

FIGS. 14B and 14C illustrate exemplary configurations of the semiconductor core assembly 1270 having one or more inductors 1450a and/or 1450b integrated therein. FIG. 14B is a cross-sectional view of the semiconductor core assembly 1270 while FIG. 14C is a top view thereof. As shown, the interconnections 1044 and redistribution connections 1244 are electrically coupled in a coil-like arrangement, where the redistribution connections 1244 are either metallized in a non-linear pattern or connect non-adjacent interconnections 1044. Accordingly, this coil-like arrangement forms the inductors 1450a, 1450b, which are embedded within the semiconductor core assembly 1270 rather than being disposed on a surface thereof, thus saving surface area for stacking of other components or devices on the semiconductor core assembly 1270. Additionally, forming the electrical connections of the semiconductor core assembly 1270 in a coil-like shape enables an overall reduced profile thereof without the utilization of additional resources or operations to incorporate inductor devices.

In certain embodiments, the inductors integrated into the semiconductor core assembly 1270 comprise the coil-like arrangement of the interconnections 1044 and redistribution connections 1244 formed around the core structure 402 and the insulating layer 618 without the utilization of a magnetic core (e.g., inductor 1450a). In certain other embodiments, the inductors further comprise a magnetic core 1460 embedded within the pocket 1420 of the core structure 402 and surrounded by the coil-like arrangement of the interconnections 1044 and redistribution connections 1244 (e.g., inductor 1450b). The magnetic core 1460 may be formed of ferrite-based materials or metal polymer composites, which generally include a polymer matrix having metallic particles dispersed therein.

Like the capacitors in FIG. 14A, the inductors 1450a, 1450b may be integrated within the semiconductor core assembly 1270 utilizing the methods described above. For example, the magnetic core 1460 may be placed within the patterned pockets 1420 of the core structure 402 and thereafter embedded upon lamination of one or more insulating films (e.g., insulating films 616a, 616b), as described with reference to methods 500 and 700. Further, the drilling of the vias 403, the through-assembly vias 613, and the redistribution vias 1253, as well as the metallization of the interconnections 1044 and the redistribution connections 1244 (e.g., including the patterning of the resist 1250) may be carried out in such a way as to create a coil-like arrangement of the interconnections 1044 and redistribution connections 1244 within the semiconductor core assembly 1270.

Figure 15A:
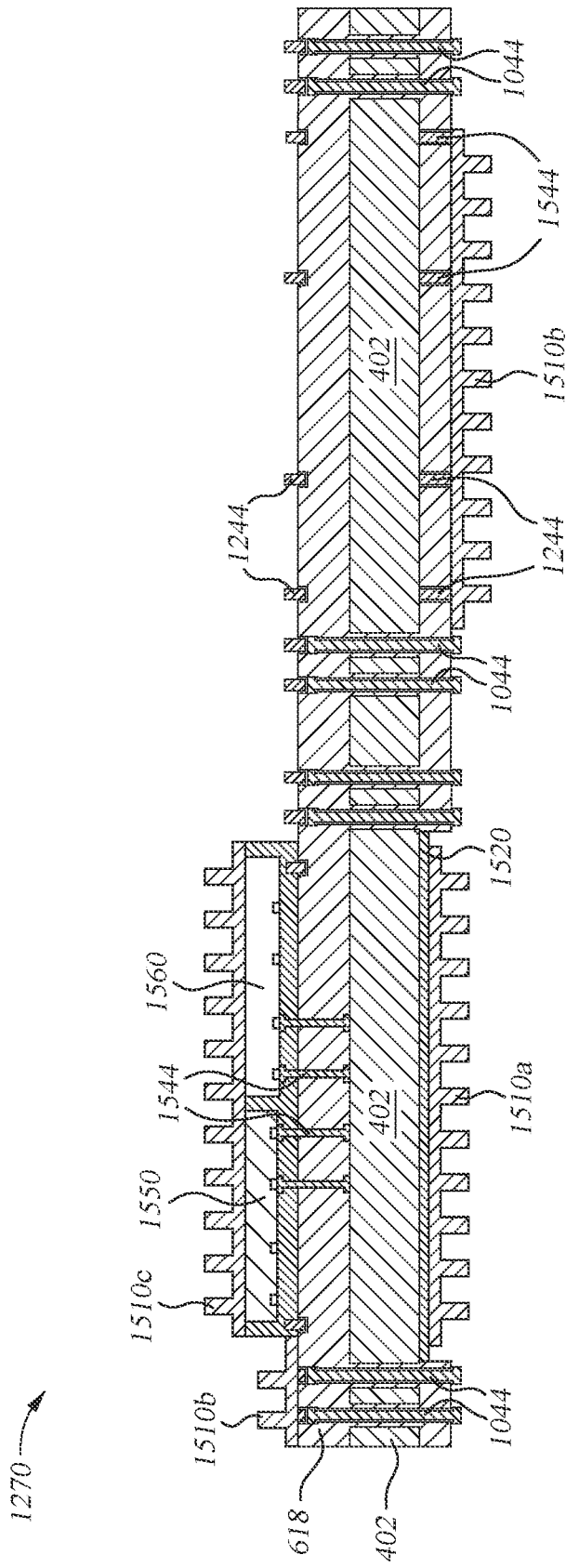
FIG. 15A schematically illustrates a cross-sectional view of a semiconductor core assembly having one or more passive devices integrated therein, according to embodiments described herein.
Figure 15B:
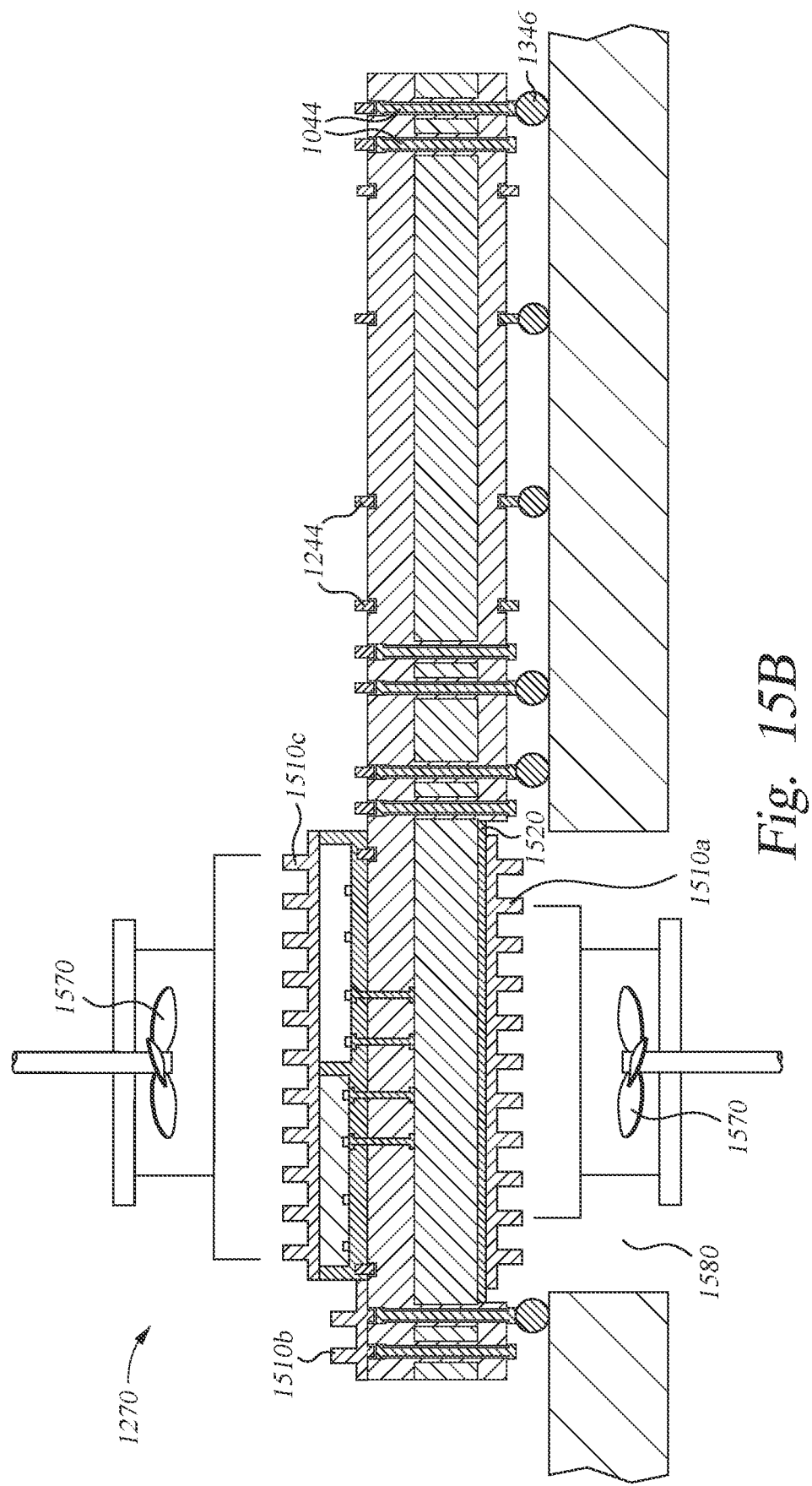
FIG. 15B schematically illustrates a cross-sectional view of a semiconductor core assembly having one or more passive devices integrated therein, according to embodiments described herein.

FIGS. 15A-15D illustrate additional configurations of the semiconductor core assembly 1270 integrating additional types of passive devices. As shown in FIGS. 15A-15B, the semiconductor core assemblies 1270 include heat exchangers 1510a-c integrated in various positions thereon. The integration of the heat exchangers 1510a-c, such as heat sinks, improves heat dissipation and thermal characteristics of the semiconductor core assembly 1270 by transferring heat that is conducted by the silicon core structure 402. This arrangement is particular beneficial over conventional PCB's that are formed of glass-reinforced epoxy laminates having low thermal conductivity, to which the addition of a heat exchanger would be of little value. Suitable types of heat exchangers 1510a-c include pin heat sinks, straight heat sinks, flared heat sinks, and the like, which may be formed of any suitable materials such as aluminum or copper. In certain embodiments, the heat exchangers 1510a-c are formed of extruded aluminum.

Generally, the heat exchangers 1510a-c may be added to one or both sides of the semiconductor core assembly 1270. In certain embodiments, the heat each exchangers 1510a-c are placed directly over or under the core structure 402 without the insulating layer 618 being disposed therebetween, as shown with heat exchanger 1510a. To achieve this configuration, a desired area of the insulating layer 618 of a completed semiconductor core assembly 1270 may be laser ablated to form a pocket, and the heat exchanger 1510a may thereafter be mounted upon the core structure 402. For example, an area of the insulating layer 618 having lateral dimensions corresponding to the lateral dimensions of the heat exchanger 1510a may be removed by a $CO_2$, UV, or IR laser that is configured to only ablate the dielectric material of the insulating layer 618 and leave the core structure 402 intact. The heat exchanger 1510a may then be placed within the opening and mounted upon the core structure 402, which may include an oxide layer or metal cladding layer, via any suitable mounting methods. In certain embodiments, an interfacial layer 1520 is formed between the heat exchanger 1510a and the core structure 402. For example, the interfacial layer 1520 may be a formed of a thermal interface material (TIM), such as a thermal adhesive or potting compound. In certain embodiments, the interfacial layer 1520 is a thin layer of flowable dielectric material substantially similar to that of the insulating layer 618.

In certain embodiments, the heat exchangers 1510a-c are placed directly over the insulating layer 618 of the semiconductor core assembly 1270, as shown with heat exchangers 1510b. In such examples, laser ablation of the insulating layer 618 is not required. In order to optimize heat transfer between the core substrate 402 and the heat exchangers 1510b, the semiconductor core assembly 1270 may comprise one or more thermal connections 1544 thermally coupling the core structure 402 with the heat exchangers 1510b. Unlike interconnections 1044 and redistribution connections 1244, the thermal connections 1544 do not have any electrical function and only provide paths for heat conductance to the heat exchangers 1510b. In certain embodiments, the thermal connections 1544 are formed in vias substantially similar to the through-assembly vias 613 and redistribution vias 1253 described above. Generally, the thermal connections 1544 are formed of a metallic material, such as copper, aluminum, gold, nickel, silver, palladium, tin, or the like.

In certain embodiments, the heat exchangers 1510a-c are placed adjacent to active devices and components stacked with the semiconductor core assembly 1270. Generally, the heat exchangers 1510a-c may be arranged in any configuration relative to active devices or components attached to the semiconductor core assembly 1270. In FIGS. 15A-15B, a heat exchanger 1510c is placed upon the active devices 1550 and 1560, and a heat exchanger 1510b is depicted to the side of (e.g., disposed laterally to) the active devices 1550, 1560. The placement of a heat exchanger above and lateral to the active devices 1550, 1560 increases heat conductance away from the active devices. In certain embodiments, additional heat exchangers may be disposed on a side of the semiconductor core assembly 1270 opposite of any active devices or components, such as depicted with the heat exchanger 1510a. In certain embodiments, thermal connections 1544 may also be formed between the core structure 402 and the active devices 1550, 1560 to thermally connect the active devices 1550, 1560 to the core structure 402 and assist with conducting heat from the active devices to the core.

As shown in FIG. 15B, the heat exchangers 1510a-c may further be coupled to one or more fans 1570 that assist with heat dissipation by providing additional fluid flow for convection. Although depicted as being mounted directly to the heat exchangers 1510a-c, the fans 1570 may be attached and oriented in any suitable position along the semiconductor core assembly 1270 for optimal fluid flow and thermal regulation. In examples where the semiconductor core assembly 1270 is stacked with other package structures, such as the PCB's 1362a, 1362b, a cavity 1580 may be formed in the additional structure directly above or below the heat exchangers 1510a-c to enable placement of the one or more fans 1570 and/or promote heat dissipation therefrom.

Figure 15C:
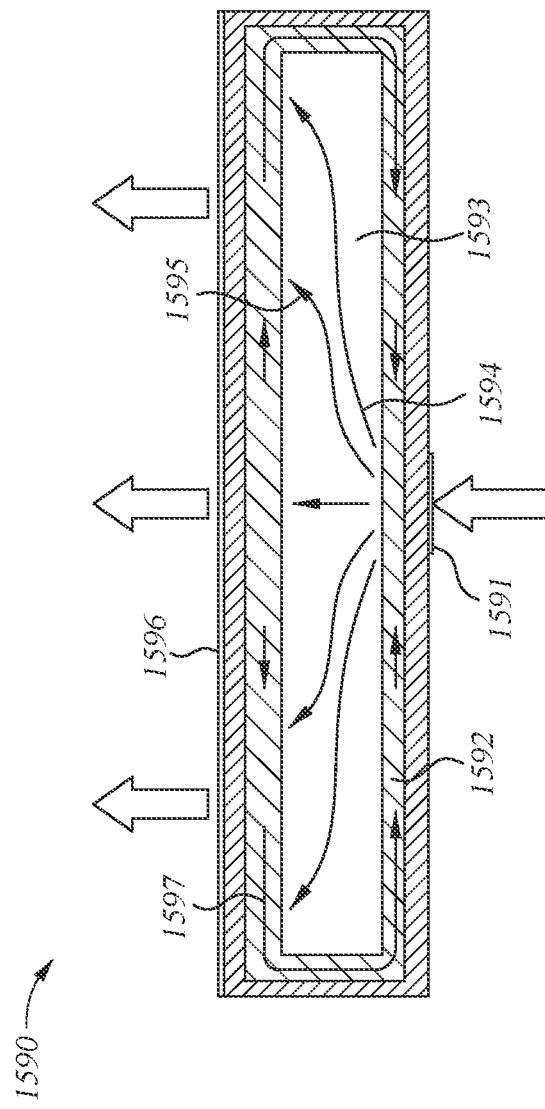
FIG. 15C schematically illustrates a cross-sectional view of an exemplary passive device to be integrated in a semiconductor core assembly, according to embodiments described herein.
Figure 15D:
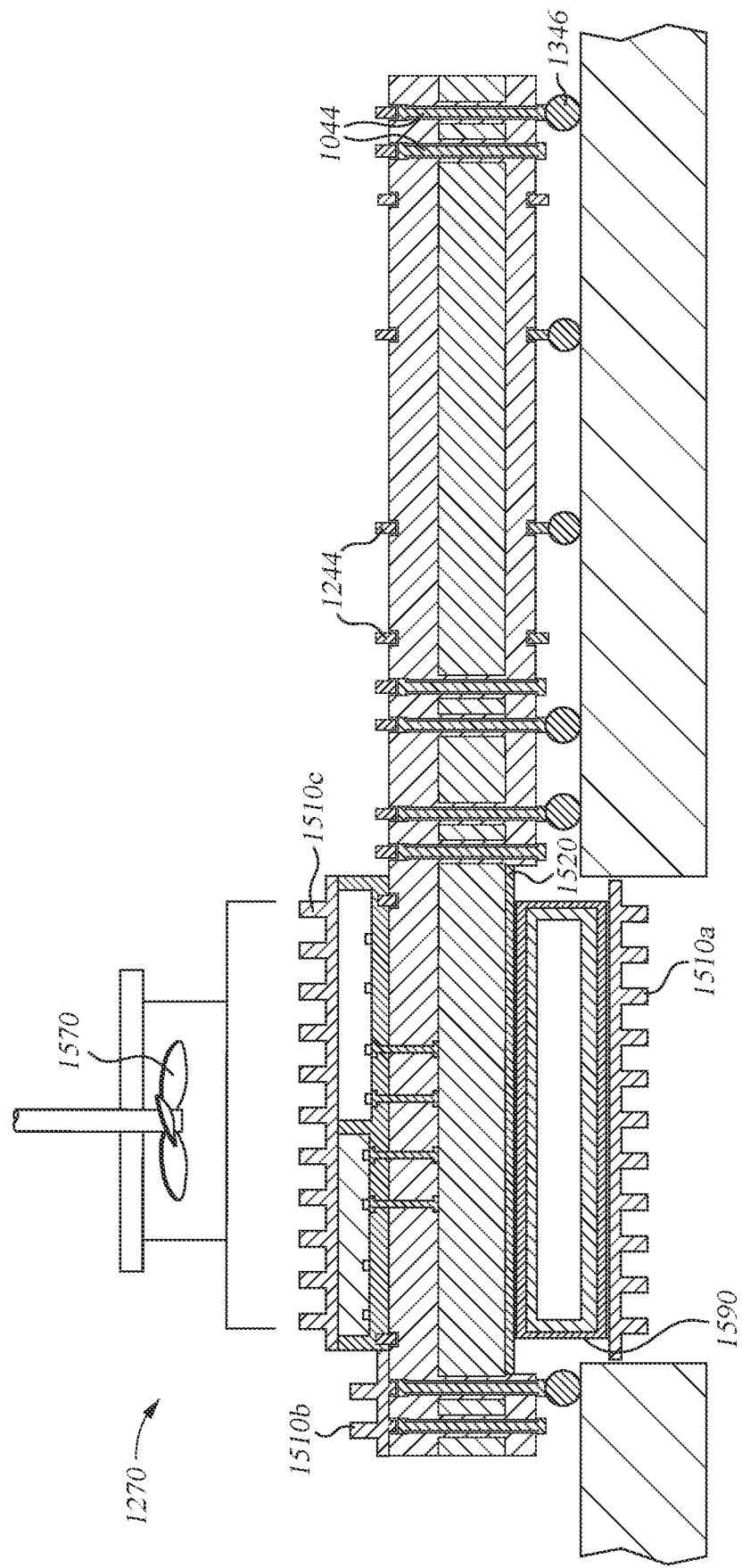
FIG. 15D schematically illustrates a cross-sectional view of a semiconductor core assembly having the passive device of FIG. 15C integrated therein, according to embodiments described herein.

Alternatively or in addition to the heat exchangers described above, the semiconductor core assembly 1270 may also have one or more heat pipes or head spreaders 1590 integrated in various positions thereon for improved heat dissipation and thermal modulation. FIGS. 15C and 15D illustrate an exemplary heat spreader 1590 and an exemplary arrangement of the heat spreader 1590 on the semiconductor core assembly 1270. Similar to the heat exchangers described above, the heat spreader 1590 transfers heat that is conducted by the silicon core structure 402. However, the heat spreader 1590 utilizes phase transition of a liquid contained within a plenum 1593 thereof to do so. For example, as shown in FIG. 15C, the heat spreader 1590 includes a hot interface or evaporator 1591 at which the contained liquid turns into a vapor 1594 by absorbing heat therefrom. In certain embodiments, the liquid is brought into contact with the evaporator 1591 via a wick 1592 disposed within the plenum 1593. Upon vaporization, the vapor 1594 travels within the heat spreader 1590 to a cold surface or condenser 1596, at which the vapor 1584 condenses into liquid condensation 1595 and releases latent heat, thus spreading it. The liquid condensation 1595 is then returned to the evaporator 1591 by capillary action (shown as reference numeral 1597) through the wick 1592, and the cycle may be repeated for further heat transfer. This principle enables efficient lateral transfer of heat away from the core structure 402 of the semiconductor core assembly 1270 and, for example, towards other heat dissipating devices.

Like the heat exchangers described above, the heat spreader 1590 may be placed directly over or under the core structure 402 without the insulating layer 618 being disposed therebetween. As shown in FIG. 15D, in certain embodiments, the heat spreader 1590 is disposed directly between the core structure 402 and a heat exchanger, such as the heat exchanger 1510c, to transfer heat therebetween. In certain embodiments, the heat spreader 1590 is placed directly over the insulating layer 618 with one or more thermal connections 1544 thermally coupling the heat spreader 1590 to the core structure 402. Generally, the heat spreader 1590 is oriented such that the "hot side" or evaporator-containing side of the heat spreader 1590 is disposed nearest the core structure 402, while the "cold side" or condenser-containing side is disposed away from the core structure 402, such as adjacent to the heat exchanger 1510c in FIG. 15D. In some examples, the heat spreader 1590 may also be utilized in combination with one or more fans 1570 disposed proximate the heat spreader 1590 and/or other heat dissipating devices for additional heat dissipation through air convection.

Figure 16:
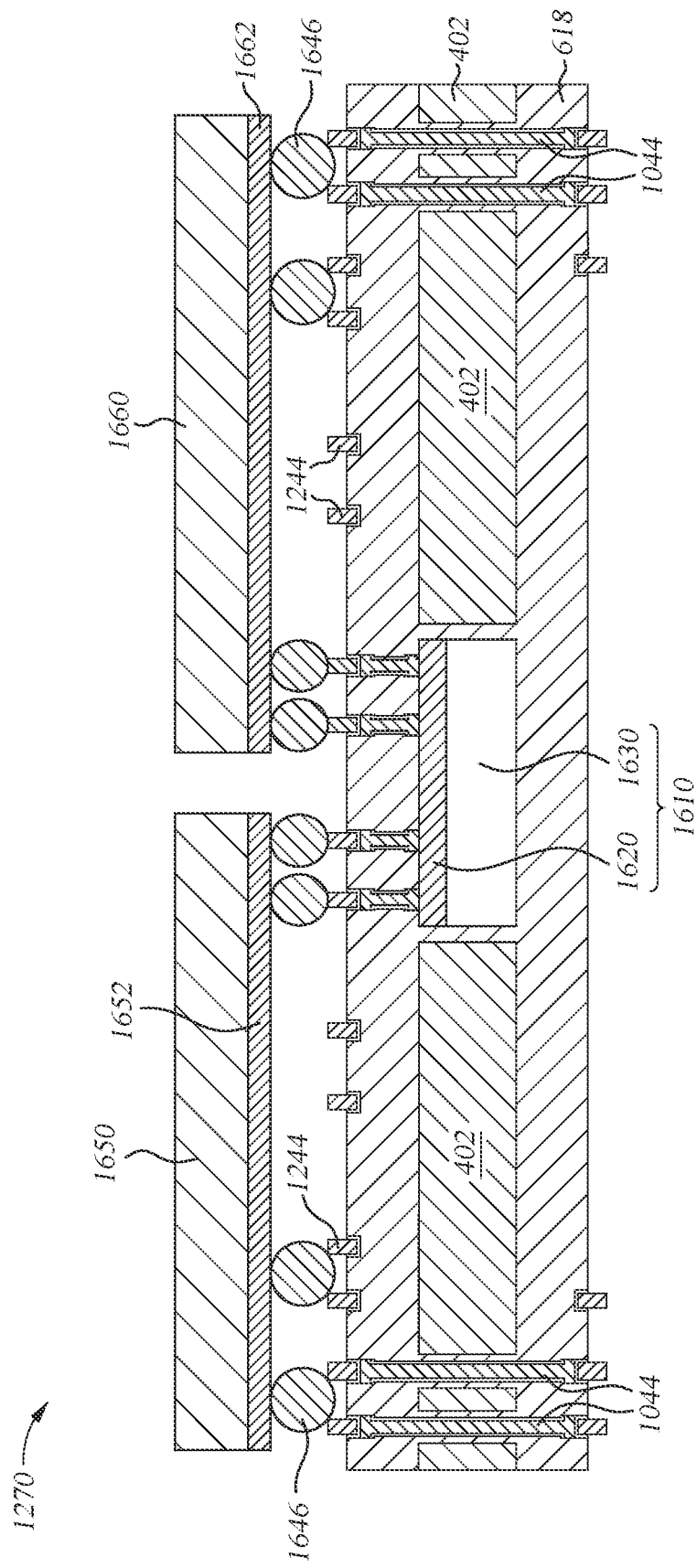
FIG. 16 schematically illustrates a cross-sectional view of a semiconductor core assembly having a bridge device integrated therein, according to embodiments described herein.

FIG. 16 illustrates an exemplary arrangement 1600 of the semiconductor core assembly 1270 described above, wherein the semiconductor core assembly 1270 facilitates variable densities of interconnects 1044 and redistribution connections 1244 for bridging two active devices 1650 and 1660 having active layers 1652 and 1662, respectively. As shown, the semiconductor core assembly 1270 includes a bridge 1610 embedded within the pocket 1420 of the core structure 402 and through which the active devices 1650 and 1660 are partially interconnected via a bridge redistribution layer 1620 thereof. The bridge 1610 is disposed below adjacent ends of active layers 1652, 1662 and provides high density and short range interconnection of active device connections disposed at or near those ends, thus enabling local high density interconnection. Active device connections disposed at distal ends of the active layers 1652, 1662, however, may be interconnected via lower density but higher range signal paths formed by interconnections 1044 and redistribution connections 1244 through the insulating layer 618 of the semiconductor core assembly 1270, which may have reduced crosstalk compared to the high density short range interconnections.

Generally, the bridge 1610 includes a silicon-containing base 1630 having a thickness substantially equal to or less than a thickness of the core structure 402. For example, the base 1630 has a thickness between about 80 μm and about 775 μm, such as between about 100 μm and about 400 μm, or between about 110 μm and about 300 μm. In certain embodiments, the base 1630 is a high density substrate, such as a high density fan-out substrate containing silicon dioxide, and the redistribution layer 1620 is a back-end-of-line (BEOL) redistribution layer. In certain embodiments, the base 1630 is a high density silicon interposer and the redistribution layer 1620 is a dual damascene BEOL redistribution layer. The base 1630 supports a redistribution layer 1620 having a thickness up to about 1 μm. In certain embodiments, the base 1630 supports a connection pitch ranging between about 0.3 μm and about 2 μm, such as between about 0.5 μm and about 1.5 μm. In order to fully utilize the relative low pitch of the bridge 1610, the active devices 1650, 1660 may be soldered to the semiconductor core assembly 1270 via micro bumps 1646 having a width or diameter between about 20 μm and about 150 μm, or between about 30 μm and about 80 μm, thus enabling higher density interconnections therebetween. The micro bumps 1646 are formed of a material substantially similar to that of the interconnections 1044, the redistribution connections 1244, or the solder bumps 1346, such as copper, tungsten, aluminum, silver, gold, or any other suitable materials or combinations thereof. Similar to the passive devices in FIGS. 14A-14C, the bridge 1610 may be integrated within the semiconductor core assembly 1270 utilizing any of the methods described above. For example, the bridge 1610, already having the redistribution layer 1620 formed thereon, may be placed within the patterned pockets 1420 of the core structure 402 and thereafter embedded upon lamination of one or more insulating films (e.g., insulating films 616a, 616b), according to the methods 500 and 700. Further, through-assembly vias 613 may be drilled through the insulating layer 618 directly above contacts of the redistribution layer 1620 and thereafter metallized to form interconnections 1044 and 1244, thus enable subsequent connection of the bridge 1610 with the active devices 1650 and 1660.

The utilization of the semiconductor core assembly 1270 in the embodiments shown above provides multiple advantages over conventional package, PCB, PCB spacer, and chip carrier structures. Such benefits include a thin-form-factor and high chip or die-to-package volume ratio, which enables greater I/O scaling to meet the ever-increasing bandwidth and power efficiency demands of artificial intelligence (AI) and high performance computing (HPC). The utilization of a structured silicon frame provides optimal material stiffness and thermal conductivity for improved electrical performance, thermal management, and reliability of 3-dimensional integrated circuit (3D IC) architecture.

Furthermore, the fabrication methods for through-assembly vias and via-in-via structures described herein provide high performance and flexibility for 3D integration with relatively low manufacturing costs as compared to conventional TSV technologies.

By utilizing the methods described above, high aspect ratio features may be formed on glass and/or silicon core structures, thus enabling the economical formation of thinner and narrower circuit boards, chip carriers, integrated circuit packages, and the like. The semiconductor core assemblies fabricated utilizing the methods described above provide the benefits of not only high I/O density and improved bandwidth and power, but also greater reliability with low stress attributed to the reduced weight/inertia and assembly architecture allowing flexible solder ball distribution. Further merits of the methods described above include economical manufacturing with dual-sided metallization capability and high production yield. Additionally, the utilization of a silicon core reduces or eliminates mismatch of the coefficient of thermal expansion (CTE) between the core assembly and any chips connected thereto, enabling the smaller soldering pitches and increased device density.

While the foregoing is directed to embodiments of the present disclosure, other and further embodiments of the disclosure may be devised without departing from the basic scope thereof, and the scope thereof is determined by the claims that follow.

What is claimed is:

1. A semiconductor device assembly, comprising:
    a silicon core structure, comprising:
        a first side opposing a second side;
        a first via comprising a first via surface that defines an opening extending through the silicon core structure from the first side to the second side; and
        a first pocket formed in the silicon core structure, the first pocket comprising a first plurality of pocket walls that define a first opening in the silicon core structure;
    a first conductive interconnection formed in the first via and having a surface exposed at the first side and the second side;
    a capacitor disposed in the first pocket and coupled to a second conductive interconnection exposed at the first side or the second side; and
    an insulating layer disposed over and in contact with the first side, the second side, the first via surface, and the first plurality of pocket walls, wherein a single material of the insulating layer surrounds all surfaces of the capacitor in the first opening defined by the first plurality of pocket walls and forming an intermediate layer between the first conductive interconnection and the first via surface, the insulating layer disposed within the opening of the first pocket and between a periphery of the capacitor and each of the first plurality of pocket walls, wherein all surfaces of the capacitor are in contact with the insulating layer and the insulating layer is the only insulating layer used to support the capacitor.

2. The semiconductor device assembly of claim 1, further comprising an oxide layer formed between the silicon core structure and the insulating layer.

3. The semiconductor device assembly of claim 2, wherein the oxide layer comprises a thermal oxide.

4. The semiconductor device assembly of claim 1, wherein the capacitor comprises silicon or ceramic.

5. The semiconductor device assembly of claim 1, wherein the capacitor has a thickness substantially equal to a thickness of the silicon core structure.

6. The semiconductor device assembly of claim 1, wherein the capacitor is a decoupling capacitor.

7. The semiconductor device assembly of claim 1, wherein the capacitor is a trench capacitor.

8. The semiconductor device assembly of claim 1, wherein the insulating layer has a thickness ranging from about 30 µm to about 100 µm between surfaces of the capacitor and sidewalls of the first pocket.

9. The semiconductor device assembly of claim 1, wherein the insulating layer comprises an epoxy resin material.

10. The semiconductor device assembly of claim 9, wherein the epoxy resin material comprises silica particles ranging in size between about 80 nm and about 1 µm.

11. The semiconductor device assembly of claim 1, further comprising:
    a second plurality of vias comprising a second via surface that defines a second opening extending through the silicon core structure from the first side to the second side;
    a second pocket formed in the silicon core structure and disposed between one or more of the second plurality of vias formed on a first side of the second pocket and one more of the second plurality of vias disposed on a second side of the second pocket, the second pocket comprising a second plurality of pocket walls that define an opening in the silicon core structure; and
    an inductor comprising:
        a plurality of third conductive interconnections formed in the second plurality of vias, each of the third conductive interconnections having a surface exposed at the first side and the second side of the silicon core structure;
        a magnetic core embedded in the second pocket; and
        redistribution connections formed between one or more of the second plurality of vias formed on a first side of the second pocket and one more second vias disposed on a second side of the second pocket.

12. The semiconductor device assembly of claim 1, further comprising
    a second plurality of vias comprising a second via surface that defines a second opening extending through the silicon core structure from the first side to the second side; and an inductor comprising:
        a plurality of third conductive interconnections formed in the second plurality of vias, each of the third conductive interconnections having a surface exposed at the first side and the second side of the silicon core structure; and
        redistribution connections formed between the plurality of third conductive interconnections.

13. The semiconductor device assembly of claim 1, further comprising a heat exchanger coupled to the silicon core structure, wherein the heat exchanger is coupled to the silicon core structure via an interfacial layer.

14. The semiconductor device assembly of claim 1, further comprising a heat exchanger coupled to the silicon core structure, wherein the heat exchanger is coupled directly coupled to the silicon core structure.

15. A semiconductor device assembly, comprising:
    a silicon core structure having a thickness less than 1000 µm, the silicon core structure comprising:
        a first side opposing a second side;

a via comprising a via surface that defines an opening extending through the silicon core structure from the first side to the second side;

a pocket formed in the silicon core structure and extending through the silicon core structure from the first side to the second side, the pocket comprising a plurality of pocket walls that define an opening in the silicon core structure; and a passivating layer formed on all surfaces of the silicon core structure;

a first conductive interconnection formed in the via and having a surface exposed at the first side and the second side;

a capacitor disposed in the pocket and coupled to a second conductive interconnection exposed at the first side or the second side; and an insulating layer disposed over and in contact with the first side, the second side, the via surface, and the plurality of pocket walls, wherein a single material of the insulating layer surrounds all surfaces of the capacitor in the opening defined by the plurality of pocket walls and forming an intermediate layer between the first conductive interconnection and the via surface, the insulating layer disposed over the opening and between a periphery of the capacitor and each of the plurality of pocket walls, and comprising an epoxy resin having silica particles disposed therein, wherein all surfaces of the capacitor are in contact with the insulating layer and the insulating layer is the only insulating layer used to support the capacitor.

16. The semiconductor device assembly of claim 15, wherein the passivating layer comprises a thermal oxide layer formed between the silicon core structure and the insulating layer.

17. The semiconductor device assembly of claim 15, wherein the capacitor comprises silicon or ceramic.

18. The semiconductor device assembly of claim 17, wherein the capacitor has a thickness substantially equal to or less than a thickness of the silicon core structure.

19. The semiconductor device assembly of claim 17, wherein the capacitor is a decoupling capacitor.

20. The semiconductor device assembly of claim 17, wherein the capacitor is a trench capacitor.

21. The semiconductor device assembly of claim 15, wherein the insulating layer has a thickness ranging from about 30 μm to about 100 μm between surfaces of the capacitor and sidewalls of the pocket.

22. The semiconductor device assembly of claim 15, wherein the silicon core structure comprises a crystalline silicon substrate.

23. A semiconductor device assembly, comprising:

a silicon core structure having a thickness less than 1000 μm, the silicon core structure comprising:

a first side opposing a second side;

an array of vias, each via of the array of vias comprising a via surface that defines an opening extending through the silicon core structure from the first side to the second side;

at least two pockets formed in the silicon core structure and extending through the silicon core structure from the first side to the second side, the at least two pockets each comprising a plurality of pocket walls that define an opening in the silicon core structure; and a passivating layer formed on all surfaces of the silicon core structure;

a first conductive interconnection formed in each via of the array of vias and having a surface exposed at the first side and the second side;

a silicon or ceramic capacitor disposed in each pocket of the at least two pockets and coupled to a second conductive interconnection exposed at the first side or the second side, wherein at least two capacitors are coupled to second conductive interconnections exposed at opposing sides; and an insulating layer disposed over and in direct contact with the first side, the second side, each via surface, and each pocket wall, wherein a sinqle material of the insulating layer surrounds all surfaces of each capacitor in the opening formed in each pocket of the at least two pockets and forming an intermediate layer between each first conductive interconnection and corresponding via surface, the insulating layer surrounding a periphery of each of the capacitors, and comprising an epoxy resin having silica particles disposed therein, wherein all surfaces of each capacitor are in contact with the insulating layer and the insulating layer is the only insulating layer used to support the capacitor.

24. The semiconductor device assembly of claim 23, wherein each capacitor is a decoupling capacitor or trench capacitor.

* * * * *